(12) United States Patent
Maruyama et al.

(10) Patent No.: US 10,529,630 B2
(45) Date of Patent: Jan. 7, 2020

(54) METHOD OF MANUFACTURING SEMICONDUCTOR DEVICE

(71) Applicant: RENESAS ELECTRONICS CORPORATION, Tokyo (JP)

(72) Inventors: Takahiro Maruyama, Tokyo (JP); Yoshiki Yamamoto, Tokyo (JP); Toshiya Saitoh, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/192,435

(22) Filed: Nov. 15, 2018

(65) Prior Publication Data

US 2019/0206744 A1    Jul. 4, 2019

(30) Foreign Application Priority Data

Dec. 28, 2017 (JP) .................................. 2017-253643

(51) Int. Cl.
| | |
|---|---|
| *H01L 21/84* | (2006.01) |
| *H01L 21/311* | (2006.01) |
| *H01L 27/12* | (2006.01) |
| *H01L 21/265* | (2006.01) |
| *H01L 21/02* | (2006.01) |

(52) U.S. Cl.
CPC .......... *H01L 21/84* (2013.01); *H01L 21/0206* (2013.01); *H01L 21/26513* (2013.01); *H01L 21/31111* (2013.01); *H01L 21/31116* (2013.01); *H01L 21/31144* (2013.01); *H01L 27/1207* (2013.01)

(58) Field of Classification Search
CPC ............... H01L 21/84; H01L 21/31144; H01L 21/0206; H01L 21/26513; H01L 27/1207; H01L 21/31116; H01L 21/31111
See application file for complete search history.

(56) References Cited

U.S. PATENT DOCUMENTS

| | | | |
|---|---|---|---|
| 9,741,725 B2 | 8/2017 | Tsuboi | |
| 9,847,347 B1* | 12/2017 | Smith | ............... H01L 29/66628 |
| 2015/0364490 A1* | 12/2015 | Oda | ................... H01L 21/26513 257/351 |

FOREIGN PATENT DOCUMENTS

| | | |
|---|---|---|
| JP | 2001-203185 A | 7/2001 |
| JP | 2017-022250 A | 1/2017 |

\* cited by examiner

*Primary Examiner* — Kyoung Lee
(74) *Attorney, Agent, or Firm* — McDermott Will & Emery LLP

(57) ABSTRACT

A substrate including an insulating layer, a semiconductor layer, and an insulating film stacked on a semiconductor substrate and having a trench filled with an element isolation portion is provided. After removal of the insulating film from a bulk region by a first dry etching, the semiconductor layer is removed from the bulk region by a second dry etching. Then, the insulating film in an SOI region and the insulating layer in the bulk region are removed. A gas containing a fluorocarbon gas is used for first dry etching. The etching thickness of the element isolation portion by a first dry etching is at least equal to the sum of the thicknesses of the insulating film just before starting the first dry etching and the semiconductor layer just before starting the first dry etching. After first dry etching and before second dry etching, oxygen plasma treatment is performed.

19 Claims, 47 Drawing Sheets

METHOD OF MANUFACTURING SEMICONDUCTOR DEVICE

CROSS-REFERENCE TO RELATED APPLICATIONS

The disclosure of Japanese Patent Application No. 2017-253643 filed on Dec. 28, 2017 including the specification, drawings and abstract is incorporated herein by reference in its entirety.

BACKGROUND

The present invention relates to a method of manufacturing a semiconductor device, for example, a technology effective when applied to a technology of manufacturing a semiconductor device using an SOI substrate.

A semiconductor device is manufactured by forming an element isolation portion in a semiconductor substrate, forming a semiconductor element such as a MISFET (metal insulator semiconductor field effect transistor) in an active region of the semiconductor substrate defined by the element isolation portion, and forming a multilayer wiring structure on the semiconductor substrate. In addition, there is a technology using an SOI substrate as a semiconductor substrate.

Japanese Unexamined Patent Application Publication No. 2017-22250 (Patent Document 1) describes a semiconductor device obtained by forming a thin-film MISFET on a semiconductor layer selectively formed on the surface of a semiconductor substrate via a buried insulating layer and forming another MISFET in the other region on the surface of the semiconductor substrate.

Japanese Unexamined Patent Application Publication No. 2001-203185 (Patent Document 2) describes a technology relating to etching.

PATENT DOCUMENTS

[Patent Document 1] Japanese Unexamined Patent Application Publication No. 2017-22250
[Patent Document 2] Japanese Unexamined Patent Application Publication No. 2001-203185

SUMMARY

A semiconductor device to be manufactured using an SOI substrate is desired to have improved reliability.

Another object and novel features will be apparent from the description herein and accompanying drawings.

According to one embodiment, a method of manufacturing a semiconductor device has (a) a step of providing a substrate including a semiconductor substrate, an insulating layer on the semiconductor substrate, a semiconductor layer on the insulating layer, a first insulating film on the semiconductor layer, a trench penetrating the first insulating film, the semiconductor layer, and the insulating layer and reaching the semiconductor substrate, and an element isolation portion buried in the trench. The insulating layer, the first insulating film, and the element isolation portion are made of the same material as one another. The method of manufacturing a semiconductor device further has (b) a step of forming a first mask layer so as to cover the first insulating film in the first region of the substrate and so as to expose the first insulating film in a second region of the substrate, which is different from the first region and (c) a step of removing the first insulating film in the second region with the first mask layer as an etching mask to expose the semiconductor layer in the second region. The first dry etching uses a first gas containing a fluorocarbon gas and an etching thickness, by the first dry etching, of the element isolation portion not covered with the first mask layer is at least the sum of a first thickness of the first insulating film just before starting the first dry etching and a second thickness of the semiconductor layer just before starting the first dry etching. The method of manufacturing a semiconductor device further has (d) after the step (c), subjecting the substrate to oxygen plasma treatment, (e) after the step (d), removing the semiconductor layer in the second region by a second dry etching with the first mask layer as an etching mask to expose the insulating layer in the second region, and (f) after the step (e), removing the first mask layer. The method of manufacturing a semiconductor device further has (g) a step of removing the first insulating film in the first region and the insulating layer in the second region by etching to expose the semiconductor layer in the first region and the semiconductor substrate in the second region, and (h) after the step (g), forming a first transistor on the semiconductor layer in the first region and forming a second transistor on the semiconductor substrate in the second region.

According to the one embodiment, a semiconductor device having improved reliability can be provided.

DETAILED DESCRIPTION

Figure 1:
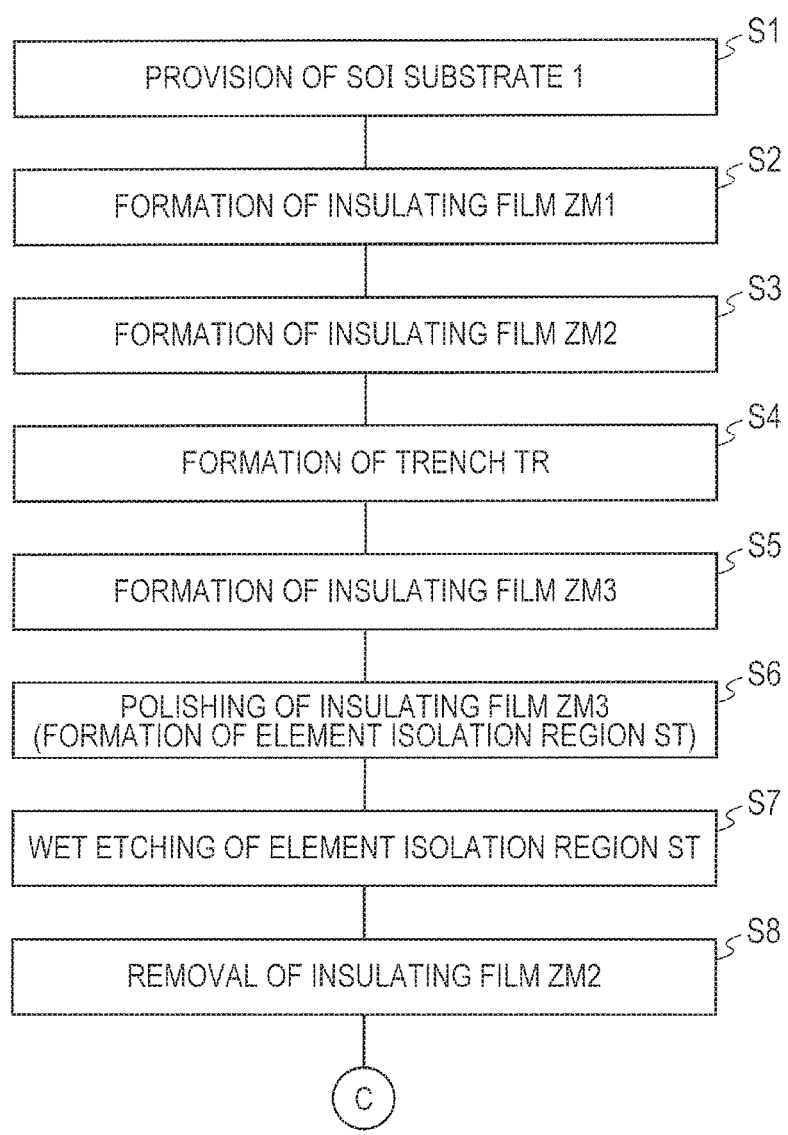
FIG. 1 is a process flow chart showing steps of manufacturing a semiconductor device of First Embodiment.

In the below-described embodiments, a description will be made after divided into a plurality of sections or embodiments if necessary for the sake of convenience. These sections or embodiments are not independent from each other unless otherwise particularly specified, but one of them may be a modification example, a detailed description, a complementary description, or the like of a part or whole of the other one. In the below-described embodiments, when a reference is made to the number (including the number, value, amount, range, or the like) of a component, the number is not limited to a specific number but may be more or less than the specific number, unless otherwise particularly specified or principally apparent that the number is limited to the specific number. Further, in the below-described embodiments, the constituent component (including component step or the like) is not always essential unless otherwise particularly specified or principally apparent that it is essential. Similarly, in the below-described embodiments, when a reference is made to the shape, positional relationship, or the like of the constituent component, a component substantially approximate or analogous in shape or the like is also embraced unless otherwise particularly specified or principally apparent that it is not. This also applies to the above-described number and range.

Embodiments of the invention will hereinafter be described in detail based on some drawings. In all the drawings for describing the embodiments, members having the same function will be identified by the same sign and overlapping descriptions will be omitted. In the below-described embodiments, a description on the same or similar portion is not repeated in principle unless otherwise particularly necessary.

Even when the drawing used in the embodiment is a cross-sectional view, hatching may be omitted to facilitate viewing of it. Even a plan view, on the other hand, may be hatched to facilitate viewing of it.

(First Embodiment)

<Steps of Manufacturing Semiconductor Device>

Figure 2:
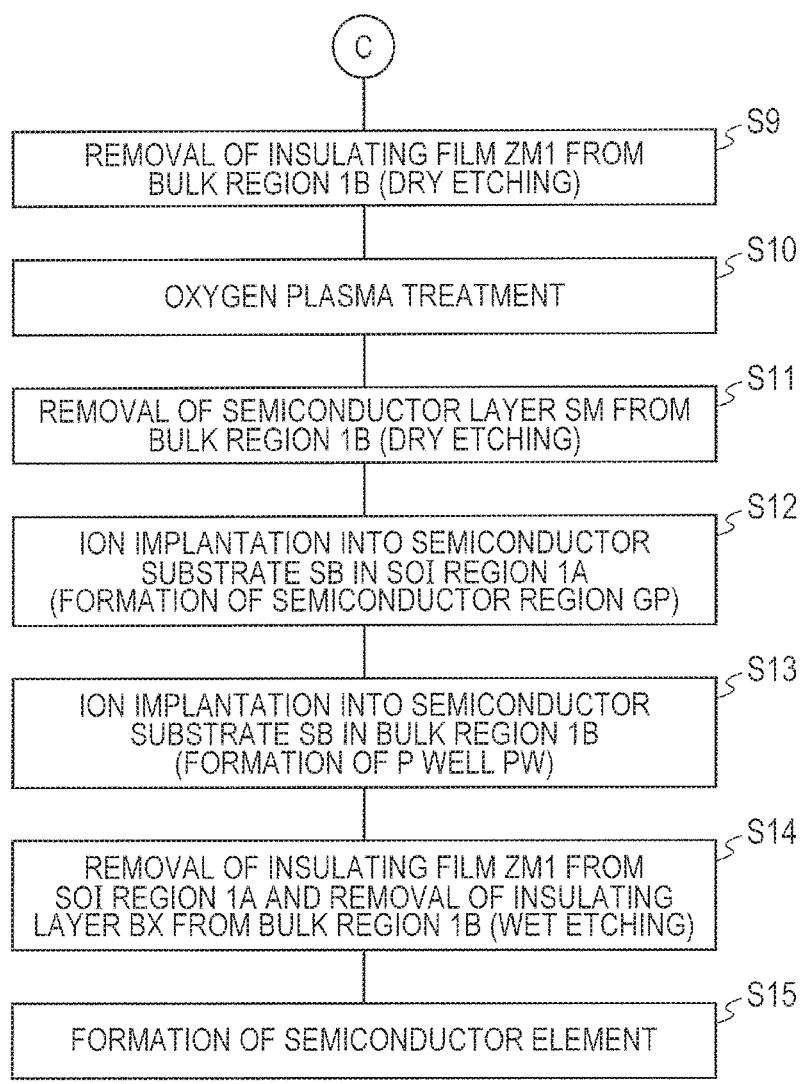
FIG. 2 is a process flow chart showing steps of manufacturing the semiconductor device following those of FIG. 1.
Figure 23:
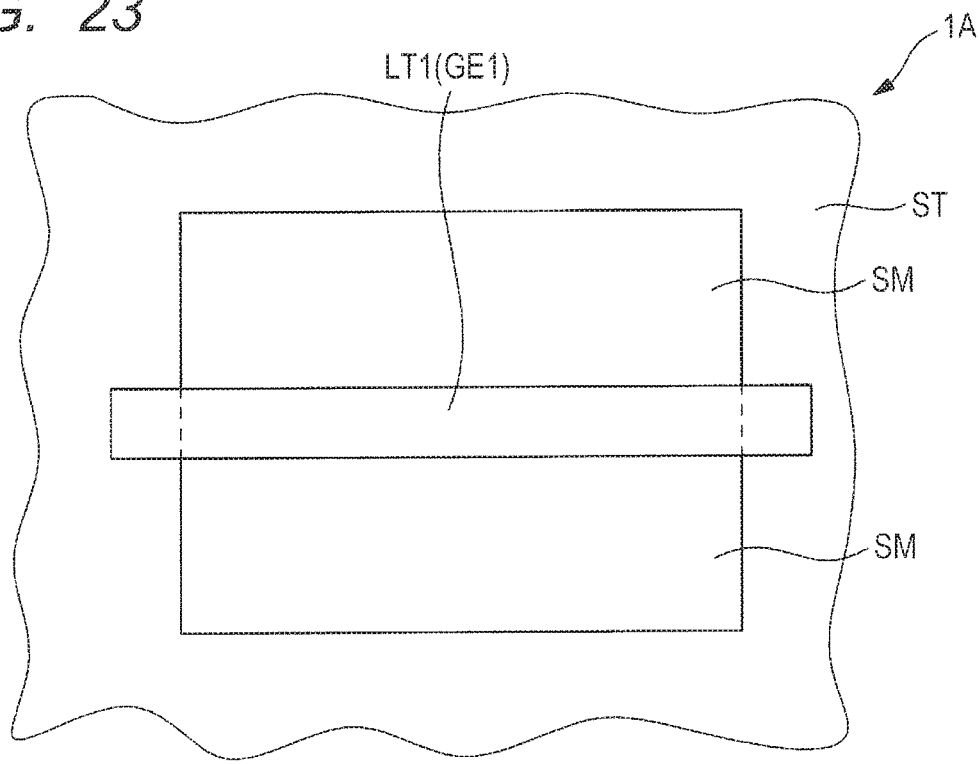
FIG. 23 is a fragmentary cross-sectional view of the semiconductor device during a manufacturing step following that shown in FIG. 22.
Figure 24:
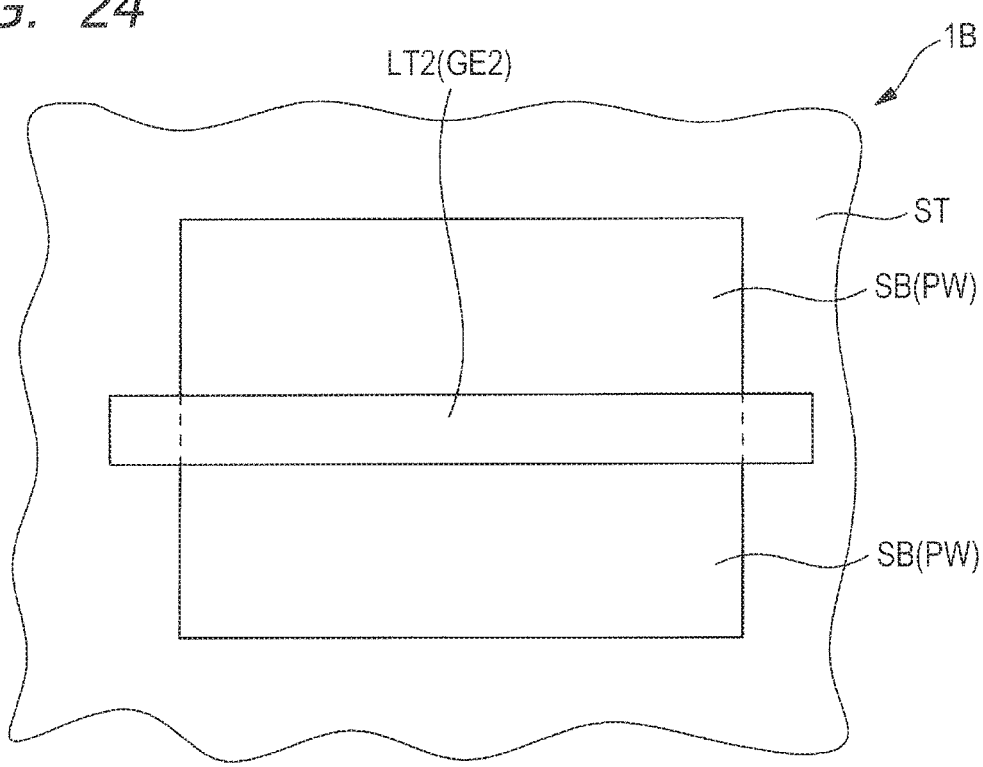
FIG. 24 is a fragmentary cross-sectional view of the semiconductor device during a manufacturing step following that shown in FIG. 22.

Steps of manufacturing a semiconductor device of the present embodiment will be described referring to some drawings. FIG. 1 and FIG. 2 are each a process flow chart showing steps of manufacturing a semiconductor device of First Embodiment of the invention. FIGS. 3 to 34 are each a fragmentary cross-sectional view or fragmentary plan view of the semiconductor device of First Embodiment of the invention during manufacturing steps thereof. Of FIGS. 3 to 34, FIGS. 3 to 22 and FIGS. 25 to 34 are each a fragmentary cross-sectional view and FIGS. 23 and 24 are each a fragmentary plan view.

Figure 3:
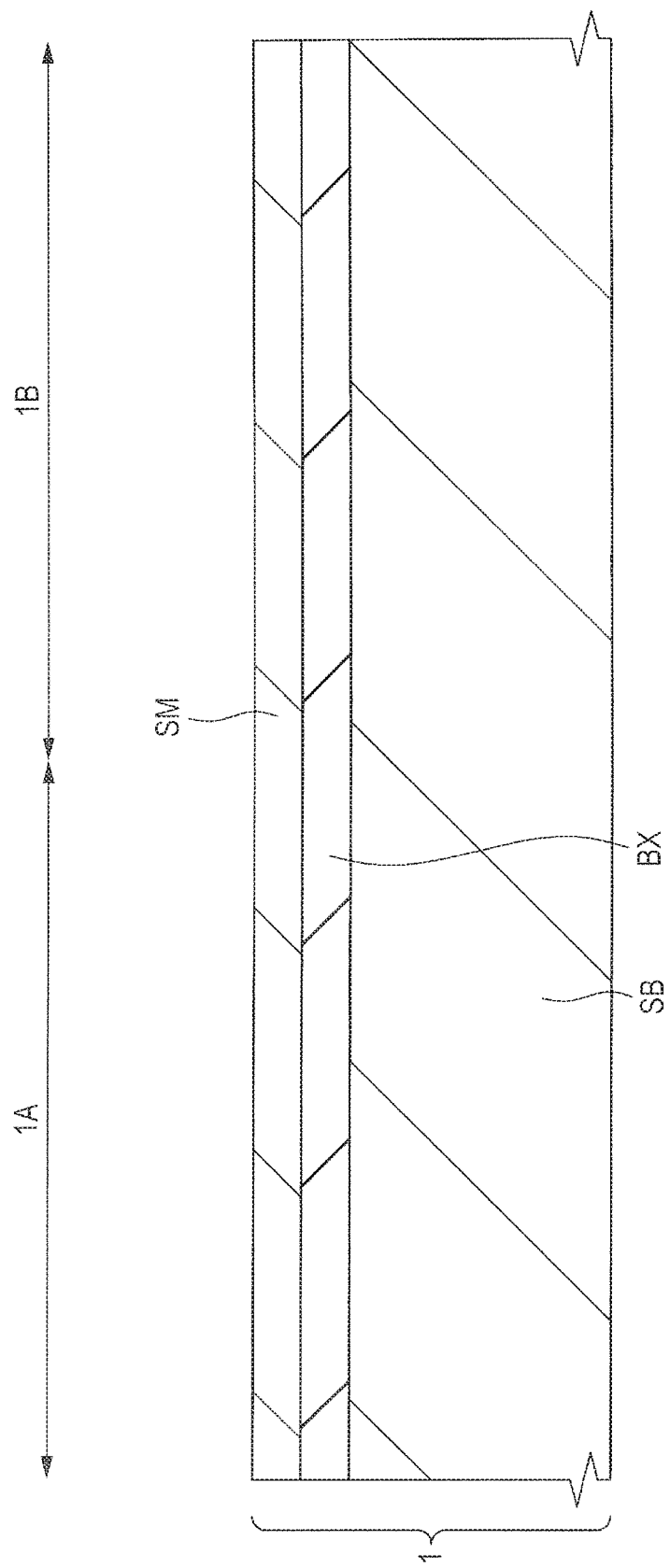
FIG. 3 is a fragmentary cross-sectional view of the semiconductor device of First Embodiment during a manufacturing step.

First, as shown in FIG. 3, an SOI (silicon on insulator) substrate 1 is provided (prepared) (Step S1 of FIG. 1).

The SOI substrate 1 has a semiconductor substrate SB as a support substrate, an insulating layer (buried insulating film) BX formed on the main surface of the semiconductor substrate SB, and a semiconductor layer SM formed on the upper surface of the insulating layer BX.

The semiconductor substrate SB is a support substrate for supporting the insulating layer BX and a structure above the insulating layer BX but it is also a semiconductor substrate. The semiconductor substrate SB is preferably a single crystal silicon substrate and is made of, for example, p type single crystal silicon. The semiconductor substrate SB can be made of, for example, single crystal silicon having a specific resistance of from about 1 to 10 Ωcm. The semiconductor substrate SB can have a thickness of, for example, from about 250 to 800 μm. The insulating layer BX is preferably a silicon oxide film and the insulating layer BX can have a thickness of, for example, from about 10 to 20 nm. When the insulating layer BX is a silicon oxide film, the insulating layer BX can also be regarded as a BOX (buried oxide) layer. The semiconductor layer SM is made of single crystal silicon or the like. The semiconductor layer SM can be made of, for example, single crystal silicon having a specific resistance of from about 1 to 10 Ωcm. The semiconductor layer SM is thinner than the semiconductor substrate SB serving as a support substrate and the semiconductor layer SM can have a thickness of, for example, from about 10 to 30 nm. The semiconductor substrate SB, the insulating layer BX, and the semiconductor layer SM configure the SOI substrate 1.

The SOI substrate 1 has an SOI region (first region) 1A which is a region (planar region) continuing to have an SOI structure until completion of the semiconductor device and a bulk region (second region) 1B which is a region (planar region) losing its SOI structure later by the removal of the semiconductor layer SM and the insulating layer BX. The SOI region 1A and the bulk region 1B are regions (planar regions) different from each other. In the "SOI structure", a silicon layer (single crystal silicon layer) can be preferably used as the semiconductor layer on the insulating layer. The semiconductor layer is however not limited thereto and a semiconductor layer other than a silicon single crystal may be used instead.

In the SOI substrate 1, the main surface of the semiconductor substrate SB on the side contiguous to the insulating layer BX is called "upper surface of the semiconductor substrate SB" and the main surface of the semiconductor substrate SB on the side opposite to the upper surface is called "back surface of the semiconductor substrate SB". In the SOI substrate 1, the main surface of the insulating layer BX on the side contiguous to the semiconductor substrate SB is called "lower surface of the insulating layer BX" and the main surface on the side contiguous to the semiconductor layer SM is called "upper surface of the insulating layer BX", and the upper surface and the lower surface of the insulating layer are opposite to each other. The main surface of the semiconductor layer SM on the side contiguous to the insulating layer BX is called "lower surface of the semiconductor layer SM" and the main surface on the side opposite to the lower surface of the semiconductor layer SM is called "upper surface of the semiconductor layer SM".

A method of manufacturing the SOI substrate 1 is not limited but the SOI substrate 1 can be manufactured using, for example, SIMOX (separation by implantation of oxygen), lamination method, or smart cut process.

Figure 4:
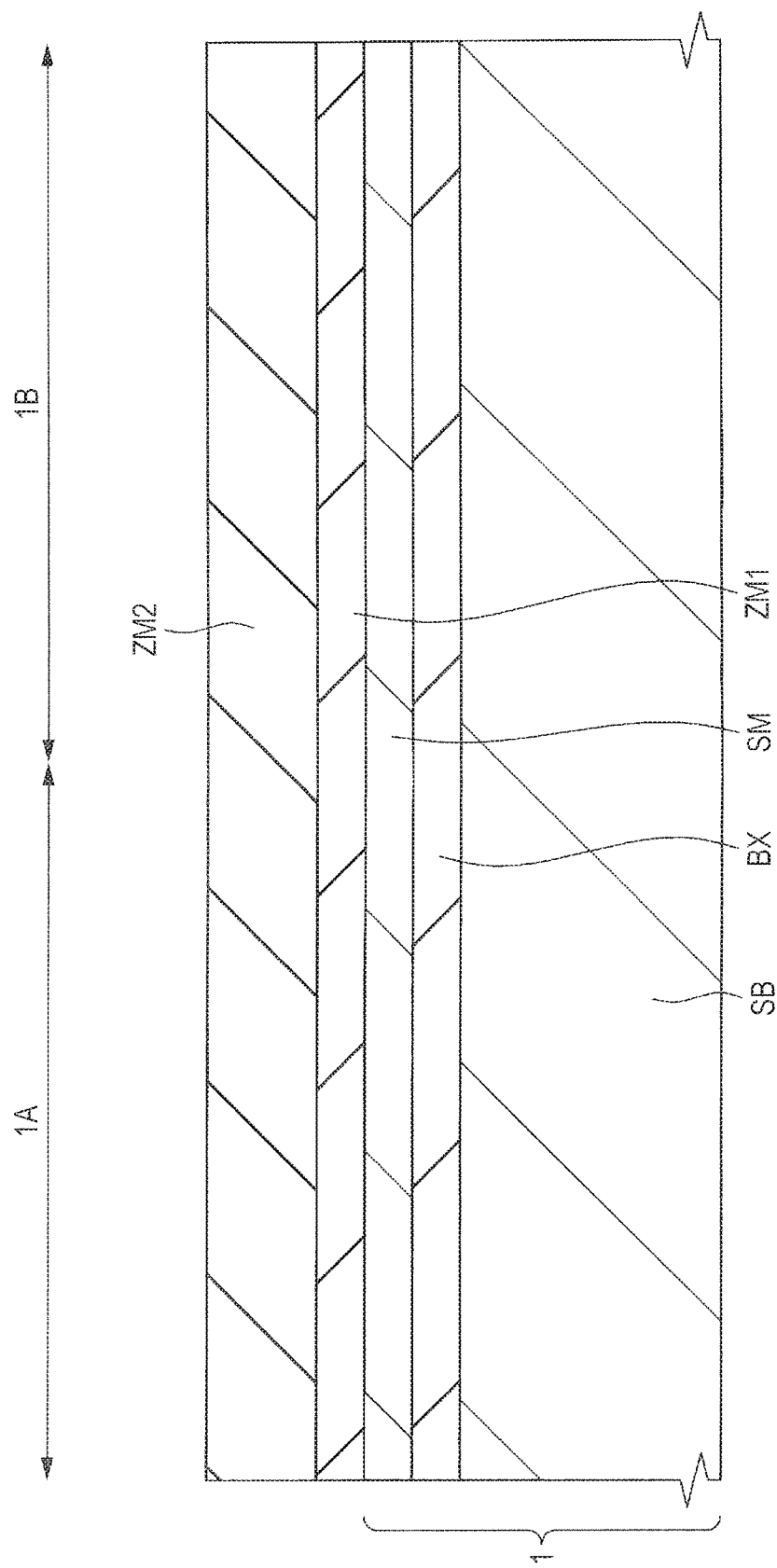
FIG. 4 is a fragmentary cross-sectional view of the semiconductor device during a manufacturing step following that shown in FIG. 3.

Next, as shown in FIG. 4, an insulating film (pad insulating film) ZM1 is formed on the main surface of the SOI substrate 1, that is, on the upper surface of the semiconductor layer SM (Step S2 of FIG. 1). The insulating film ZM1 is made of a material same as that of the insulating layer BX. When the insulating layer BX is made of silicon oxide, the insulating film ZM1 is also made of silicon oxide. The insulating film ZM1 can be formed using, for example, CVD (chemical vapor deposition). The insulating film ZM1 can be formed as a film having a thickness of, for example, from about 5 to 20 nm.

Next, an insulating film ZM2 is formed on the insulating film ZM1 (Step S3 of FIG. 1). The insulating film ZM2 is made of a material different from that of the insulating film ZM1. When the insulating layer BX and the insulating film ZM1 are each made of silicon oxide, the insulating film ZM2 is preferably made of silicon nitride. The insulating film ZM2 is also made of a material different from an insulating film ZM3 described later. The insulating film ZM2 can be formed using, for example, CVD. The insulating film ZM2 can be formed as a film having a thickness of, for example, from about 30 to 200 nm. Although it is necessary that the insulating film ZM2 is made of a material different from the insulating films ZM1 and ZM3, a material film (for example, silicon film) other than an insulator material can also be used instead of the insulating film ZM2 in principle.

By these steps (Steps S1 to S3), a substrate including the semiconductor substrate SB, the insulating layer BX on the semiconductor substrate SB, the semiconductor layer SM on the insulating layer BX, the insulating film ZM1 on the semiconductor layer SM, and the insulating film ZM2 on the insulating film ZM1 is provided.

Figure 5:
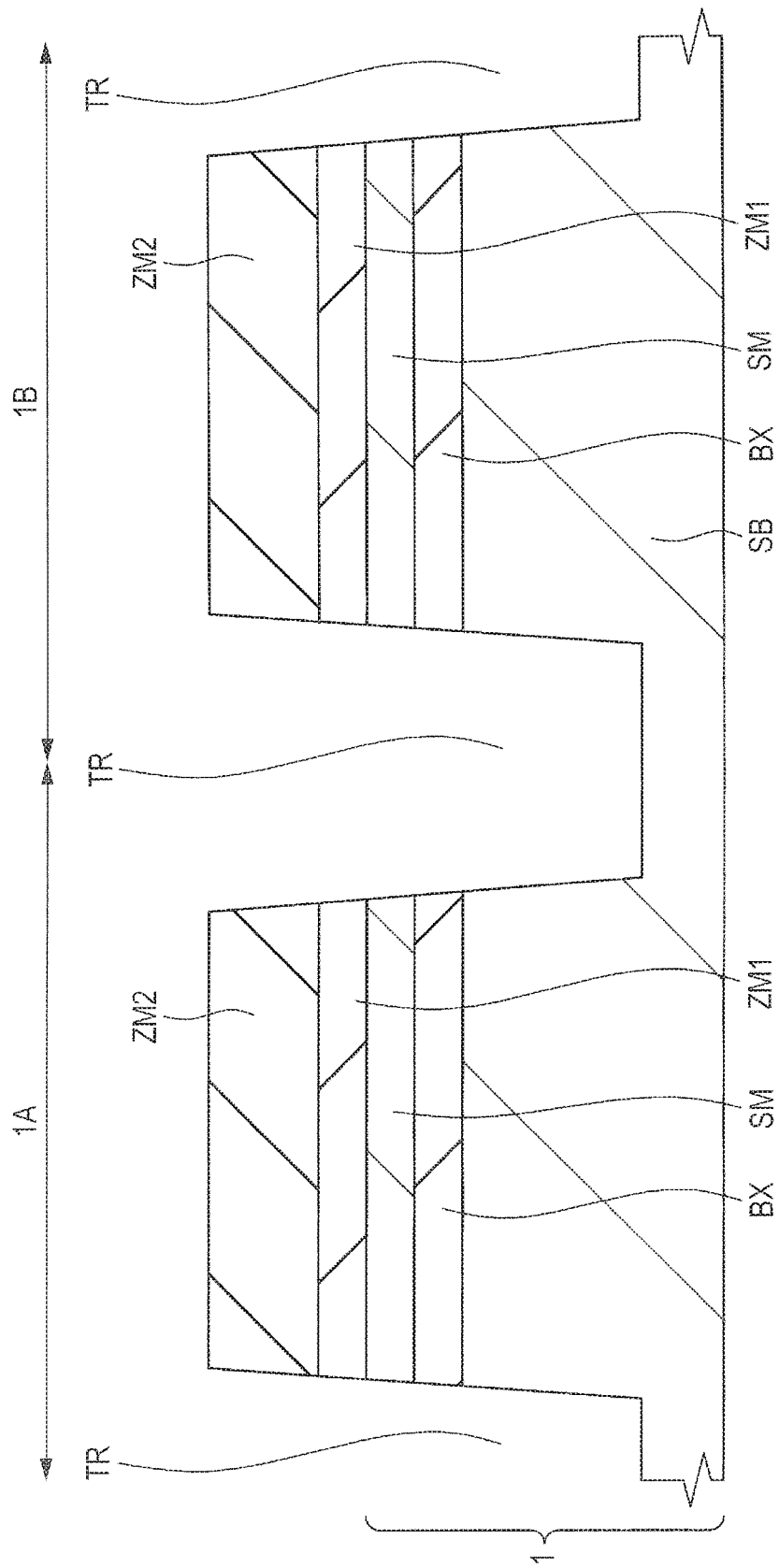
FIG. 5 is a fragmentary cross-sectional view of the semiconductor device during a manufacturing step following that shown in FIG. 4.

Next, as shown in FIG. 5, a trench TR is formed (Step S4 of FIG. 1). The step TR is a trench for forming an element isolation portion ST described later.

The trench TR can be formed as described below. First, a photoresist pattern (not illustrated) is formed on the insulating film ZM2 by photolithography. This photoresist pattern has a pattern (planar shape) that exposes the insulating film ZM2 in a region where the trench TR is to be formed and covers the insulating film ZM2 in the other region. Then, with this photoresist pattern as an etching mask, the insulating film ZM2 is patterned by etching (preferably, dry etching). By this etching, the insulating film ZM2 is selectively removed from the region where the trench TR is to be formed. After removal of the photoresist pattern, the insulating film ZM1, the semiconductor layer SM, the insulating layer BX, and the semiconductor substrate SB are etched (preferably, dry etched) with the insulating film ZM2 as an etching mask (hard mask). Thus, the trench TR can be formed.

The trench TR penetrates the insulating film ZM2, the insulating fil ZM1, the semiconductor layer SM, and the insulating layer BX and the bottom surface (bottom portion) of the trench TR reaches the semiconductor substrate SB. This means that the trench TR has its bottom surface within the thickness of the semiconductor substrate SB. The bottom surface of the trench TR is situated below the lower surface of the insulating layer BX and the semiconductor substrate SB is exposed from the bottom surface of the trench TR. The trench TR can have a thickness of, for example, from about 200 to 400 nm.

Figure 6:
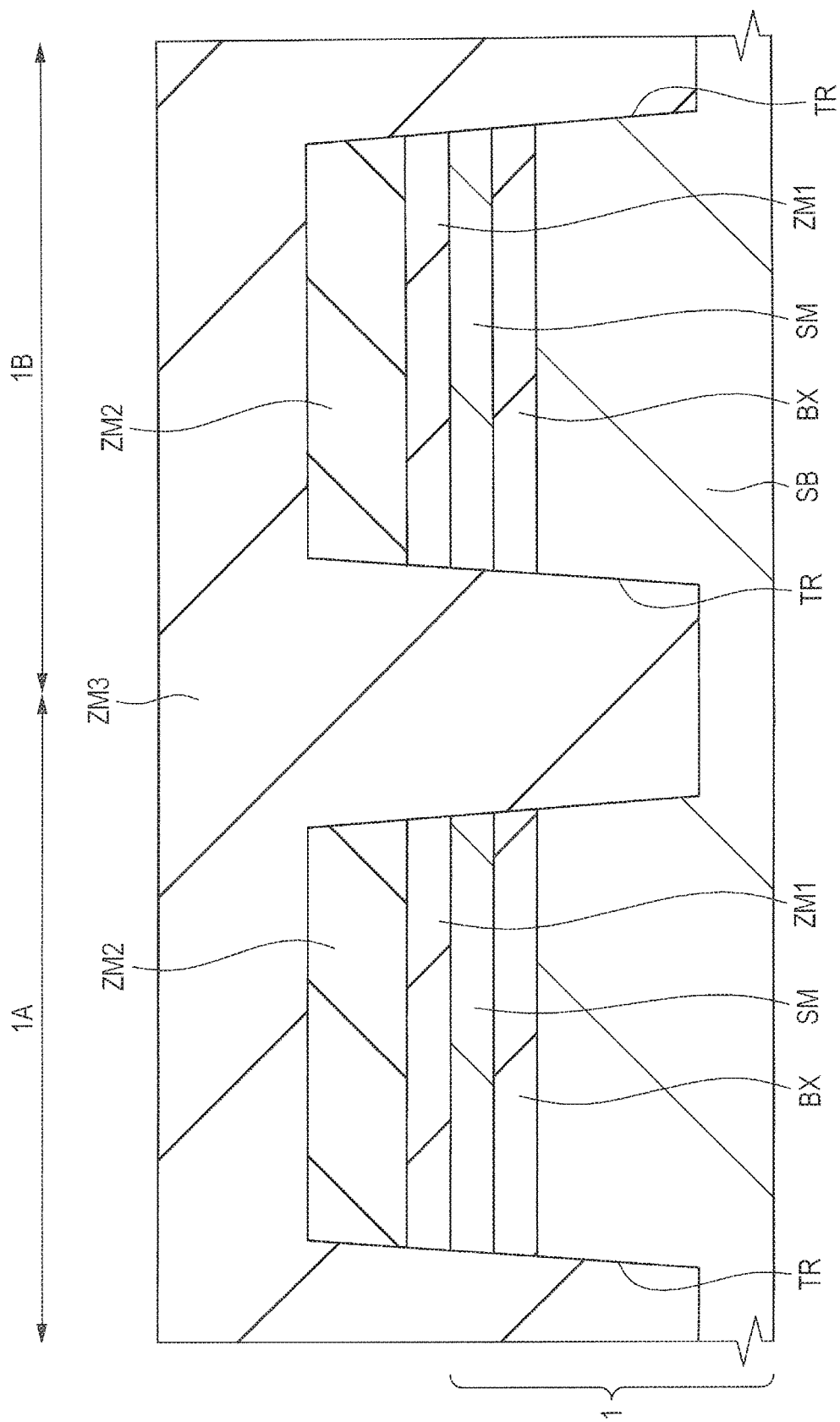
FIG. 6 is a fragmentary cross-sectional view of the semiconductor device during a manufacturing step following that shown in FIG. 5.

Next, as shown in FIG. 6, an insulating film ZM3 is formed on the insulating film ZM2 to fill the trench TR (Step S5 of FIG. 1). The insulating film ZM3 is an insulating film for forming the element isolation portion ST. The insulating film ZM3, the insulating film ZM1, and the insulating layer BX are made of the same material as one another, preferably made of silicon oxide. The insulating film ZM3 can be formed using CVD or the like. The thickness of the insulating film ZM3 to be formed is preferably enough to fill the trench TR with the insulating film ZM3.

Figure 7:
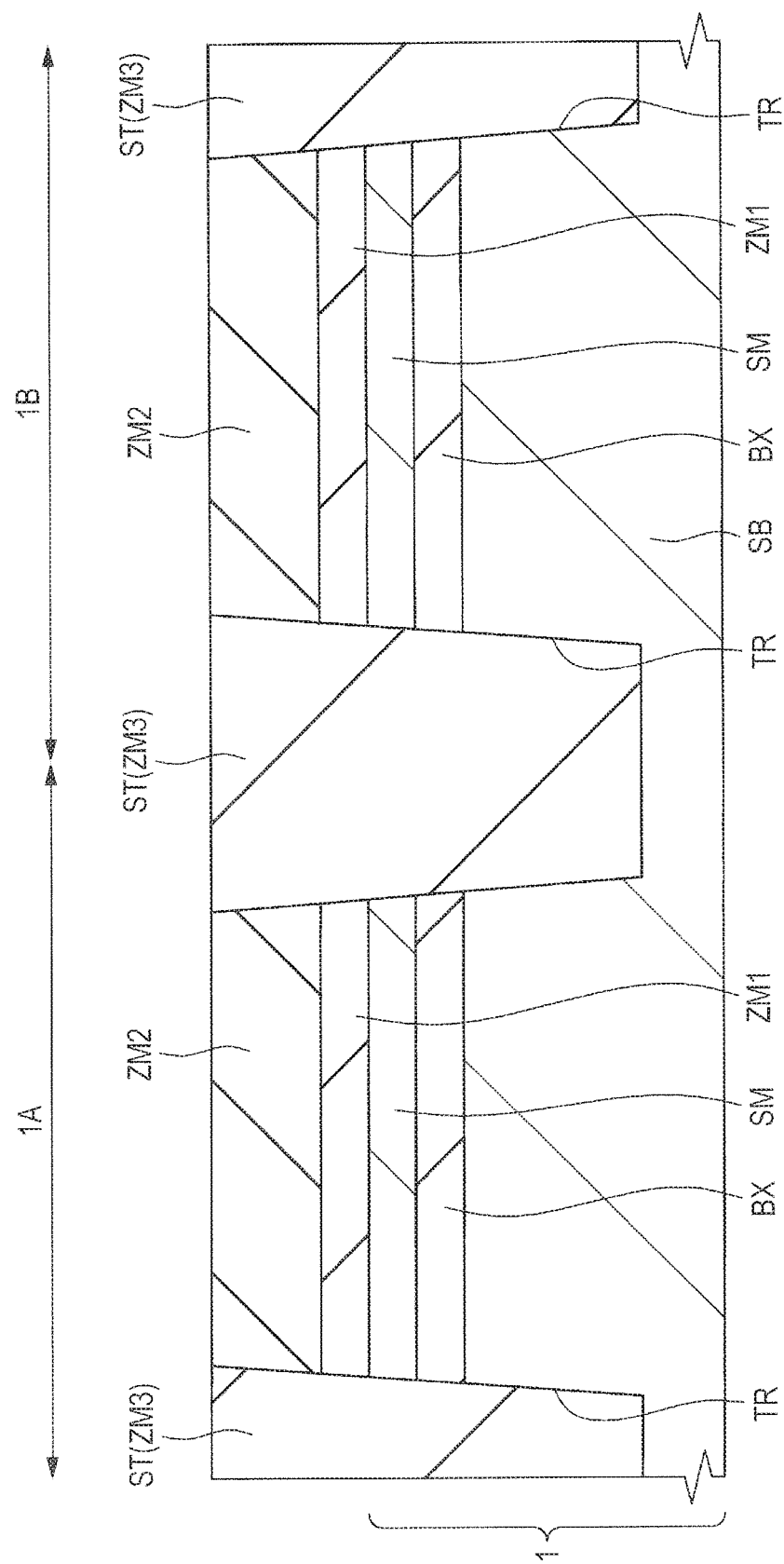
FIG. 7 is a fragmentary cross-sectional view of the semiconductor device during a manufacturing step following that shown in FIG. 6.

Next, as shown in FIG. 7, the insulating film ZM3 is polished using CMP (chemical mechanical polishing) or the like to remove the insulating film ZM3 outside the trench TR and leave the insulating film ZM3 in the trench TR (Step S6 of FIG. 1). By this step, the element isolation portion (element isolation region) ST comprised of the insulating film ZM3 buried in the trench TR can be formed as shown in FIG. 7. The element isolation portion ST is formed in the trench TR.

In the polishing treatment in Step S6, the insulating film ZM2 can function as a polishing stopper film. Described specifically, in Step S6, the polishing treatment is performed under conditions where the insulating film ZM2 is more polish-resistant (a polishing rate becomes smaller) than the insulating film ZM3, the insulating film ZM2 can be functioned as a polishing stopper film. It is therefore necessary to form the insulating film ZM2 and the insulating film ZM3 from respectively different materials. When the insulating film ZM3 is made of silicon oxide, the insulating film ZM2 is preferably made of silicon nitride. After completion of the polishing treatment in Step S6, the upper surface of the insulating film ZM2 is exposed and the trench TR is filled with the element isolation portion ST. As shown in FIG. 7, the upper surface of the element isolation portion ST is almost at the same height position as the upper surface of the insulating film ZM2.

Figure 8:
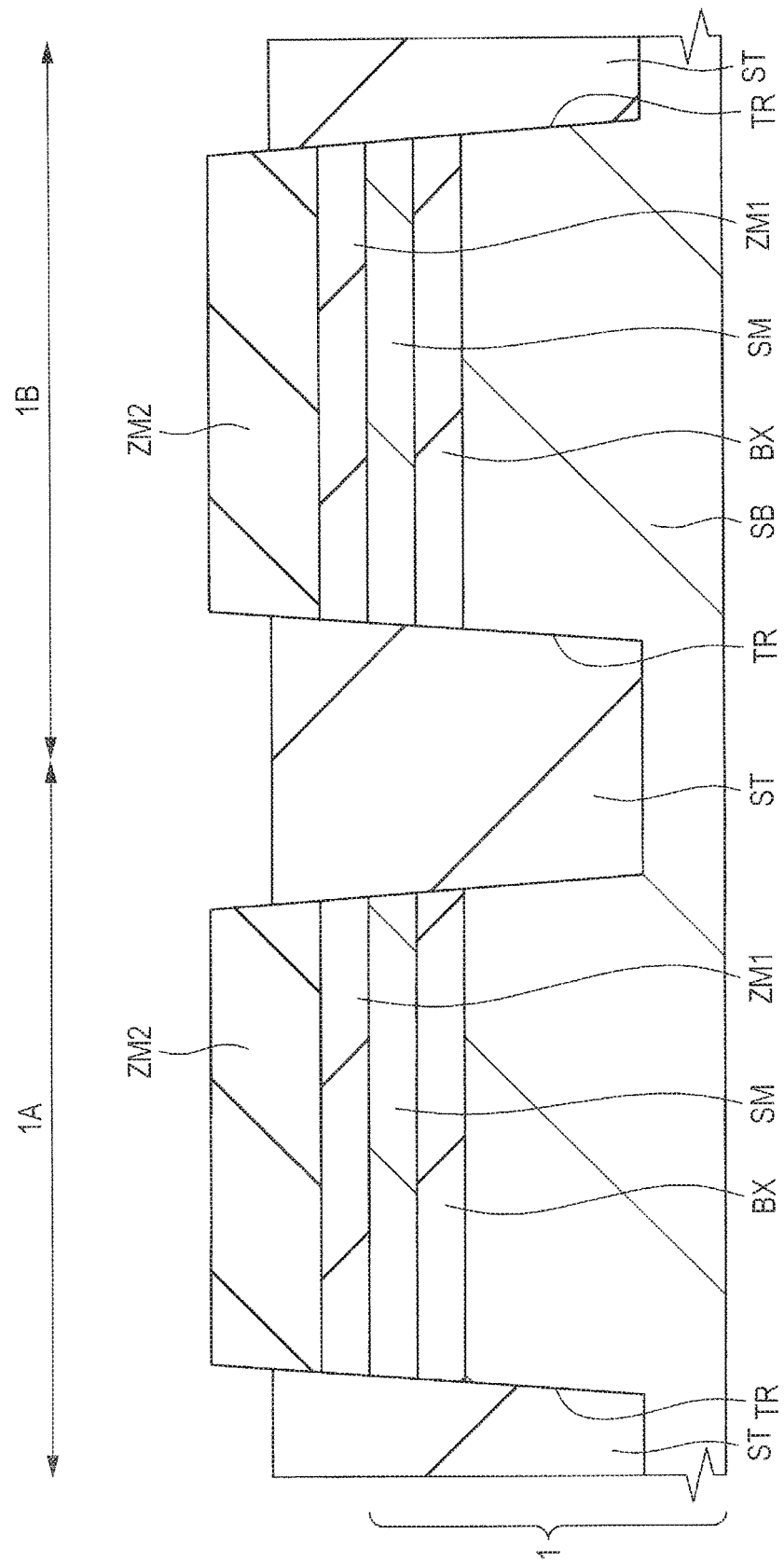
FIG. 8 is a fragmentary cross-sectional view of the semiconductor device during a manufacturing step following that shown in FIG. 7.

Next, as shown in FIG. 8, the upper surface of the element isolation portion ST is wet etched to lower the height position of the upper surface of the element isolation portion ST (Step S7 of FIG. 1). By this step, the height of the upper surface of the element isolation portion ST becomes lower by a predetermined distance (height-direction distance) than the upper surface of the insulating film ZM2. For this wet etching, hydrofluoric acid can be preferably used. After completion of this wet etching, the height position of the upper surface of the element isolation portion ST becomes lower than the upper surface of the insulating film ZM2, but becomes equal to or higher than the upper surface of the insulating film ZM1. It is more preferably higher than the upper surface of the insulating film ZM1. The term "hydrofluoric acid" as used herein also means diluted hydrofluoric acid (dilute hydrofluoric acid).

Figure 9:
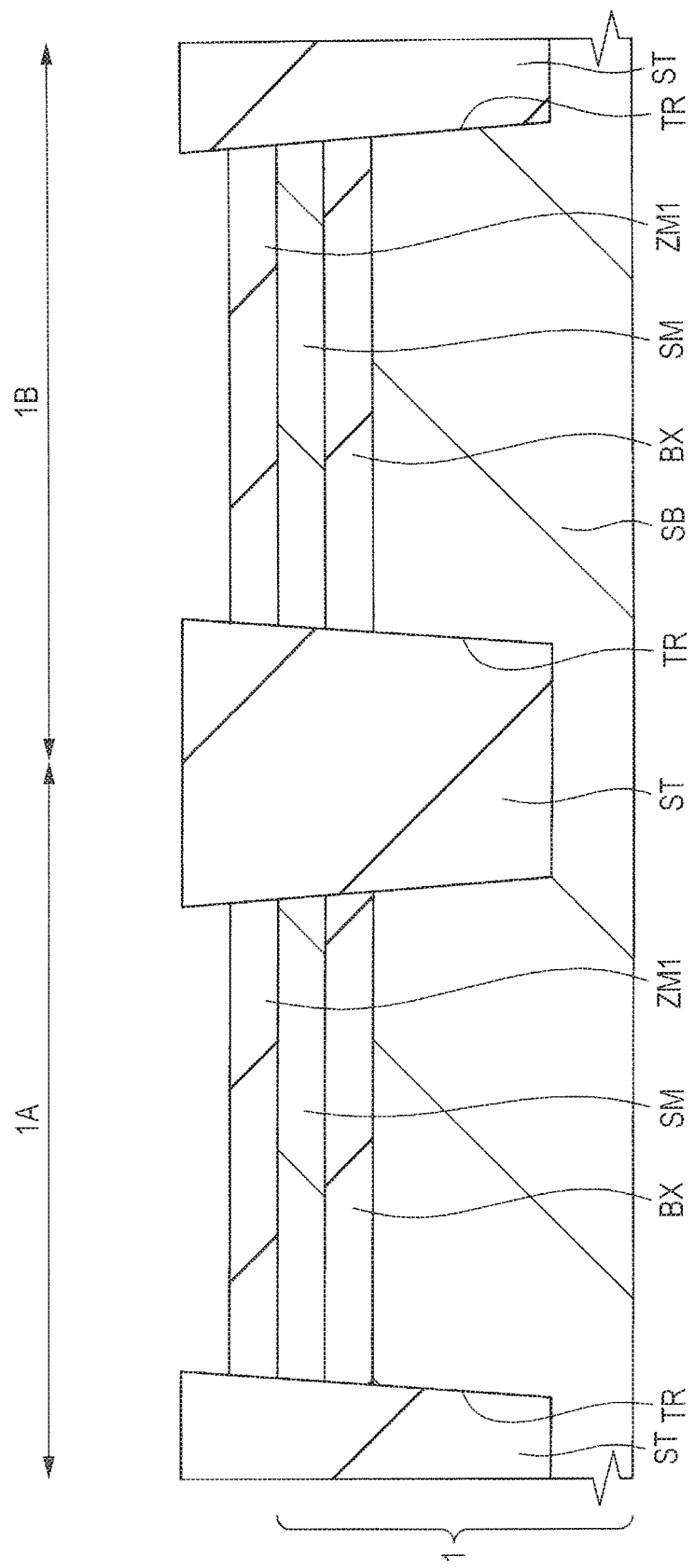
FIG. 9 is a fragmentary cross-sectional view of the semiconductor device during a manufacturing step following that shown in FIG. 8.

Next, as shown in FIG. 9, the insulating film ZM2 is removed by etching (Step S8 of FIG. 1). In this etching, the insulating film ZM1 can be functioned as an etching stopper film. In Step S8, the insulating film ZM2 is preferably removed by etching under conditions where the insulating film ZM1 or the element isolation portion ST is more etch-resistant than the insulating film ZM2. This makes it possible to selectively remove the insulating film ZM2 by etching while suppressing or preventing the insulating film ZM1 and the element isolation portion ST from being etched.

The term "conditions where a member B is more etch-resistant than a member A" has the same meaning as "conditions where an etching rate of a member B is smaller (slower, lower) than an etching rate of a member A". When a member is easily etched, an etching rate becomes large, while when a member becomes etch-resistant, an etching rate becomes small.

As the etching in Step S8, wet etching is preferably used. When the insulating film ZM2 is made of silicon nitride and the insulating film ZM1 and the element isolation portion ST are made of silicon oxide, hot phosphoric acid (heated phosphoric acid) can be preferably used as an etchant for the wet etching in Step S8. In Step S8, in both the SOI region 1A and the bulk region 1B, the insulating film ZM2 is removed and the upper surface of the insulating film ZM1 is exposed.

In such a manner, the element isolation portion ST having an STI structure is formed by STI (shallow trench isolation). Just after the SOI substrate 1 is provided, the semiconductor substrate SB has, on the whole upper surface thereof, the semiconductor layer SM via the insulating layer BX. After formation of the element isolation portion ST, on the other hand, the semiconductor layer SM is divided into a plurality of regions (active regions) each surrounded by the element isolation portion ST.

The trench TR and the element isolation portion ST therein penetrate the insulating film ZM1, the semiconductor layer SM, and the insulating layer BX and reach the semiconductor substrate SB. The lower portion of the element isolation portion ST is situated in the semiconductor substrate SB. This means that the trench TR formed in the insulating film ZM1, the semiconductor layer SM, the insulating layer BX, and the semiconductor substrate SB is filled with the element isolation portion ST. A portion of the element isolation portion ST is therefore situated below the lower surface of the insulating layer BX. This means that the bottom surface (lower surface) of the element isolation portion ST is at a position deeper than the lower surface of the insulating layer BX and a portion (lower portion) of the element isolation portion ST protrudes downward from the lower surface of the insulating layer BX.

At this stage, the SOI region 1A and the bulk region 1B have the same structure. Described specifically, the SOI region 1A and the bulk region 1B each have a structure obtained by stacking, in order from the bottom, the insulating layer BX, the semiconductor layer SM, and the insulating film ZM1 on the semiconductor substrate SB. In plan view, the element isolation portion ST is (placed) between the SOI region 1A and the bulk region 1B. In other words, in plan view, the SOI region 1A and the bulk region 1B have the element isolation portion ST at the boundary therebetween. In this stage, the height position of the upper surface of the element isolation portion ST is almost equal to the height position of the upper surface of the insulating film ZM1 or higher than the upper surface of the insulating film ZM1. The height position is preferably higher than the upper surface of the insulating film ZM1.

Figure 10:
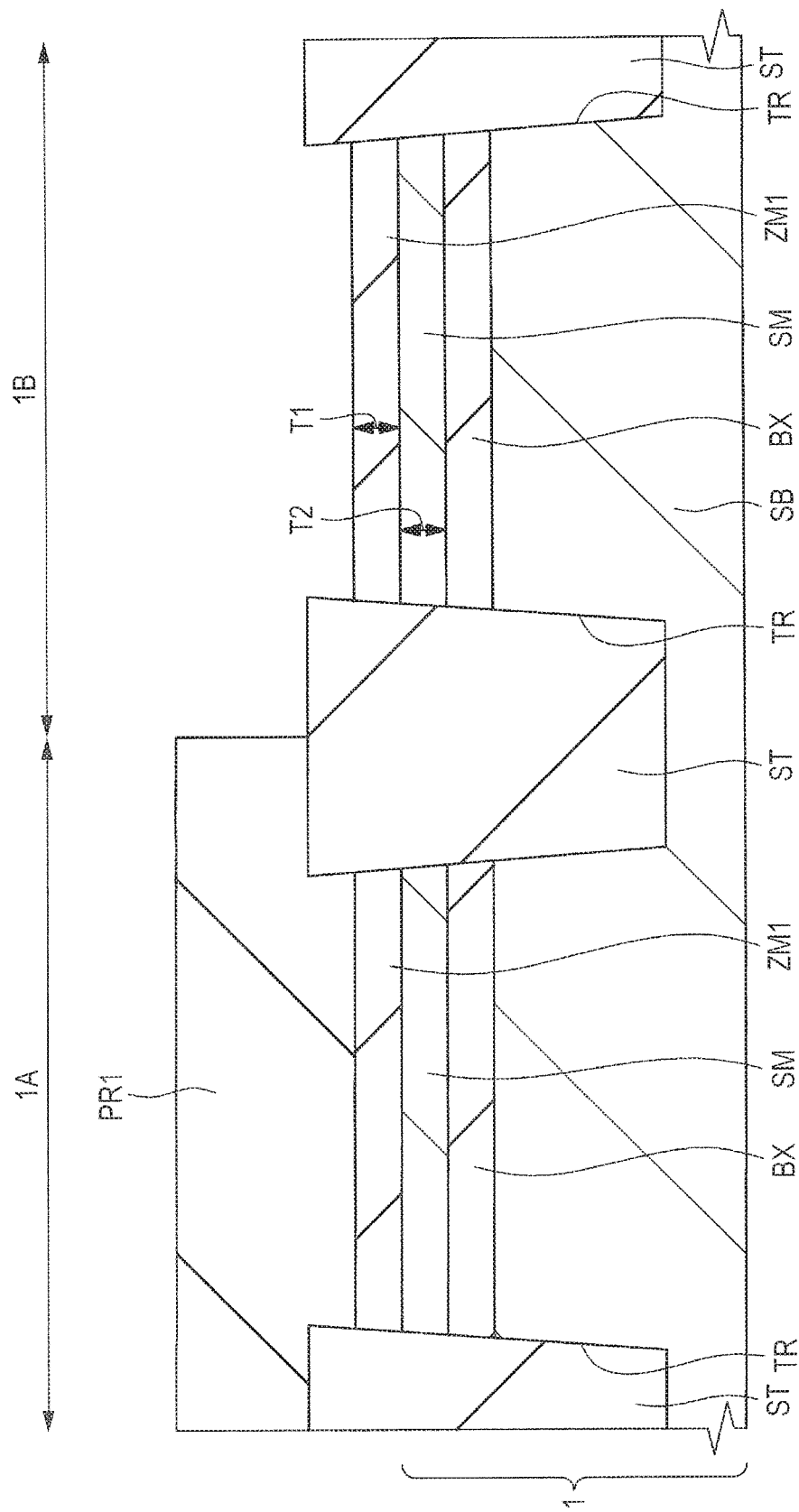
FIG. 10 is a fragmentary cross-sectional view of the semiconductor device during a manufacturing step following that shown in FIG. 9.

Next, as shown in FIG. 10, as a mask layer, a photoresist pattern (resist pattern, mask layer) that covers the SOI region 1A and exposes the bulk region 1B is formed on the insulating film ZM1 by photolithography. The insulating film ZM1 in the SOI region 1A is covered with the photoresist pattern PR1 but the insulating film ZM1 in the bulk region 1B is not covered with the photoresist pattern PR1 and is exposed.

The side surface (end portion) of the photoresist pattern PR1 is situated on the element isolation portion ST provided between the SOI region 1A and the bulk region 1B. This means that in plan view, the SOI region 1A and the bulk region 1B have, at the boundary therebetween, the element isolation portion ST and this element isolation portion ST has thereon the side surface (end portion) of the photoresist pattern PR1. The element isolation portion ST placed at the boundary between the SOI region 1A and the bulk region 1B in plan view has a region covered with the photoresist pattern PR1 and a region not covered with the photoresist pattern PR1 but exposed therefrom. The photoresist pattern PR1 is therefore formed on both the element isolation portion ST and the insulating film ZM1 of the SOI region 1A.

Photolithography is a technology for obtaining a desired photoresist pattern by forming a photoresist film on the entire main surface of the substrate by the method of application and then, patterning the photoresist film by exposure and development.

Figure 11:
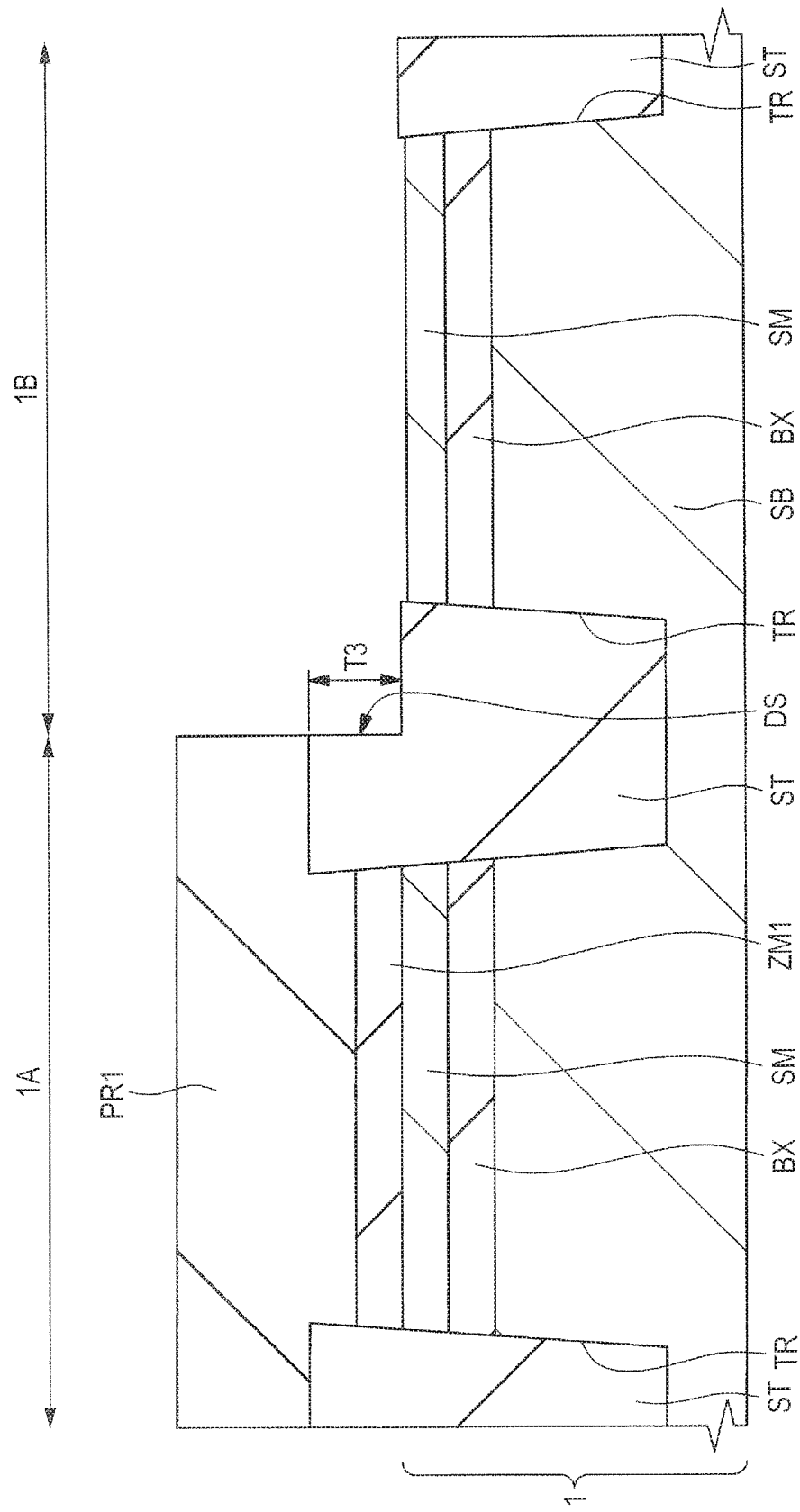
FIG. 11 is a fragmentary cross-sectional view of the semiconductor device during a manufacturing step following that shown in FIG. 10.

Next, as shown in FIG. 11, the insulating film ZM1 is removed from the bulk region 1B by a dry etching with the photoresist pattern PR1 as an etching mask (Step S9 of FIG. 2).

In Step S9, a fluorocarbon gas is used as an etching gas (reactive gas). For the dry etching in Step S9, therefore, a gas containing a fluorocarbon gas is used. The gas used in the dry etching in Step S9 contains a fluorocarbon gas but it may contain another gas (for example, a diluted gas such as inert gas) further. The fluorocarbon gas contains, in the gas molecule thereof, a fluorine (F) atom and a carbon (C) atom.

In Step S9, the insulating film ZM1 is removed from the bulk region 1B and the upper surface of the semiconductor layer SM is exposed. In the SOI region 1A, on the other hand, the insulating film ZM1 remains as is without being etched because it is covered with the photoresist pattern PR1. A region (portion) of the element isolation portion ST covered with the photoresist pattern PR1 is not etched, but a region (portion) of the element isolation region ST exposed without being covered with the photoresist pattern PR1 is etched in Step S9.

When the etching in Step S9 is performed, therefore, a step difference DS is formed at the upper surface of the element isolation portion ST present at the boundary between the SOI region 1A and the bulk region 1B. This step difference DS is formed at the boundary between a region covered with the photoresist pattern PR1 and a region not covered therewith, each at the upper surface of the element isolation portion ST. In short, it is formed at a position aligned with the side surface of the photoresist pattern PR1. Such a step difference DS is not present at the upper surface of the element isolation portion ST just before the etching in Step S9.

In the present embodiment, Step S9 is not only performed for etching the insulating film ZM1 from the bulk region 1B but also performed for lowering the height position of the upper surface of the element isolation portion ST not covered with the photoresist pattern PR1. Lowering the height position of the upper surface of the element isolation portion ST not covered with the photoresist pattern PR1 corresponds to an increase in etching thickness (etching amount) of the element isolation portion ST not covered with the photoresist pattern PR1.

In the present embodiment, in Step S9, in order to increase the etching thickness (etching amount) of the element isolation portion ST exposed without being covered with the photoresist pattern PR1, etching is continued for a predetermined time (meaning, an over-etching time is prolonged) even after removal of the insulating film ZM1 from the bulk region 1B to expose the upper surface of the semiconductor layer SM in the bulk region 1B. More specifically, the etching thickness (etching amount) T3 of the element isolation portion ST in Step S9 is adjusted to be at least the sum of the thickness (first thickness) T1 of the insulating film ZM1 and the thickness (second thickness) of the semiconductor layer SM, each in the bulk region 1B just before Step S9 (in short, T3≥T1+T2).

Here, the etching thickness T3 corresponds to a thickness, etched in Step S9, of the element isolation portion ST exposed without being covered with the photoresist pattern PR1. The magnitude of the step difference DS just after completion of the etching in Step S9 corresponds to the etching thickness T3. Described specifically, a difference in height between the upper surface of the element isolation portion ST covered with the photoresist pattern PR1 and the upper surface of the element isolation portion ST not covered with the photoresist pattern PR1, each at the element isolation portion ST in the vicinity of the side surface of the photoresist pattern PR1, just after completion of the etching in Step S9 corresponds to the magnitude of the step difference DS and therefore, corresponds to the etching thickness T3.

In Step S9, however, it is necessary to prevent the entirety of the semiconductor layer SM from being removed from the bulk region 1B and the insulating layer BX from being exposed. In Step S9, etching is therefore finished before exposure of the insulating layer BX from the bulk region 1B. When Step S9 is performed, the semiconductor layer SM in the bulk region 1B may become thin by etching of the semiconductor layer SM but even if it becomes thin, the semiconductor layer SM in the bulk region 1B remains in layer form on the insulating layer BX and the insulating layer BX in the bulk region 1B is not exposed.

In Step S9, the etching is performed under conditions where the semiconductor layer SM is more etch-resistant than the insulating film ZM1 and the element isolation portion ST. In other words, in Step S9, etching is performed under conditions where the etching rate of the semiconductor layer SM becomes smaller than that of the insulating film ZM1 and the element isolation portion ST. By such etching, in Step S9, the insulating film ZM1 in the bulk region 1B is removed by etching and at the same time, the semiconductor layer SM can be functioned as an etching stopper, making it possible to prevent exposure of the insulating layer BX in the bulk region 1B.

When different from the present embodiment, the insulating layer BX in the bulk region 1B is exposed in Step S9, there is a fear of the insulating layer BX in the bulk region 1B being etched in Step S9 to expose the semiconductor substrate SB. The insulating layer BX in the bulk region 1B is removed together with the insulating film ZM1 in the SOI region 1A in Step S14 which will be described later. If the insulating layer BX in the bulk region 1B is removed and the semiconductor substrate SB is exposed before Step S14, there is a fear of the semiconductor substrate SB in the bulk region 1B being damaged in an etching step performed later. It is therefore necessary to leave the insulating layer BX in layer form on the semiconductor substrate SB in the bulk region 1B until just before Step S14 so as not to expose the semiconductor substrate SB from the bulk region 1B.

In Step S9, by setting the etching conditions to hinder the semiconductor layer SM from being etched, the semiconductor layer SM is left in layer form in the bulk region 1B to prevent exposure of the insulating layer BX.

When Step S9 is finished, the height position of the upper surface of the element isolation portion ST in a region not covered with the photoresist pattern PR1 may be higher than, equal to, or lower than the height position of the upper surface of the semiconductor layer SM in the bulk region 1B, which though depends on the thickness of the semiconductor layer SM. Just after completion of Step S9, however, it is preferred to adjust the height position of the upper surface of the element isolation portion ST in a region not covered with the photoresist pattern PR1 so as not to be below that of the upper surface of the insulating layer BX in the bulk region 1B. In other words, just after completion of Step S9, the height position of the upper surface of the element isolation portion ST in a region not covered with the photoresist pattern PR1 is preferably almost equal to that of the upper surface of the insulating layer BX in the bulk region 1B or higher than that of the upper surface of the insulating layer BX in the bulk region 1B. Moreover, just after completion of Step S9, the height position of the upper surface of the element isolation portion ST in a region not covered with the photoresist pattern PR1 is more preferably higher than that of the upper surface of the insulating layer BX in the bulk region 1B. This is useful for preventing the upper surface of the semiconductor substrate SB in the bulk region 1B from protruding from the upper surface of the element isolation portion ST and preventing exposure of the side surface of the semiconductor substrate SB in the bulk region 1B when the insulating layer BX in the bulk region 1B is removed in Step S14 described later.

Next, oxygen plasma treatment is performed (Step S10 of FIG. 2). The oxygen plasma treatment in Step S10 is performed to remove a deposit (etching deposit, reaction product) produced during the dry etching in Step S9.

Step S10 can be performed by exposing the SOI substrate 1 to an oxygen plasma atmosphere formed by converting an oxygen gas into plasma. By performing Step S10, the surface of the semiconductor layer SM in the bulk region 1B and the surface of the element isolation portion ST in the region not covered with the photoresist pattern PR1 are exposed to the oxygen plasma atmosphere. Since the deposit (deposit formed during the dry etching in Step S9) attached to the surface of the semiconductor layer SM or the surface of the element isolation portion ST is also exposed to the oxygen plasma atmosphere, the deposit can be removed by reacting it with oxygen plasma. The gas used in Step S10 does not contain a fluorine-based gas (gas containing, in the molecule thereof, a fluorine atom) such as a fluorocarbon gas or $SF_6$ gas.

The deposit formed during the dry etching in Step S9 is a reaction product produced during dry etching and is made of, for example, a polymer containing carbon (C) and fluorine (F) contained in the etching gas used in Step S9. Even if a deposit is formed during the dry etching in Step S9, the deposit can be removed by carrying out oxygen plasma treatment in Step S10. In other words, the deposit formed during plasma etching using a fluorocarbon-based gas contains carbon (C) and fluorine (F) and such a deposit can be removed properly by the oxygen plasma treatment so that the oxygen plasma treatment in Step S10 is performed after the etching in Step S9.

Figure 12:
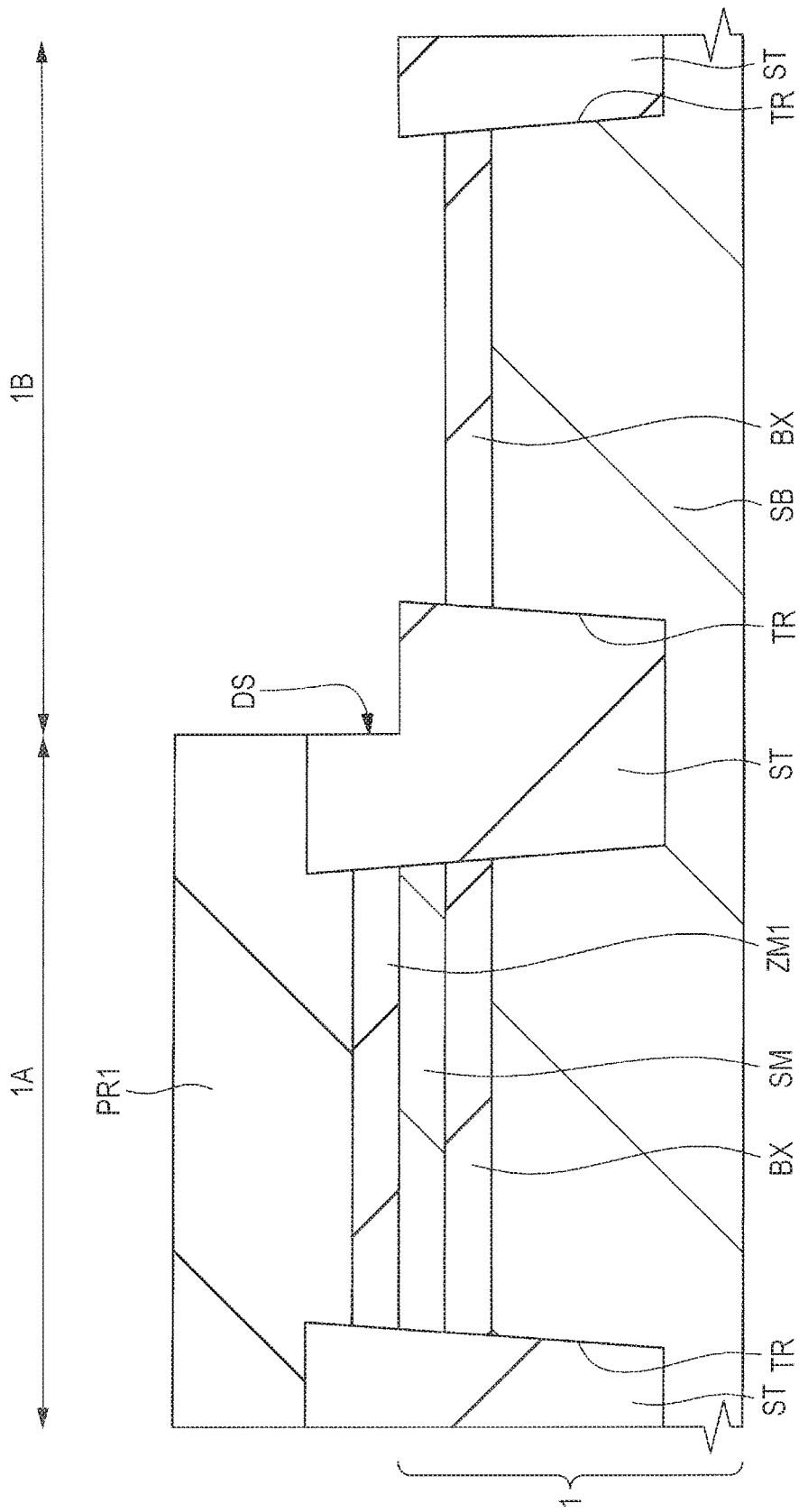
FIG. 12 is a fragmentary cross-sectional view of the semiconductor device during a manufacturing step following that shown in FIG. 11.

Next, as shown in FIG. 12, with the photoresist pattern PR1 as an etching mask, the semiconductor layer SM in the bulk region 1B is removed by a dry etching (Step S11 of FIG. 2). The dry etching in Step S11 is preferably isotropic dry etching, more preferably isotropic etching with a gas composed mainly of a fluorine radical. As an etching gas in Step S11, an $SF_6$ (sulfur hexafluoride) gas or the like is preferred. For the dry etching in Step S11, a gas containing an $SF_6$ gas can be used preferably.

As another mode, an $NF_3$ (nitrogen trifluoride) gas or a $ClF_3$ (chlorine trifluoride) gas can be used as the etching gas in Step S11. For the dry etching in Step S11, therefore, a gas containing an $SF_6$ gas, $NF_3$ gas or $ClF_3$ gas can be used.

The isotropic etching in Step S11 can preferably be performed, for example, by using a CDE (chemical dry etching) apparatus that performs etching while placing a shield plate of charged particles between a plasma formation region and the substrate (the SOI substrate). Alternatively, the isotropic etching in Step S11 can be performed while using a plasma etching apparatus having two RF power sources, that is, a plasma formation RF power source and a charged-particle acceleration RF power source and setting the output of the power source (the charged-particle acceleration RF power source) to be applied to a stage (a substrate placing stage) at zero (0).

In Step S11, in the bulk region 1B, the semiconductor layer SM is removed by etching and the upper surface of the insulating layer BX is exposed. On the other hand, in the SOI region 1A, the insulating film ZM1 and the semiconductor layer SM remain without being etched because they are covered with the photoresist pattern PR1.

In Step S11, the semiconductor layer SM is preferably removed from the bulk region 1B by etching under conditions where the insulating layer BX and the element isolation portion ST are more etch-resistant than the semiconductor layer SM. In other words, in Step S11, etching is performed preferably under conditions where the etching rate of each of the insulating layer BX and the element isolation portion ST becomes smaller than that of the semiconductor layer SM. In Step S11, therefore, the semiconductor layer SM can be selectively removed from the bulk region 1B by etching; the insulating layer BX in the bulk region 1B can be functioned as an etching stopper; and the element isolation portion ST can be suppressed or prevented from being etched.

Since Step S9 and Step S11 are different in an object to be etched, an etching gas used in Step S11 is different from the etching gas used in Step S9. Described specifically, Step S9 is a step of positively (intentionally) etching the insulating film ZM1 in the bulk region 1B and a portion of the element isolation portion ST not covered with the photoresist patter PR1, while Step S11 is a step of positively (intentionally) etching the semiconductor layer SM in the bulk region 1B.

Even after each of Steps S9, S10, and S11, the insulating film ZM1 in the SOI region 1A is not etched because it is covered with the photoresist pattern PR1.

The etching step in Step S9, the oxygen plasma treatment in Step S10, and the etching step in Step S11 are performed preferably continuously without exposing the SOI substrate 1 to the air.

Figure 13:
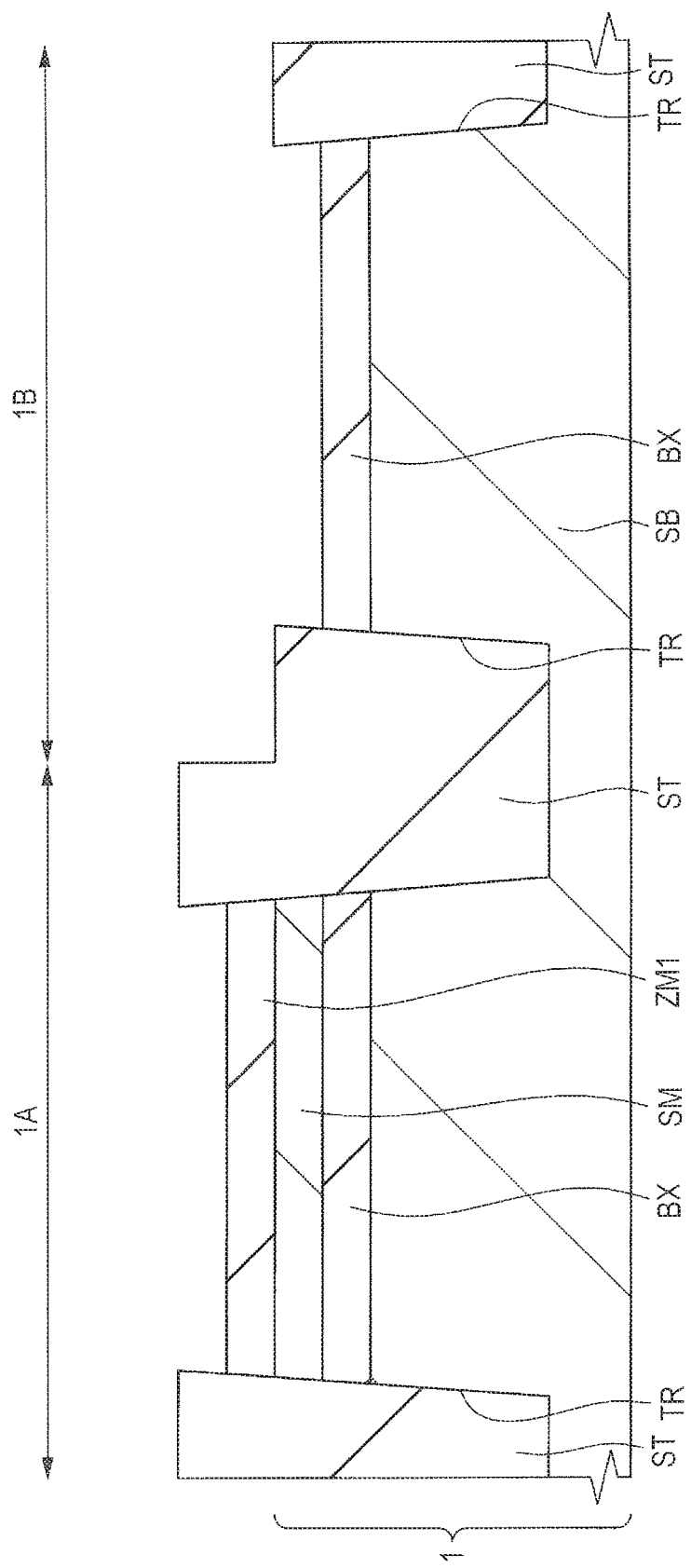
FIG. 13 is a fragmentary cross-sectional view of the semiconductor device during a manufacturing step following that shown in FIG. 12.

After the etching step in Step S11, the photoresist pattern PR1 is removed by asking or the like as shown in FIG. 13. At this stage, as shown in FIG. 13, the insulating film ZM1 remains and the upper surface of the insulating film ZM1 is exposed in the SOI region 1A, while the upper surface of the insulating layer BX is exposed in the bulk region 1B.

At this stage, the height position of the upper surface of the element isolation portion ST adjacent to the semiconductor substrate SB in the bulk region 1B is preferably not lower than the upper surface of the insulating layer BX in the bulk region 1B. At this stage, therefore, the height position of the upper surface of the element isolation portion ST adjacent to the semiconductor substrate SB in the bulk region 1B is preferably almost equal to the height position of the upper surface of the insulating layer BX in the bulk region 1B or higher than the upper surface of the insulating layer BX in the bulk region 1B, more preferably higher than the upper surface of the insulating layer BX in the bulk region 1B.

Figure 14:
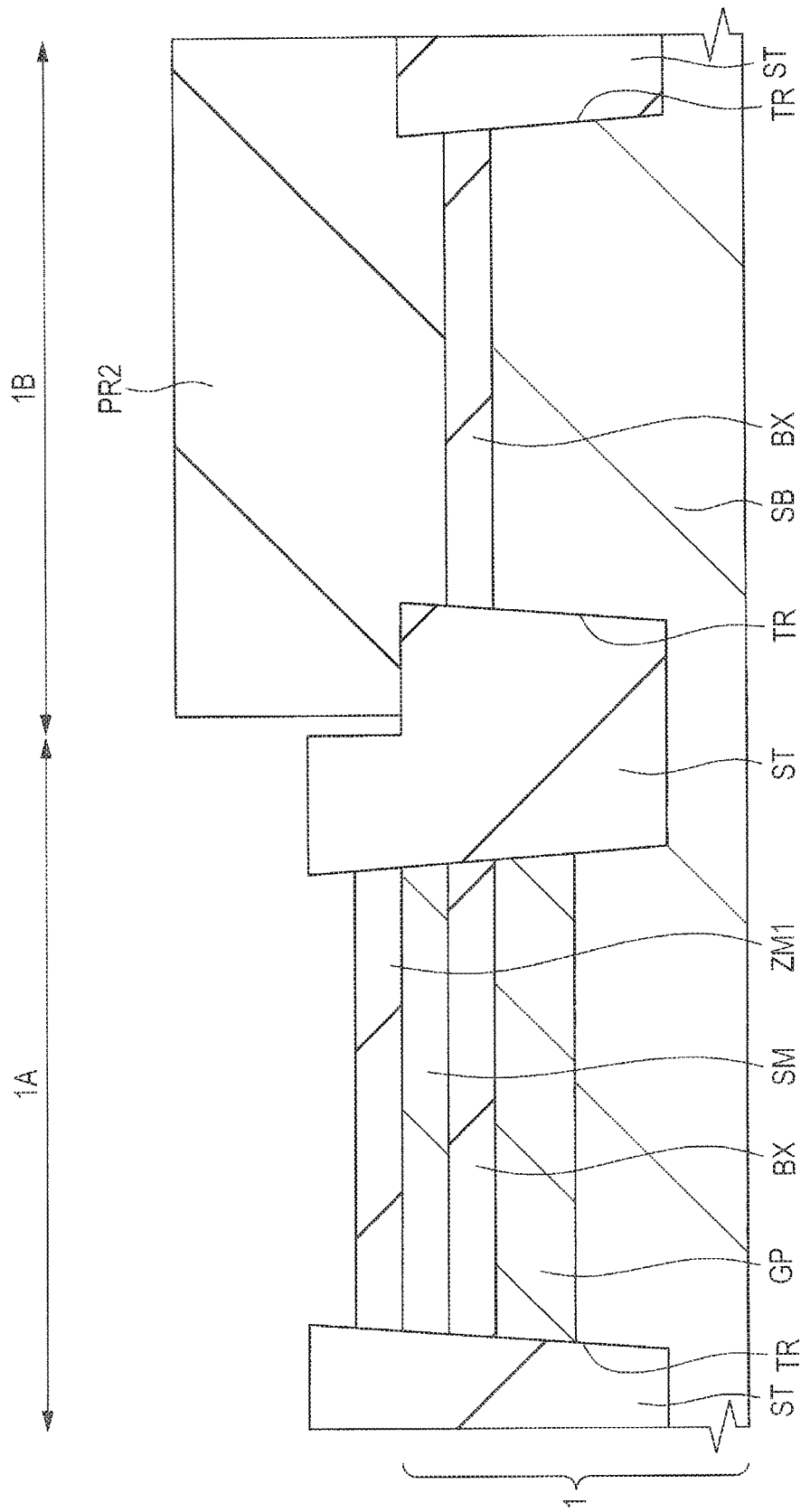
FIG. 14 is a fragmentary cross-sectional view of the semiconductor device during a manufacturing step following that shown in FIG. 13.

Next, as shown in FIG. 14, a photoresist pattern (resist pattern, mask layer) that covers the bulk region 1B and exposes the SOI region 1A is formed, as a mask layer, on the SOI substrate 1 by photolithography. The insulating layer BX in the bulk region 1B is covered with the photoresist pattern PR2 but the insulating film ZM1 in the SOI region 1A is exposed without being covered with the photoresist pattern PR2.

Next, with the photoresist pattern PR2 as a mask (ion implantation inhibiting mask), ion implantation is performed into the semiconductor substrate SB in the SOI region 1A (Step S12 of FIG. 2). This ion implantation will hereinafter be called "ion implantation of Step S12". In FIG. 14, a region into which an impurity has been introduced by the ion implantation of Step S12 is attached with a symbol GP and is shown as a semiconductor region (an impurity diffusion layer) GP. By the ion implantation of Step S12, an impurity (a p type impurity or n type impurity) is introduced into the semiconductor substrate SB in the SOI region 1A and the semiconductor region GP is formed. The semiconductor region GP is a p type semiconductor region or an n type semiconductor region and is adjacent to the insulating layer BX. The ion implantation of Step S12 introduces an impurity ion into the semiconductor substrate SB in the SOI region 1A but it is desired not to introduce the impurity ion into the semiconductor layer SM. The ion implantation of Step S12 does not introduce an impurity into the bulk region 1B of the SOI substrate 1 because the photoresist pattern PR2 functions as an ion implantation inhibiting mask. After the ion implantation of Step S12, the photoresist pattern PR2 is removed.

The semiconductor region GP is formed to control the threshold voltage of a MISFET to be formed in the SOI region 1A. In the semiconductor device thus manufactured, the threshold voltage of the MISFET formed in the SOI region 1A can be controlled by applying a predetermined voltage to the semiconductor region GP formed in the semiconductor substrate SB in the SOI region 1A.

It is not desired to form a photoresist pattern directly on the surface (the silicon surface) of the semiconductor layer SM or on the surface (the silicon surface) of the semiconductor substrate SB. In the present embodiment, the photoresist patterns PR1 and PR2 or a photoresist pattern PR3 described later are formed without exposing the semiconductor layer SM or the semiconductor substrate SB so that none of these photoresist patterns PR1, PR2, and PR3 come into contact with the surface (the silicon surface) of the semiconductor substrate SB or the surface (the silicon surface) of the semiconductor layer SM.

Figure 15:
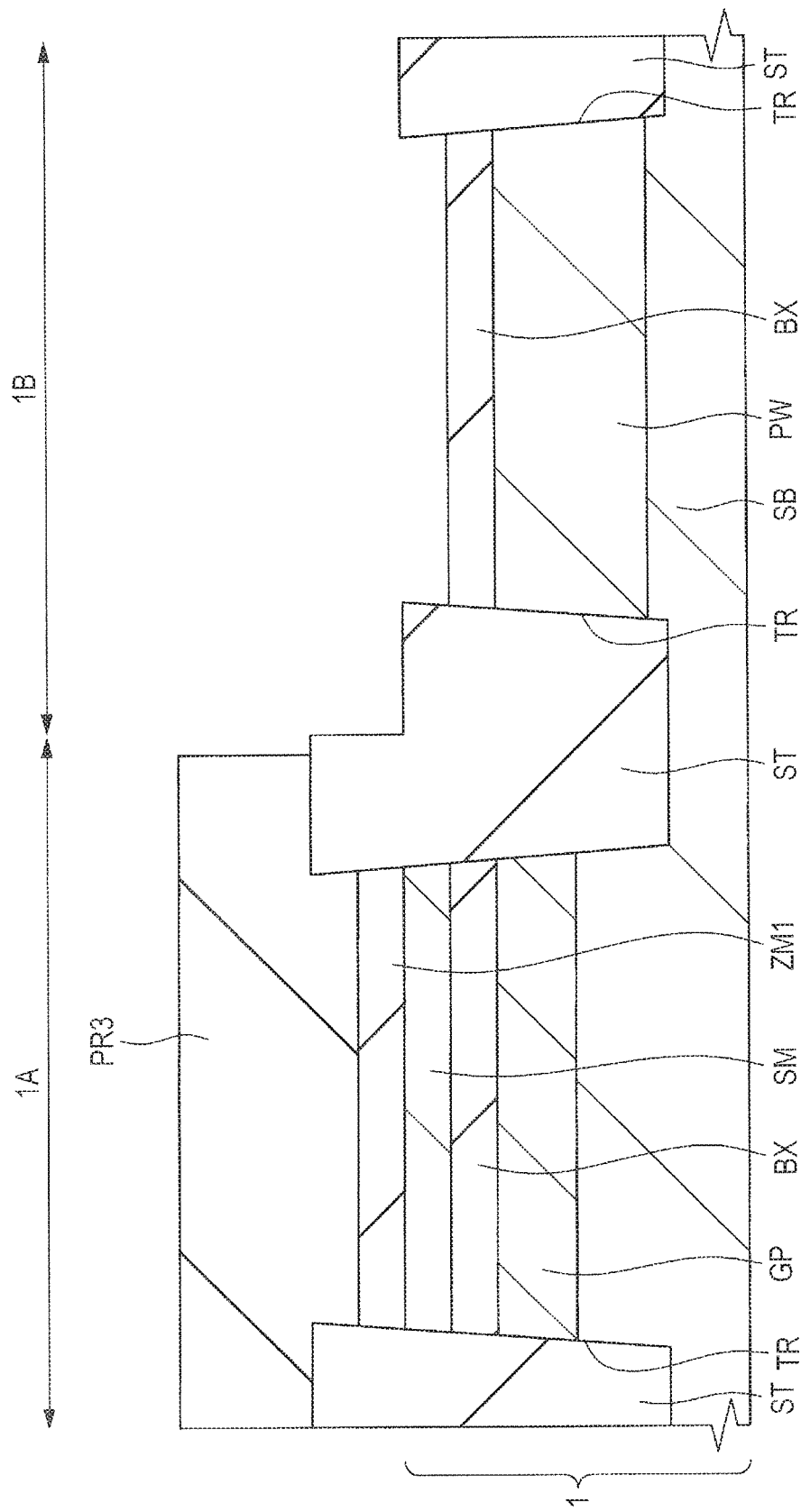
FIG. 15 is a fragmentary cross-sectional view of the semiconductor device during a manufacturing step following that shown in FIG. 14.

Next, as shown in FIG. 15, a photoresist pattern (resist pattern, mask layer) PR3 that covers the SOI region 1A and exposes the bulk region 1B is formed on the SOI substrate 1 as a mask layer by photolithography. The insulating film ZM1 in the SOI region 1A is covered with the photoresist pattern PR3 but the insulating layer BX in the bulk region 1B is exposed without being covered with the photoresist pattern PR3.

Next, with the photoresist pattern PR3 as a mask (ion implantation inhibiting mask), a p type impurity (for example, boron) is ion-implanted into the semiconductor substrate SB in the bulk region 1B to form a p well (a p type semiconductor region) PW (Step S13 of FIG. 2). This ion implantation will hereinafter be called "ion implantation of Step S13". The p well PW is a p type semiconductor region having a p type impurity introduced therein.

Figure 16:
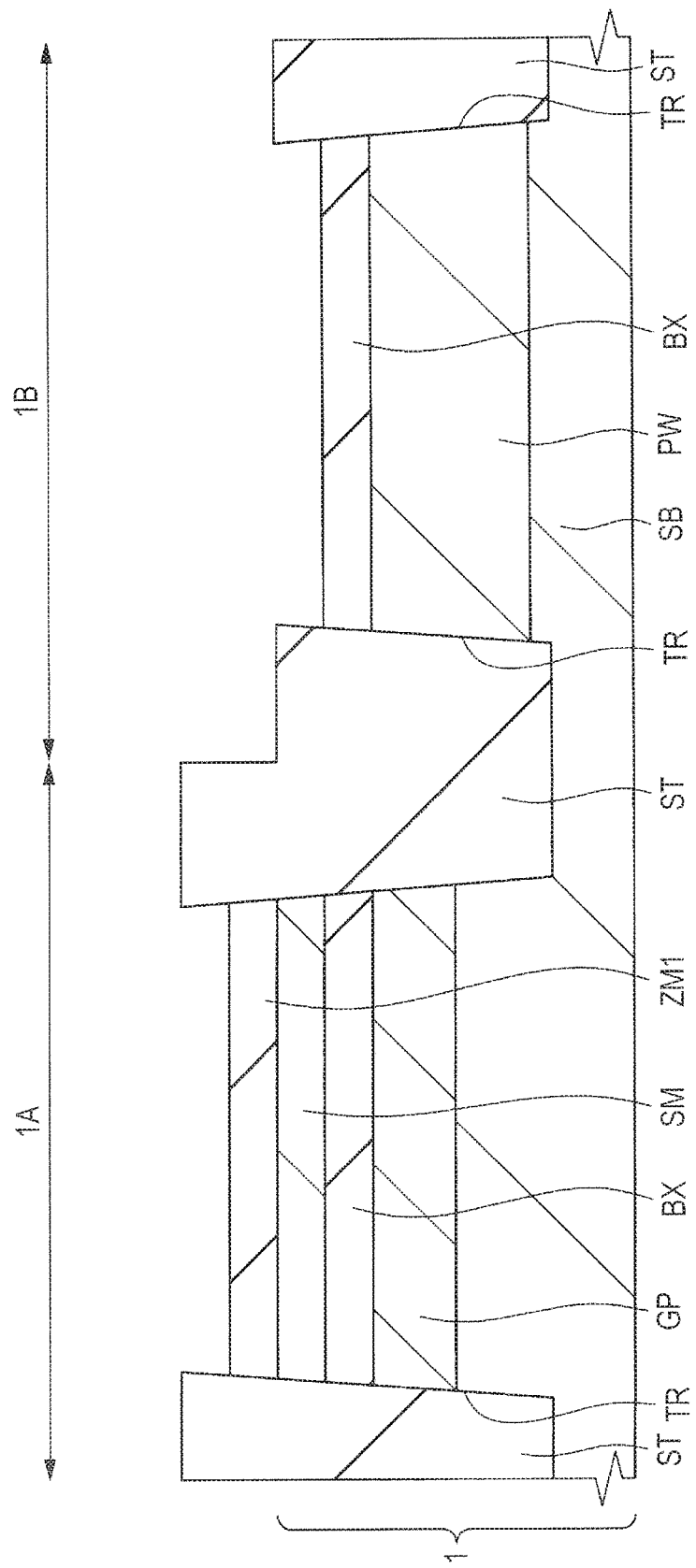
FIG. 16 is a fragmentary cross-sectional view of the semiconductor device during a manufacturing step following that shown in FIG. 15.

In the ion implantation of Step S13, the photoresist pattern PR3 functions as an ion implantation inhibiting mask so that the impurity is not introduced into the SOI region 1A of the SOI substrate 1. The p well PW is formed in the semiconductor substrate SB in the bulk region 1B. After the ion implantation of Step S13, the photoresist pattern PR3 is removed as shown in FIG. 16.

Before or after the ion implantation for forming the p well PW, channel dope ion implantation may be performed into the semiconductor substrate SB in the bulk region 1B with the photoresist pattern PR3 as a mask. In the above description, Step S12 is followed by Step S13, but the order of Step S12 and Step S13 can be reversed as another mode.

Even after Steps S12 and S13 are finished, the insulating film ZM1 remains in layer form in the SOI region 1A and the upper surface of the insulating film ZM1 is still exposed. In the bulk region 1B, the insulating layer BX remains in layer form and the upper surface of the insulating layer BX is still exposed. In the SOI region 1A, the semiconductor layer SM is not exposed, while in the bulk region 1B, the semiconductor substrate SB is not exposed.

Figure 17:
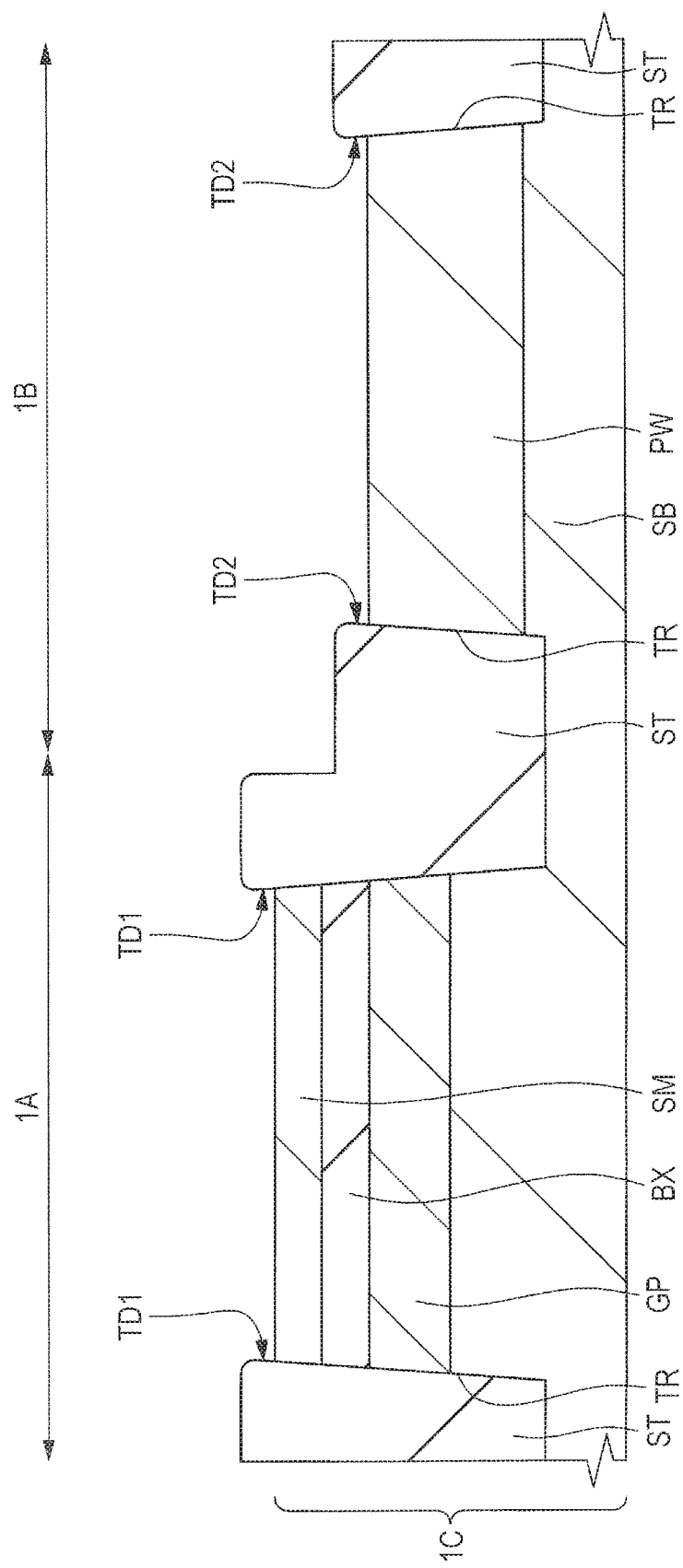
FIG. 17 is a fragmentary cross-sectional view of the semiconductor device during a manufacturing step following that shown in FIG. 16.

Next, as shown in FIG. 17, the insulating film ZM1 is removed from the SOI region 1A and the insulating layer BX is removed from the bulk region 1B, each by etching (Step S14 of FIG. 2). As the etching of Step S14, wet etching is preferred.

In Step S14, it is preferred to remove, by etching, the insulating film ZM1 in the SOI region 1A and the insulating layer BX in the bulk region 1B under conditions where the semiconductor layer SM and the semiconductor substrate SB are more etch-resistant than the insulating film ZM1 and the insulating layer BX. In other words, in Step S14, it is preferred to perform etching under conditions where the etching rate of the semiconductor layer SM and the etching rate of the semiconductor substrate SB become smaller than the etching rate of the insulating film ZM1 and the etching rate of the insulating layer BX. This makes it possible to remove the insulating film ZM1 in the SOI region 1A and the insulating layer BX in the bulk region 1B by etching and at the same time, allow the semiconductor layer SM in the SOI region 1A and the semiconductor substrate SB in the bulk region 1B as an etching stopper to suppress or prevent the semiconductor layer SM in the SOI region 1A and the semiconductor substrate SB in the bulk region 1B from being etched. When the insulating film ZM1 and the insulating layer BX are each made of silicon oxide, hydrofluoric acid is preferably used as an etchant in Step S14.

Since the etching of Step S14 is performed while exposing the upper surface of the element isolation portion ST, the upper surface of the insulating film ZM1 in the SOI region 1A, and the upper surface of the insulating layer BX in the bulk region 1B, the surface layer portion of the element isolation portion ST, the insulating film ZM1 in the SOI region 1A, and the insulating layer BX in the bulk region 1B are removed by etching in Step S14. The etching of Step S14 is finished at the stage when the insulating film ZM1 in the SOI region 1A is removed to expose the upper surface of the semiconductor layer SM and at the same time, the insulating layer BX is removed from the bulk region 1B to expose the upper surface of the semiconductor substrate SB. In Step S14, the element isolation portion ST is also etched and the etching thickness (etching amount) of it is on the same level as that of the insulating film ZM1 in the SOI region 1A or the insulating layer BX in the bulk region 1B.

Just after completion of Step S14, as shown in FIG. 17, the insulating film ZM1 is removed and the upper surface of the semiconductor layer SM is exposed in the SOI region 1A, while the insulating layer BX is removed and the upper surface of the semiconductor substrate SB (the p well PW) is exposed in the bulk region 1B. In Step S14, it is preferred to use not dry etching but wet etching. When the wet etching is used, the semiconductor layer SM and the semiconductor substrate SB can be prevented from being damaged even if this etching is performed until exposure of the semiconductor layer SM and the semiconductor substrate SB.

In such a manner, the element isolation portion ST is formed in the SOI substrate 1; the semiconductor layer SM and the insulating layer BX are removed to expose the upper surface of the semiconductor substrate SB (the SOI structure is lost) in the bulk region 1B; and the semiconductor layer SM and the insulating layer BX remain and the SOI structure is maintained in the SOI region 1A. The SOI substrate 1 at this stage will hereinafter be called "substrate 1C". In the following description, the term "main surface of the substrate 1C" has the same meaning as the main surface of the semiconductor layer SM in the SOI region 1A and the main surface of the semiconductor substrate SB in the bulk region 1B.

The substrate 1C has the SOI region 1A and the bulk region 1B. The SOI region 1A can be regarded as a region having an SOI structure having the insulating layer BX buried therein and the bulk region 1B can be regarded as a region not having an SOI structure because it has no insulating layer BX buried therein. More specifically, the SOI region 1A of the substrate 1C has a region having a stacked structure (SOI structure) of the semiconductor substrate SB, the insulating layer BX stacked on the semiconductor substrate SB, and the semiconductor layer SM stacked on the insulating layer BX. The bulk region 1B of the substrate 1C is a region whose total thickness is comprised of the semiconductor substrate SB. The SOI region 1A and the bulk region 1B also include a region having the element isolation portion ST therein. In the bulk region 1B, a portion of the element isolation portion ST (a portion that was present below the lower surface of the insulating layer BX) remains while being buried in the semiconductor substrate SB after removal of the semiconductor layer SM and the insulating layer BX and this portion becomes the element isolation portion ST in the bulk region 1B.

At this stage, the height position of the upper surface of the element isolation portion ST adjacent to the semiconductor layer SM in the SOI region 1A is preferably adjusted so as not to be lower than the upper surface of the semiconductor layer SM in the SOI region 1A. The height position of the upper surface of the element isolation portion ST adjacent to the semiconductor substrate SB in the bulk region 1B is preferably adjusted so as not to be lower than the upper surface of the insulating layer BX in the bulk region 1B. At this stage, therefore, the height position of the upper surface of the element isolation portion ST adjacent to the semiconductor layer SM in the SOI region 1A is almost equal to that of the upper surface of the semiconductor layer SM in the SOI region 1A or higher than the upper surface of the semiconductor layer SM in the SOI region 1A. It is more preferably higher than the upper surface of the semiconductor layer SM. The height position of the upper surface of the element isolation portion ST adjacent to the semiconductor substrate SB in the bulk region 1B is almost equal to that of the upper surface of the semiconductor substrate SB in the bulk region 1B or higher than the upper surface of the semiconductor substrate SB in the bulk region 1B. It is more preferably higher than the upper surface of the semiconductor substrate SB in the bulk region 1B. In the present embodiment, however, since the etching thickness of the element isolation portion ST in Step S9 is increased, a difference in height (meaning an isolation-portion step difference TD2) between the upper surface of the element isolation portion ST adjacent to the semiconductor substrate SB and the upper surface of the semiconductor substrate SB in the bulk region 1B just after completion of Step S14 can be reduced.

Next, a semiconductor element such as MISFET (transistor) is formed both in the SOI region 1A and the bulk region 1B (Step S15 of FIG. 2).

In the SOI region 1A of the substrate 1C, the semiconductor layer SM is divided into a plurality of regions (active regions) surrounded by the element isolation portion ST in plan view and the MISFET is formed on the semiconductor layer SM in each of the active regions. In the SOI region 1A of the substrate 1C, the semiconductor layer SM in each of the active regions is surrounded at the periphery thereof with the element isolation portion ST in plan view and the lower surface is adjacent to the insulating layer BX. The semiconductor layer SM in each of the active regions is surrounded with the element isolation portion ST and the insulating layer BX. In the bulk region 1B of the substrate 1C, the semiconductor substrate SB is divided into a plurality of regions (active regions) surrounded by the element isolation portion ST in plan view and the MISFET is formed on the semiconductor substrate SB in each of the active regions. In the bulk region 1B of the substrate 1C, each of the active regions is surrounded at the periphery thereof with the element isolation portion ST in plan view.

One example of Step S15 will hereinafter be described below.

Figure 18:
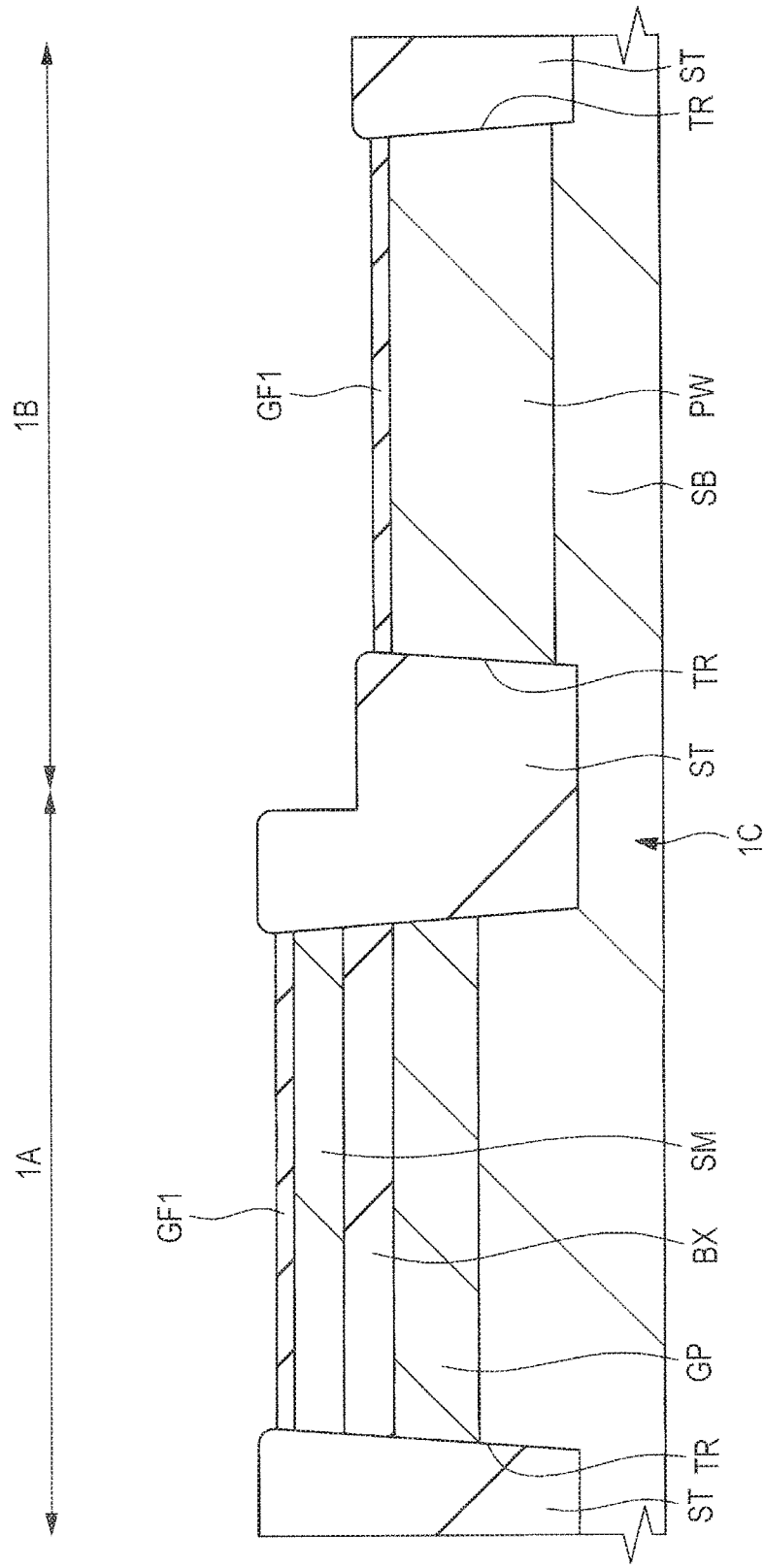
FIG. 18 is a fragmentary cross-sectional view of the semiconductor device during a manufacturing step following that shown in FIG. 17.

First, as shown in FIG. 18, a gate insulating film GF1 is formed on the upper surface of the semiconductor layer SM in the SOI region 1A and on the upper surface of the semiconductor substrate SB in the bulk region 1B. The gate insulating film GF1 is made of a silicon oxide film or the like and can be formed by thermal oxidation or the like.

Figure 19:
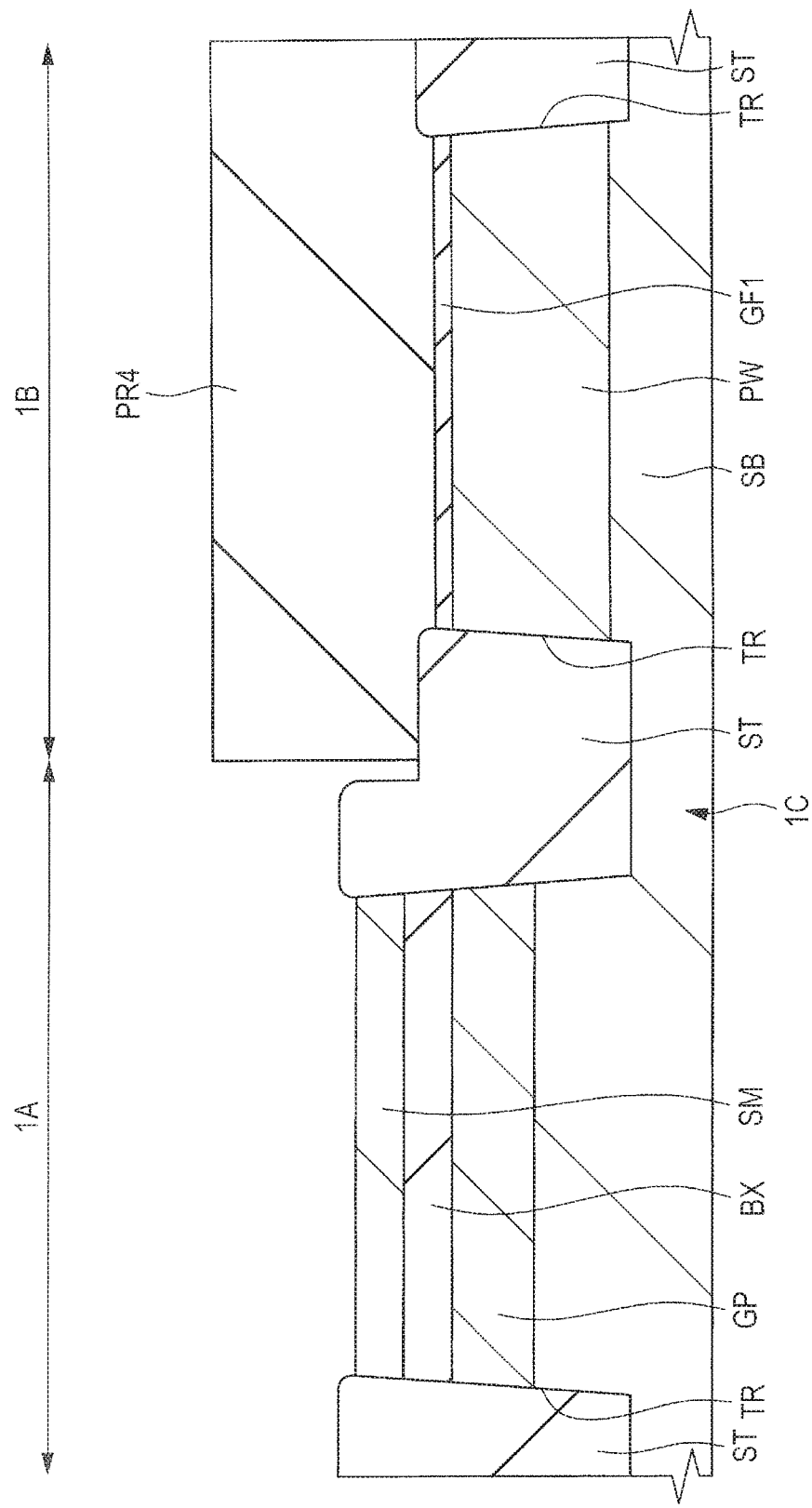
FIG. 19 is a fragmentary cross-sectional view of the semiconductor device during a manufacturing step following that shown in FIG. 18.

Next as shown in FIG. 19, a photoresist pattern PR4 that covers the gate insulating film GF1 in the bulk region 1B and exposes the gate insulating film GF1 in the SOI region 1A is formed on the SOI substrate 1 by photolithography. Then, with this photoresist pattern PR4 as an etching mask, the gate insulating film GF1 in the SOI region 1A is removed by etching. At this time, the gate insulating film GF1 in the bulk region 1B remains without being etched because it is covered with the photoresist pattern PR4. FIG. 19 shows this stage. Then, the photoresist pattern PR4 is removed.

Figure 20:
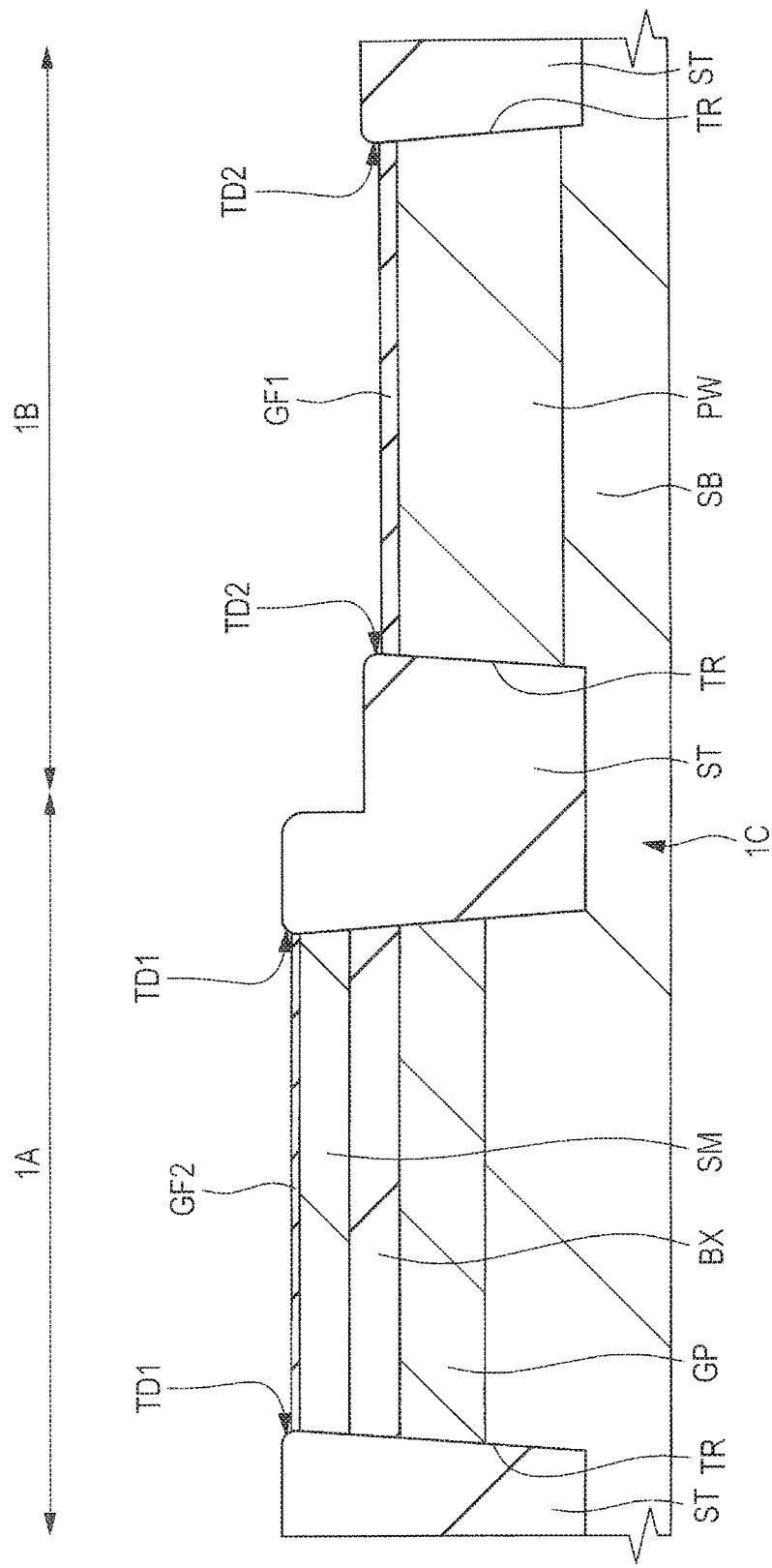
FIG. 20 is a fragmentary cross-sectional view of the semiconductor device during a manufacturing step following that shown in FIG. 19.

Next, as shown in FIG. 20, a gate insulating film GF2 is formed on the upper surface of the semiconductor layer SM in the SOI region 1A. The gate insulating film GF2 is made of a silicon oxide film or the like and can be formed by thermal oxidation or the like. During the thermal oxidation treatment for the formation of the gate insulating film GF2, the gate insulating film GF1 in the bulk region 1B may become thick.

In such a manner, the semiconductor layer SM in the SOI region 1A has the gate insulating film GF2 on the upper surface thereof and the semiconductor substrate SB in the bulk region 1B has the gate insulating film GF1 on the upper surface thereof. At this stage, the gate insulating film GF1 is thicker than the gate insulating film GF2. The gate insulating films GF1 and GF2 are not formed on the element isolation portion ST. The gate insulating film GF2 formed on the semiconductor layer SM in the SOI region 1A is an insulating film for gate insulating film of a MISFET (first transistor) to be formed in the SOI region 1A and the gate insulating film GF1 formed on the semiconductor substrate SB in the bulk region 1B is an insulating film for gate insulating film of a MISFET (second transistor) to be formed in the bulk region 1B.

Figure 21:
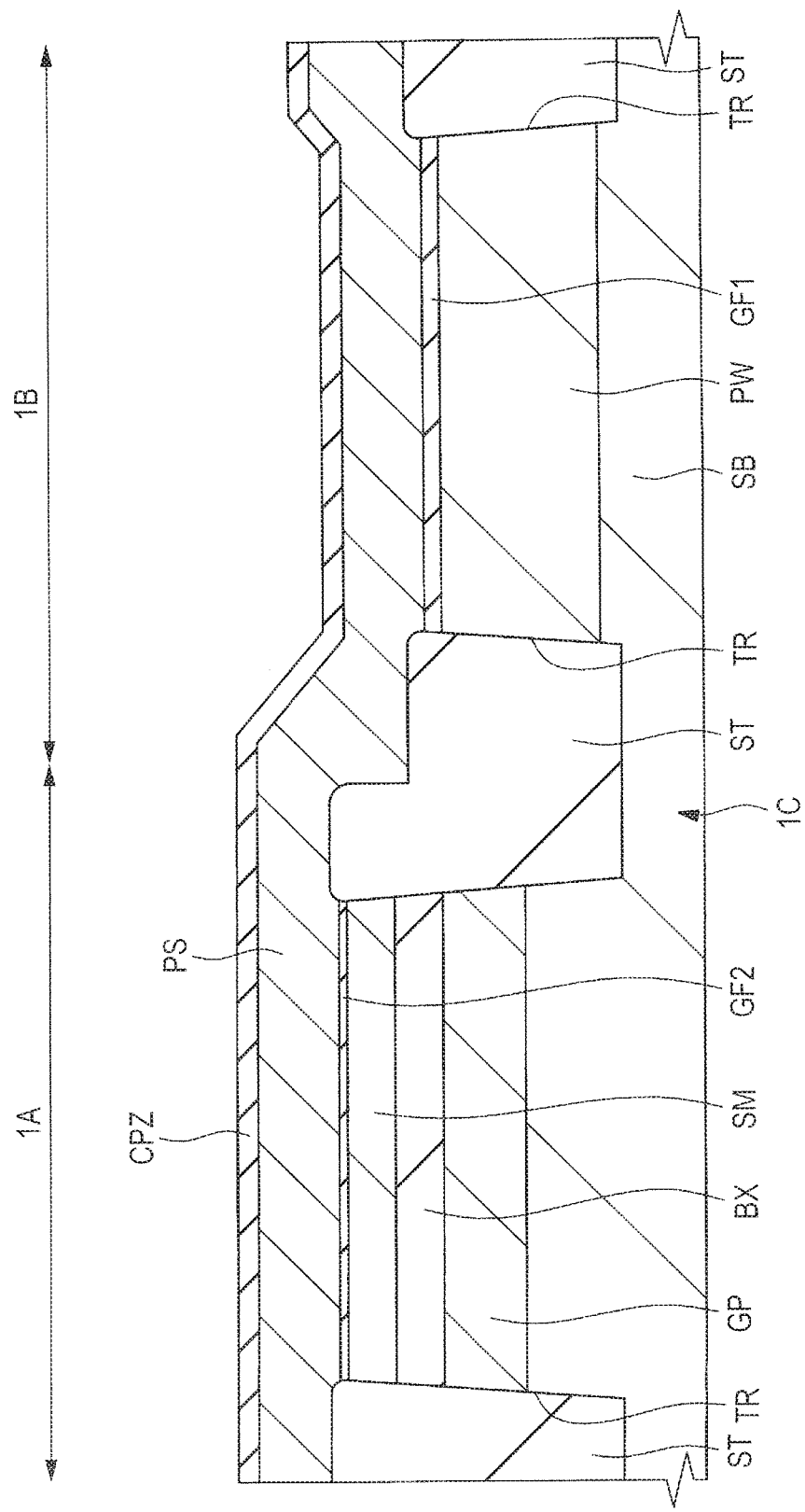
FIG. 21 is a fragmentary cross-sectional view of the semiconductor device during a manufacturing step following that shown in FIG. 20.

Next, as shown in FIG. 21, after forming a silicon film PS such as a doped polysilicon film as a conductive film for gate electrode formation on the main surface of the substrate 1C, that is, on the gate insulating films GF1 and GF2 and the element isolation portion ST, an insulating film CPZ such as a silicon nitride film is formed on the silicon film PS. Then, as shown in FIG. 22, the insulating film CPZ is patterned by photolithography and dry etching and with the patterned insulating film CPZ as an etching mask, the silicon film PS is patterned by a dry etching.

Figure 22:
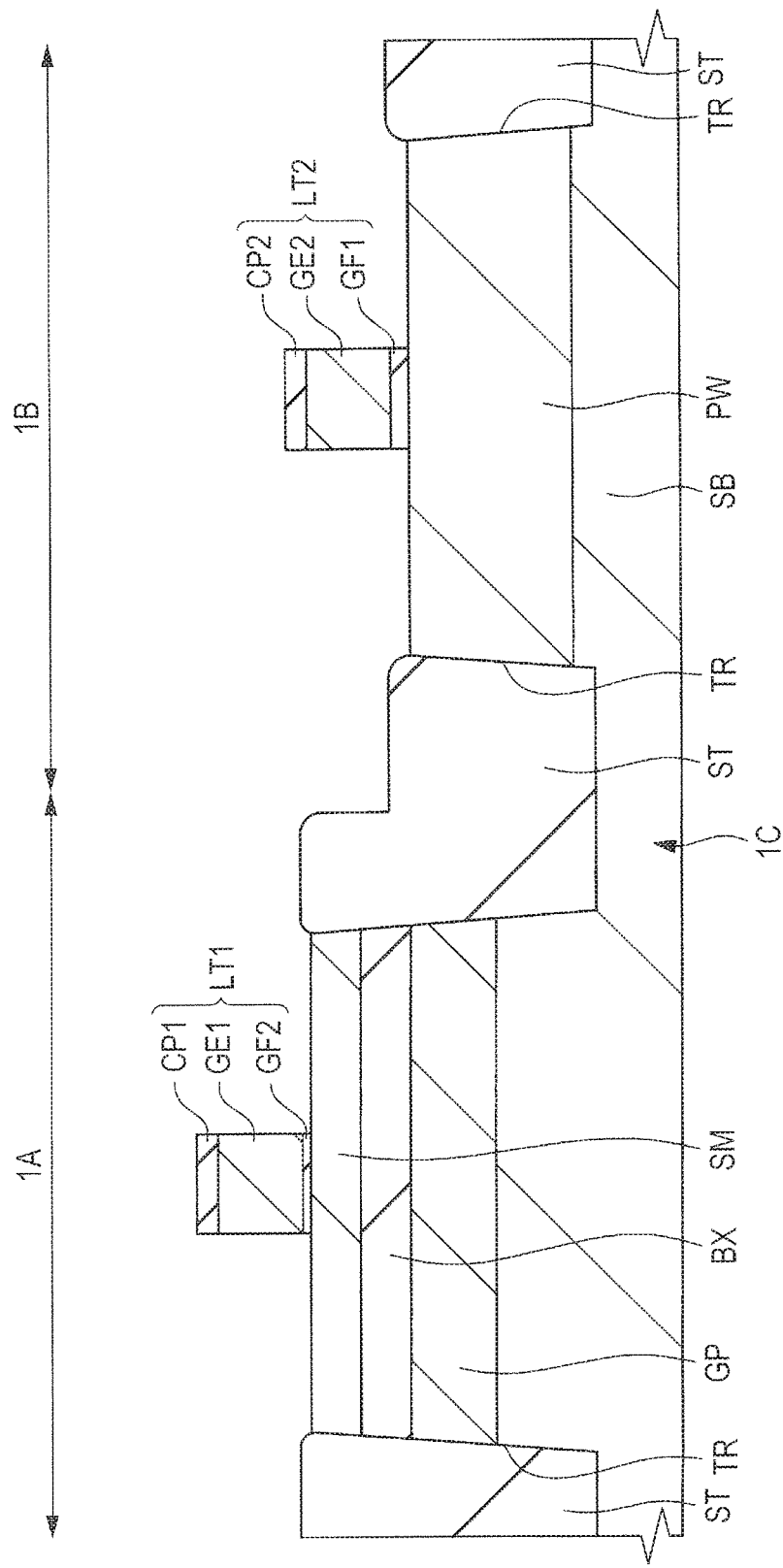
FIG. 22 is a fragmentary cross-sectional view of the semiconductor device during a manufacturing step following that shown in FIG. 21.

As shown in FIG. 22, gate electrodes GE1 and GE2 are formed using the patterned silicon film PS. The gate electrode GE1 is formed on the semiconductor layer SM in the SOI region 1A via the gate insulating film GF2. The gate electrode GE2 is formed on the semiconductor substrate SB (the p well PW) in the bulk region 1B via the gate insulating film GF1. A cap insulating film CP1 made of the patterned insulating film CPZ is formed on the gate electrode GE1 and a cap insulating film CP2 made of the patterned insulating film CPZ is formed on the gate electrode GE2. The cap insulating film CP1 has a planar shape almost similar to that of the gate electrode GE1 and the cap insulating film CP2 has a planar shape almost similar to that of the gate electrode GE2. Respective portions of the gate insulating films GF1 and GF2 not covered with the gate electrodes GE1 and GE2 can be etched by a dry etching performed upon pattering of the silicon film PS or wet etching performed thereafter.

A stacked structure of the gate insulating film GF2, the gate electrode GE1, and the cap insulating film CP1 formed in the SOI region 1A will hereinafter be called "stacked body LT1". A stacked structure of the gate insulating film GF1, the gate electrode GE2, and the cap insulating film CP2 formed in the bulk region 1B will hereinafter be called "stacked body LT2".

FIGS. 23 and 24 are each a fragmentary plan view showing the step stage same as that of FIG. 22 and FIG. 22 shows the SOI region 1A and FIG. 23 shows the bulk region 1B. As is apparent from FIGS. 22 and 23, each of the stacked bodies LT1 and LT2 (the gate electrodes GE1 and GE2) is, at both end portions thereof in the gate width direction, situated on the element isolation portion ST but neither of the stacked body LT1 nor the stacked body LT2 (the gate electrode GE1 nor the gate electrode GE2) reaches the step difference DS. In the bulk region 1B, a plurality of (for example, two) gate electrodes GE2 (stacked bodies LT2) may be arranged side by side on the same active region as shown later in FIG. 46. In the SOI region 1A, a plurality of (for example, two) gate electrodes GE1 (stacked bodies LT1) may be arranged side by side on the same active region.

A sidewall spacer SW1 is then formed on the side surface of the stacked body LT1 as a sidewall insulating film. The sidewall spacer SW1 formation step can be performed as follows.

Figure 25:
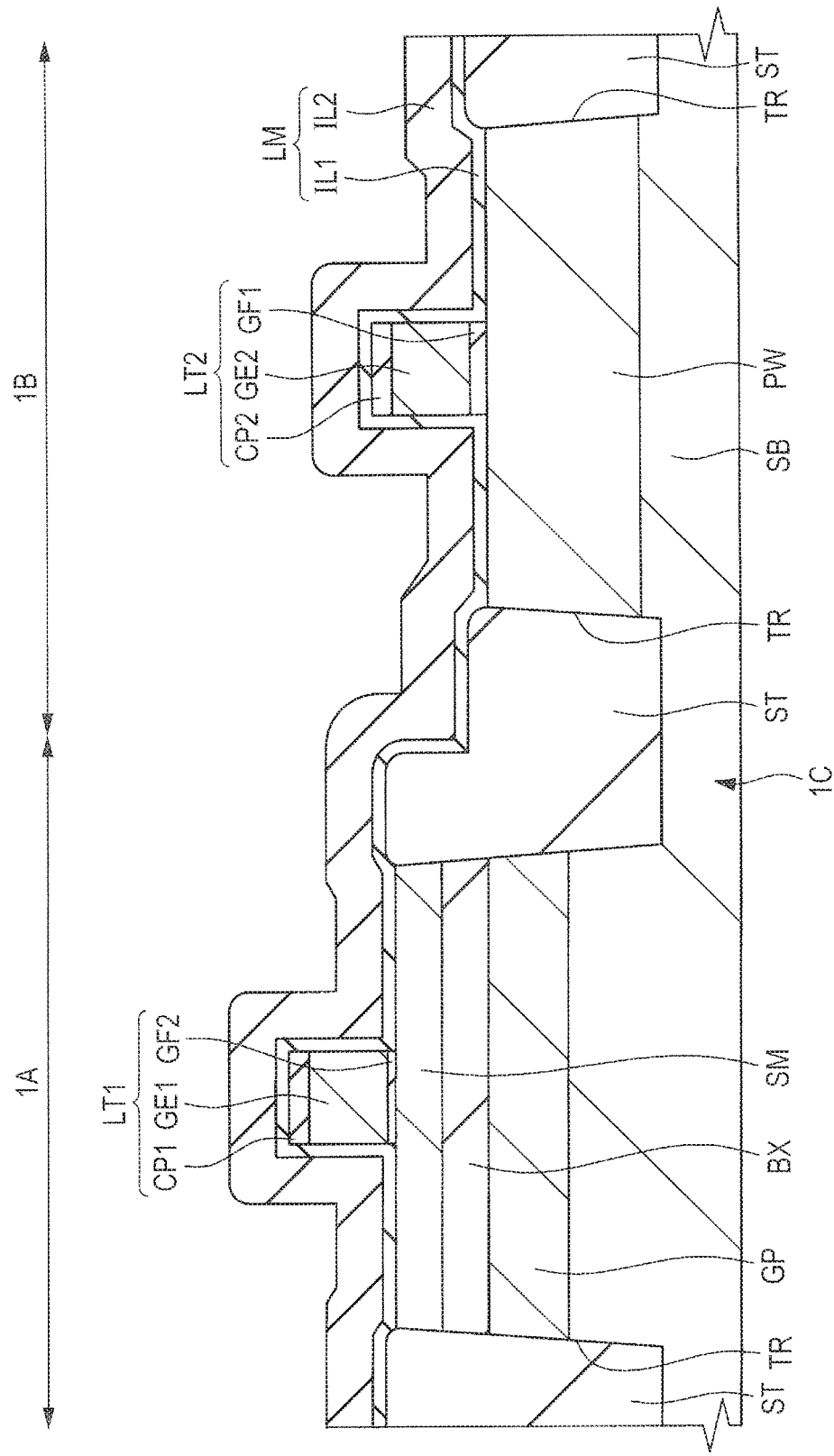
FIG. 25 is a fragmentary cross-sectional view of the semiconductor device during a manufacturing step following that shown in FIG. 22.
Figure 26:
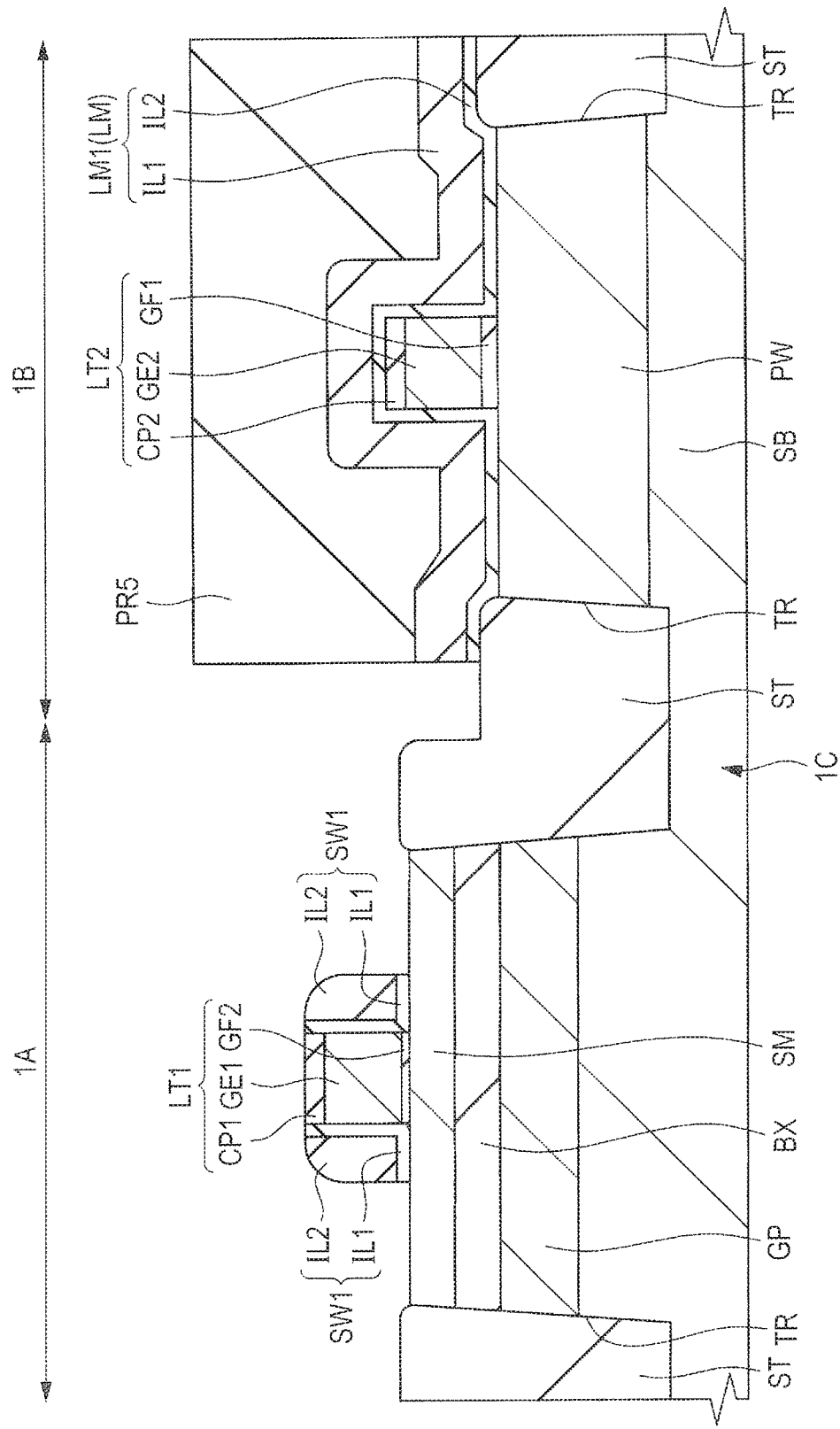
FIG. 26 is a fragmentary cross-sectional view of the semiconductor device during a manufacturing step following that shown in FIG. 25.

As shown in FIG. 25, a stacked film LM comprised of an insulating film IL1 and an insulating film IL2 thereon is formed on the entire main surface of the substrate 1C so as to cover the stacked bodies LT1 and LT2. The insulating film IL1 is made of, for example, a silicon oxide film and the insulating film IL2 is made of, for example, a silicon nitride film. Then, a photoresist pattern PR5 that covers the stacked film LM in the bulk region 1B and exposes the stacked film LM in the SOI region 1A is formed on the stacked film LM. By anisotropic etching, the stacked film LM is etched back to form a sidewall spacer SW1 on each of the side surfaces of the stacked body LT1. This stage is shown in FIG. 26. The stacked film LM in the bulk region 1B remains without being etched because it is covered with the photoresist pattern PR5. The stacked film LM remaining in the bulk region 1B will hereinafter be called "stacked film LM1". The photoresist pattern PR5 is then removed. The sidewall spacer SW1 is comprised of the insulating film IL1 extending on the semiconductor layer SM and then on the side surface of the stacked body LT1 continuously with almost uniform thickness and the insulating film IL2 separated from the semiconductor layer SM and the stacked body LT1 via the insulating film IL1.

Figure 27:
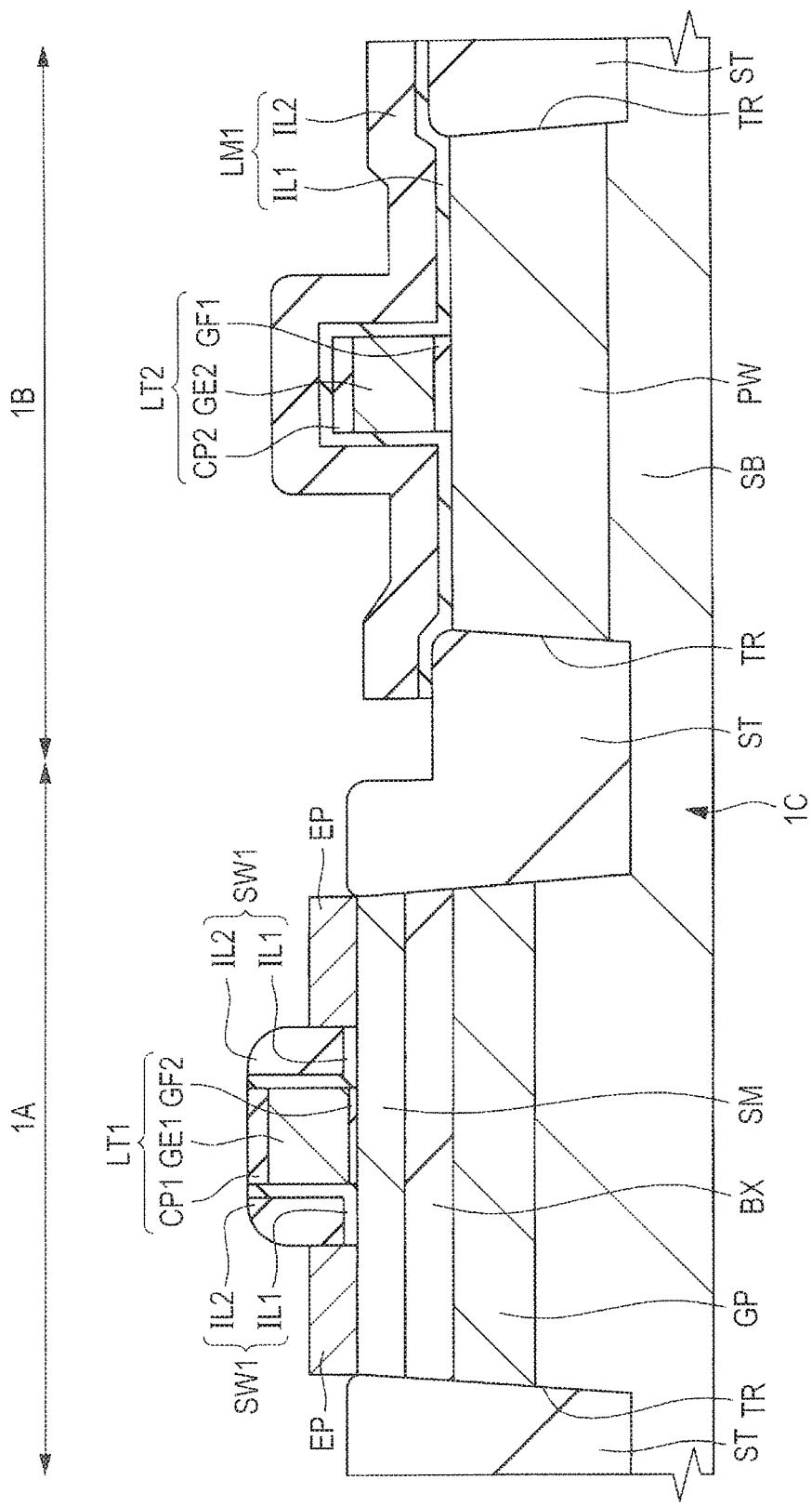
FIG. 27 is a fragmentary cross-sectional view of the semiconductor device during a manufacturing step following that shown in FIG. 26.

Next, as shown in FIG. 27, a semiconductor layer EP is formed on the semiconductor layer SM in the SOI region 1A by epitaxial growth. The semiconductor layer EP is made of, for example, single crystal silicon.

In order to form the semiconductor layer EP by epitaxial growth, an epitaxial layer (the semiconductor layer EP) selectively grows on the exposed surface of the semiconductor layer SM and no epitaxial layer grows on the insulating film. The semiconductor layer EP therefore selectively grows on a region (exposed surface) of the surface of the semiconductor layer SM in the SOI region 1A not covered with the stacked body LT1 and the sidewall spacer SW1. The semiconductor layer EP is, in the SOI region 1A, formed on both sides of a structure comprised of the stacked body LT1 and the sidewall spacers SW1. An epitaxial layer (the semiconductor layer EP) is not formed in the bulk region 1B because the semiconductor substrate SB is covered with the stacked film LM1.

The semiconductor layer SM and the semiconductor layer EP formed on the semiconductor layer SM in the SOI region 1A will hereinafter be collectively called "semiconductor layer SM1".

Figure 28:
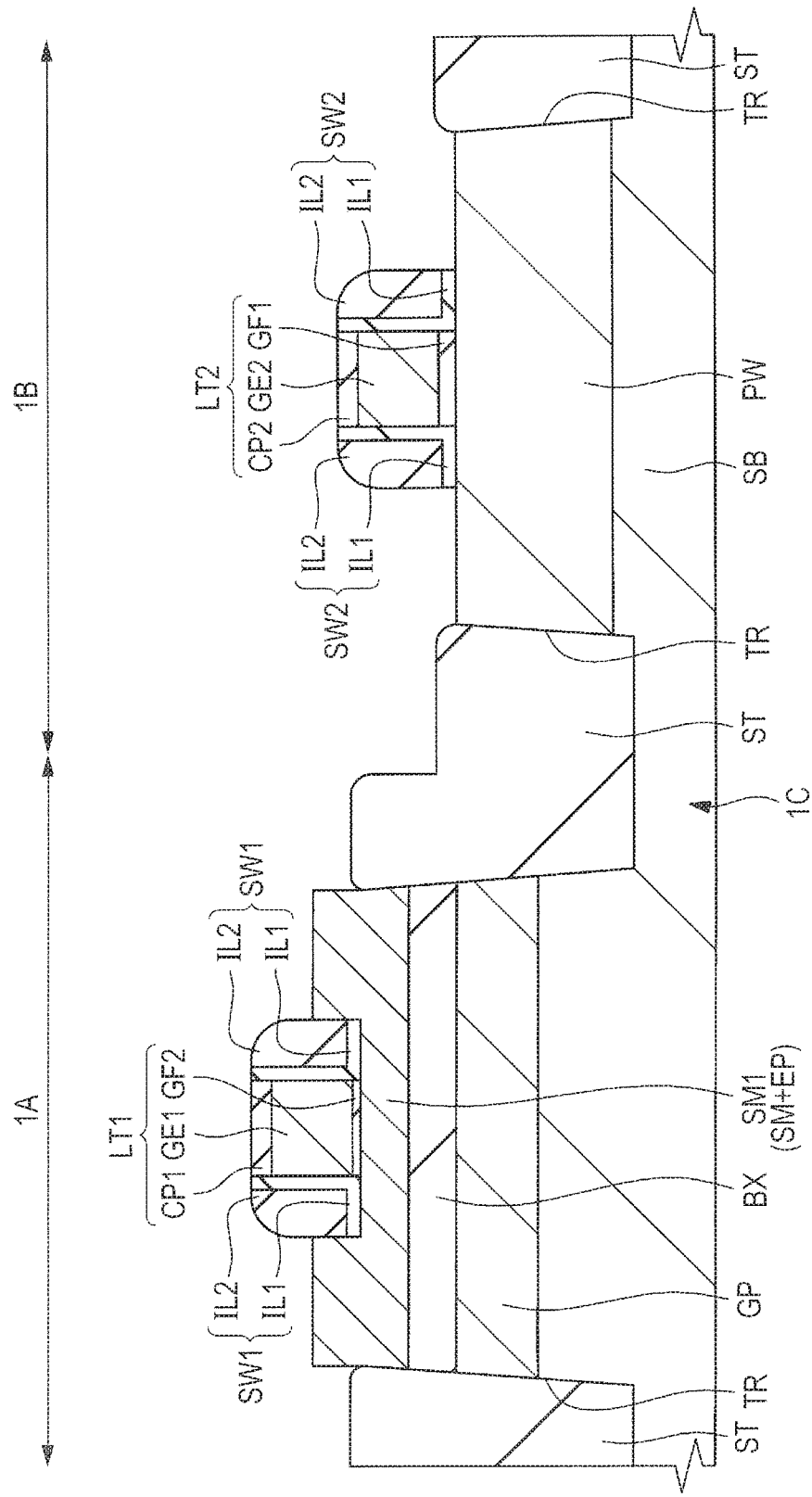
FIG. 28 is a fragmentary cross-sectional view of the semiconductor device during a manufacturing step following that shown in FIG. 27.

Next, as shown in FIG. 28, after formation of a photoresist pattern (not illustrated) that covers the SOI region 1A and expose the bulk region 1B, the stacked film LM1 in the bulk region 1B is etched back by anisotropic etching to form a sidewall spacer SW2 on both side surfaces of the stacked body LT2. The stacked body LT1 and the sidewall spacer SW1 in the SOI region 1A remains without being etched because they are covered with a photoresist pattern. Then, the photoresist pattern is removed. FIG. 28 shows a stage after removal of the photoresist pattern. The sidewall spacer SW2 has a configuration essentially equal to that of sidewall spacer SW1.

Figure 29:
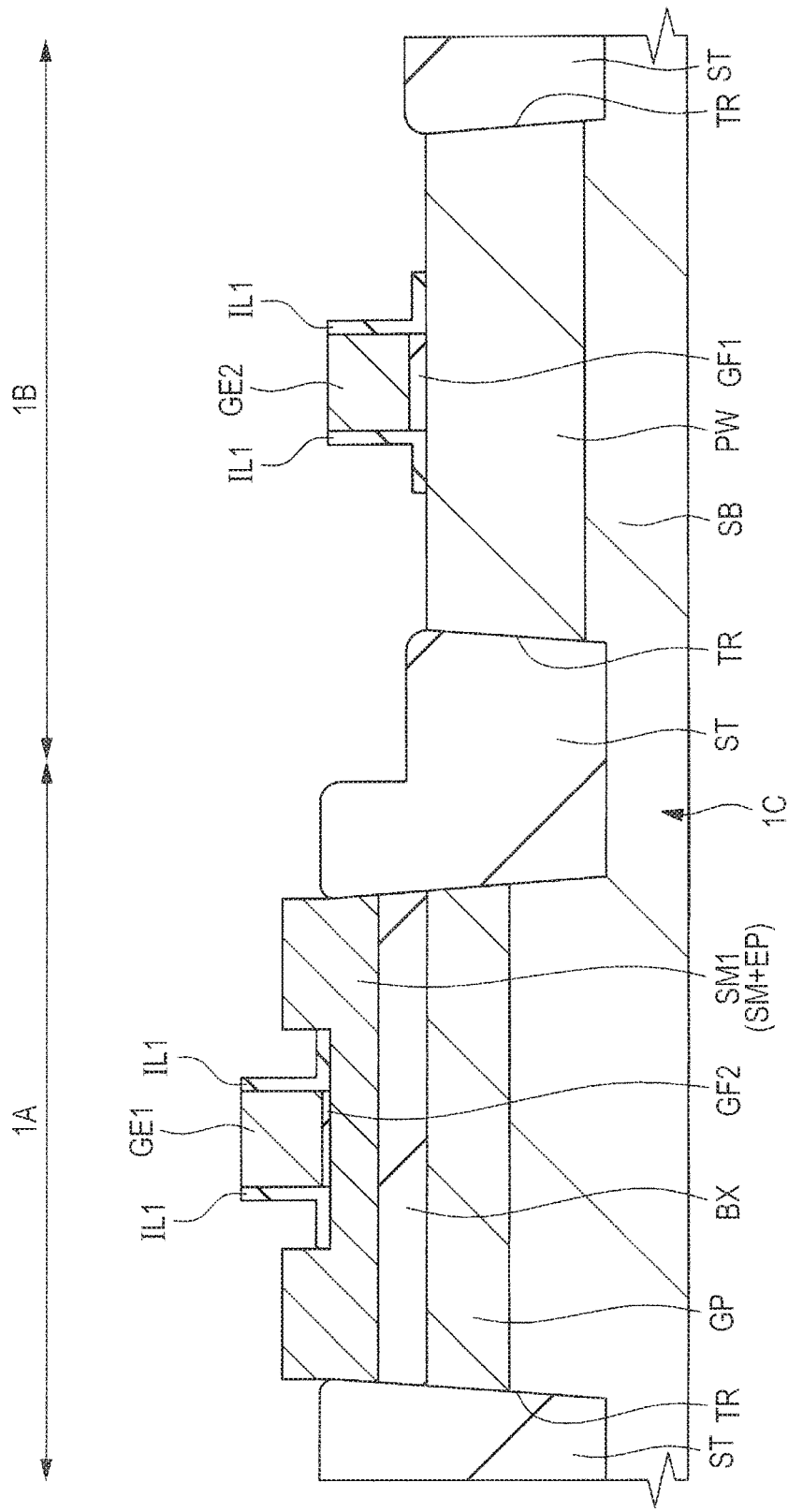
FIG. 29 is a fragmentary cross-sectional view of the semiconductor device during a manufacturing step following that shown in FIG. 28.

Next, as shown in FIG. 29, the insulating film IL2 configuring the sidewall spacers SW1 and SW2 is removed by etching. At this time, since the insulating film IL2 is removed by etching under conditions where the insulating film IL1 is more etch-resistant to the insulating film IL2, the insulating film IL1 configuring the sidewall spacers SW1 and SW2 almost remains without being etched. The insulating film IL2 is made of a material same as that of the cap insulating films CP1 and CP2. By this etching, therefore, the cap insulating films CP1 and CP2 can also be removed.

Figure 30:
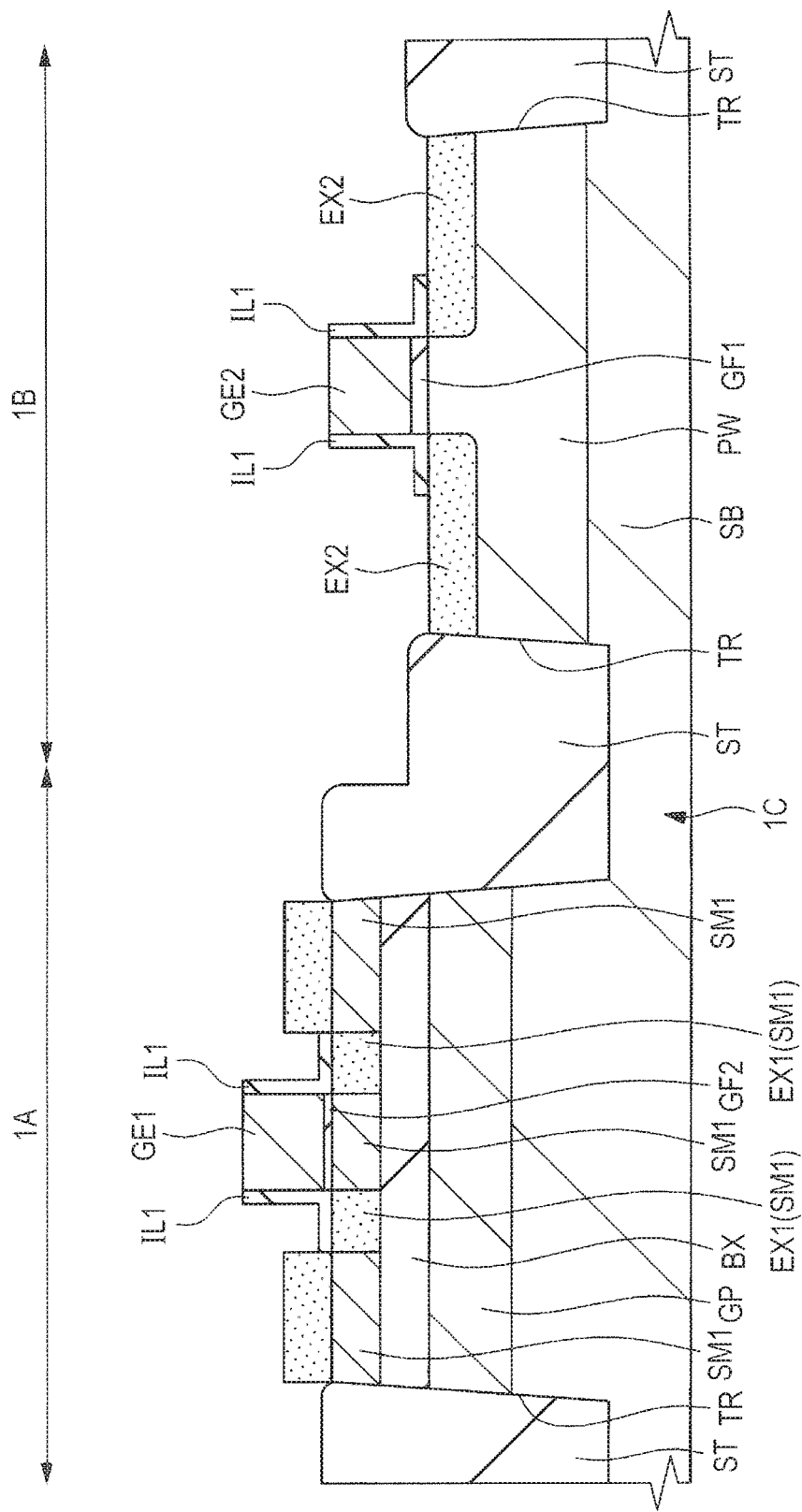
FIG. 30 is a fragmentary cross-sectional view of the semiconductor device during a manufacturing step following that shown in FIG. 29.

As shown in FIG. 30, an $n^-$ type semiconductor region (extension region) EX1 is formed by the ion implantation of an n type impurity such as phosphorus (P) or arsenic (As) into a region, on both sides of the gate electrode GE1, in the semiconductor layer SM1 in the SOI region 1A. In addition, an $n^-$ type semiconductor region (extension region) EX2 is formed by the ion implantation of an n type impurity such as phosphorus (P) or arsenic (As) into a region, on both sides of the gate electrode GE2, in the semiconductor substrate SB (the p well PW) in the bulk region 1B. FIG. 30 shows the region, into which the impurity has been implanted by the ion implantation, as a dotted region.

During the ion implantation for forming the $n^-$ type semiconductor region EX1, the gate electrode GE1 and a portion of the insulating film IL1 extending on the side surface of the gate electrode can function as an ion implantation inhibiting mask. During the ion implantation for forming the $n^-$ type semiconductor region EX2, the gate electrode GE2 and a portion of the insulating film IL1 extending on the side surface of the gate electrode GE2 can function as an ion implantation inhibiting mask. The $n^-$ type semiconductor region EX1 and the $n^-$ type semiconductor region EX2 may be formed by the same ion implantation step or different ion implantation steps.

Figure 31:
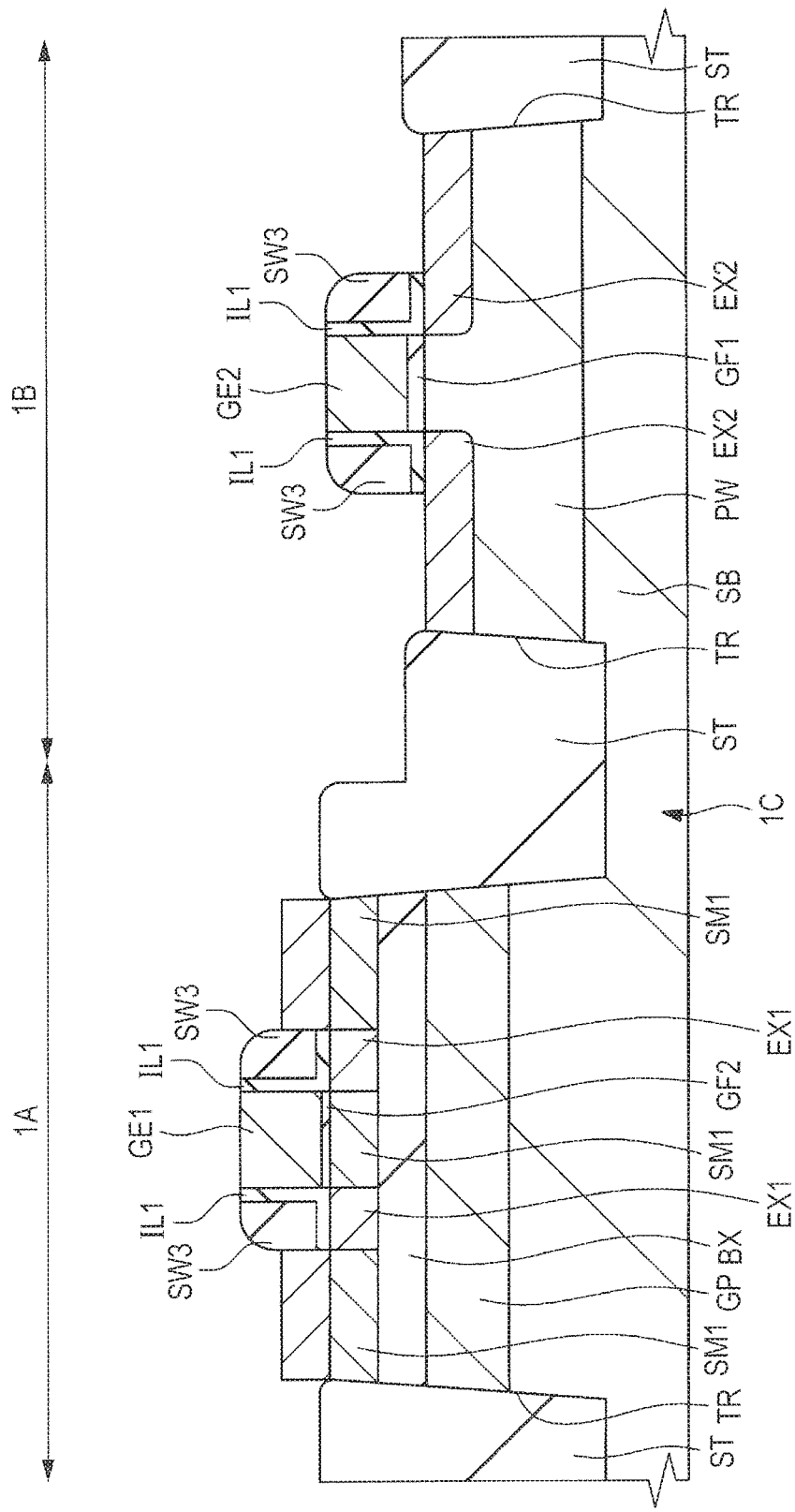
FIG. 31 is a fragmentary cross-sectional view of the semiconductor device during a manufacturing step following that shown in FIG. 30.

Next, as shown in FIG. 31, a sidewall spacer SW3 is formed, as a sidewall insulating film, on the side surface of each of the gate electrodes GE1 and GE2. The sidewall spacer SW3 formation step can be carried out as follows.

Described specifically, after formation of an insulating film (for example, a silicon nitride film) for forming the sidewall spacer SW3 on the main surface of the substrate 1C so as to cover the gate electrodes GE1 and GE2 and the insulating film IL1, the resulting insulating film is etched back by anisotropic etching to form the sidewall spacer SW3 on the side surface of each of the gate electrodes GE1 and GE2. In the SOI region 1A, the sidewall spacer SW3 is formed on the side surface of the gate electrode GE1 via the insulating film IL1, while in the bulk region 1B, the sidewall spacer SW3 is formed on the side surface of the gate electrode GE2 via the insulating film IL1.

Figure 32:
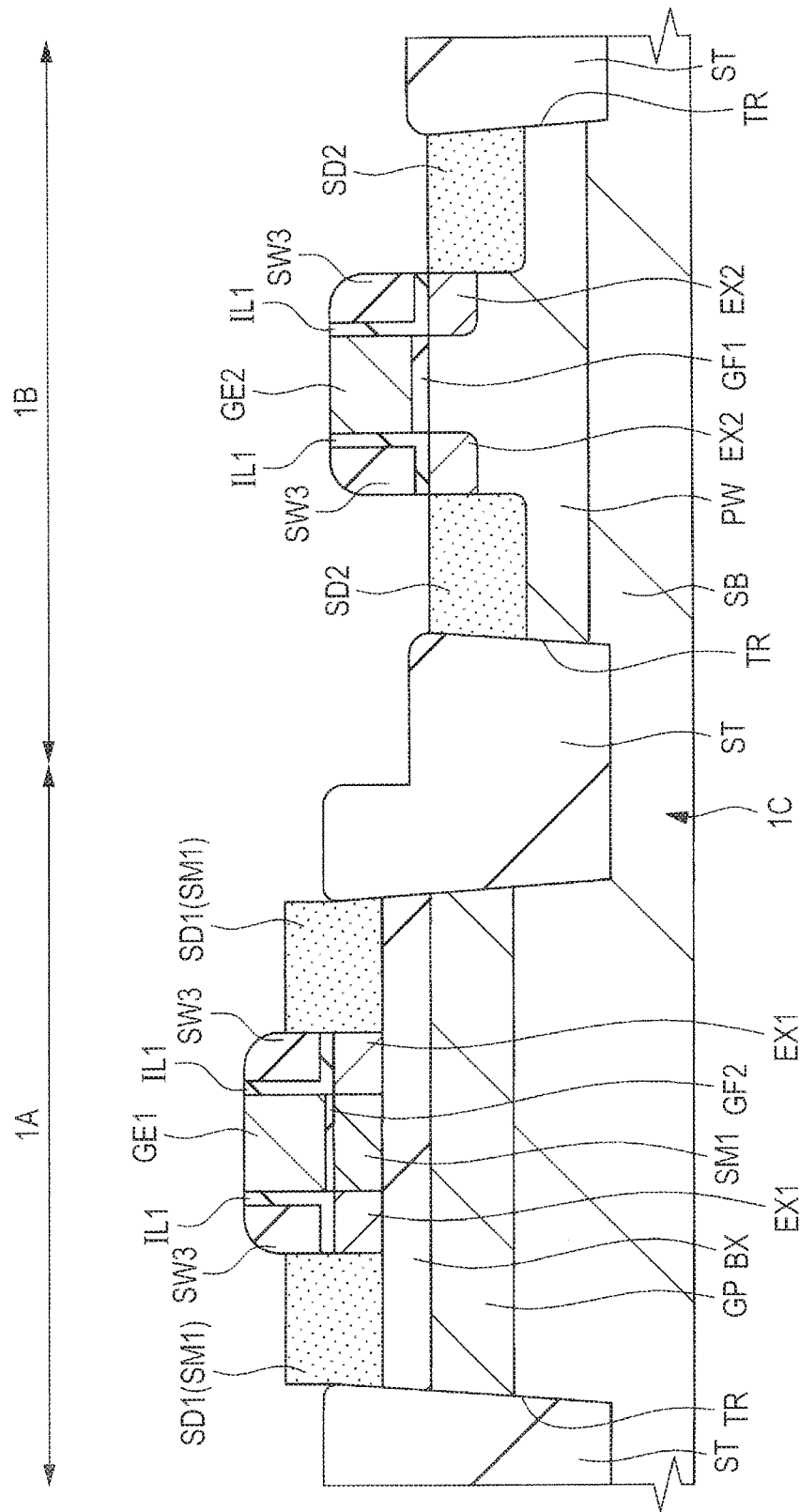
FIG. 32 is a fragmentary cross-sectional view of the semiconductor device during a manufacturing step following that shown in FIG. 31.

Next, as shown in FIG. 32, an $n^+$ type semiconductor region (source/drain region) SD1 is formed by the ion implantation of an n type impurity such as phosphorus (P) or arsenic (As) into a region, on both sides of the gate electrode GE1 and the sidewall spacer SW3, in the semiconductor layer SM1 in the SOI region 1A. In addition, an $n^+$ type semiconductor region (a source/drain region) SD2 is formed by the ion implantation of an n type impurity such as phosphorus (P) or arsenic (As) into a region, on both sides of the gate electrode GE2 and the sidewall spacer SW3, in the semiconductor substrate SB (the p well PW) in the bulk region 1B. FIG. 32 shows the region having the impurity implanted therein by the above ion implantation as a dotted region.

During the ion implantation for forming the $n^+$ type semiconductor region SD1, the gate electrode GE1 and the sidewall spacer SW3 on both sides thereof can function as an ion implantation inhibiting mask. During ion implantation for forming the $n^+$ type semiconductor region SD2, the gate electrode GE2 and the sidewall spacer SW3 on both sides thereof can function as an ion implantation inhibiting mask. The $n^+$ type semiconductor region SD1 has an impurity concentration higher than that of the $n^-$ type semiconductor region EX1 and the $n^+$ type semiconductor region SD2 has an impurity concentration higher than that of the $n^-$ type semiconductor region EX2. The $n^+$ type semiconductor region SD1 and the $n^+$ type semiconductor region SD2 may be formed by the same ion implantation step or different ion implantation steps.

In the semiconductor layer SM1 in the SOI region 1A, the $n^-$ type semiconductor region EX1 and the $n^+$ type semiconductor region SD1 configure a source/drain region (a semiconductor region for source or drain) having an LDD structure, while in the semiconductor substrate SB (the p well PW) in the bulk region 1B, the $n^-$ type semiconductor region EX2 and $n^+$ type semiconductor region SD2 configure a source/drain region having an LDD structure.

Next, activation annealing is performed as the heat treatment for activating the impurity introduced into the $n^+$ type semiconductor regions SD1 and SD2 and the $n^-$ type semiconductor regions EX1 and EX2. When the ion implantation region is made amorphous, it can be crystallized during this activation annealing.

Figure 33:
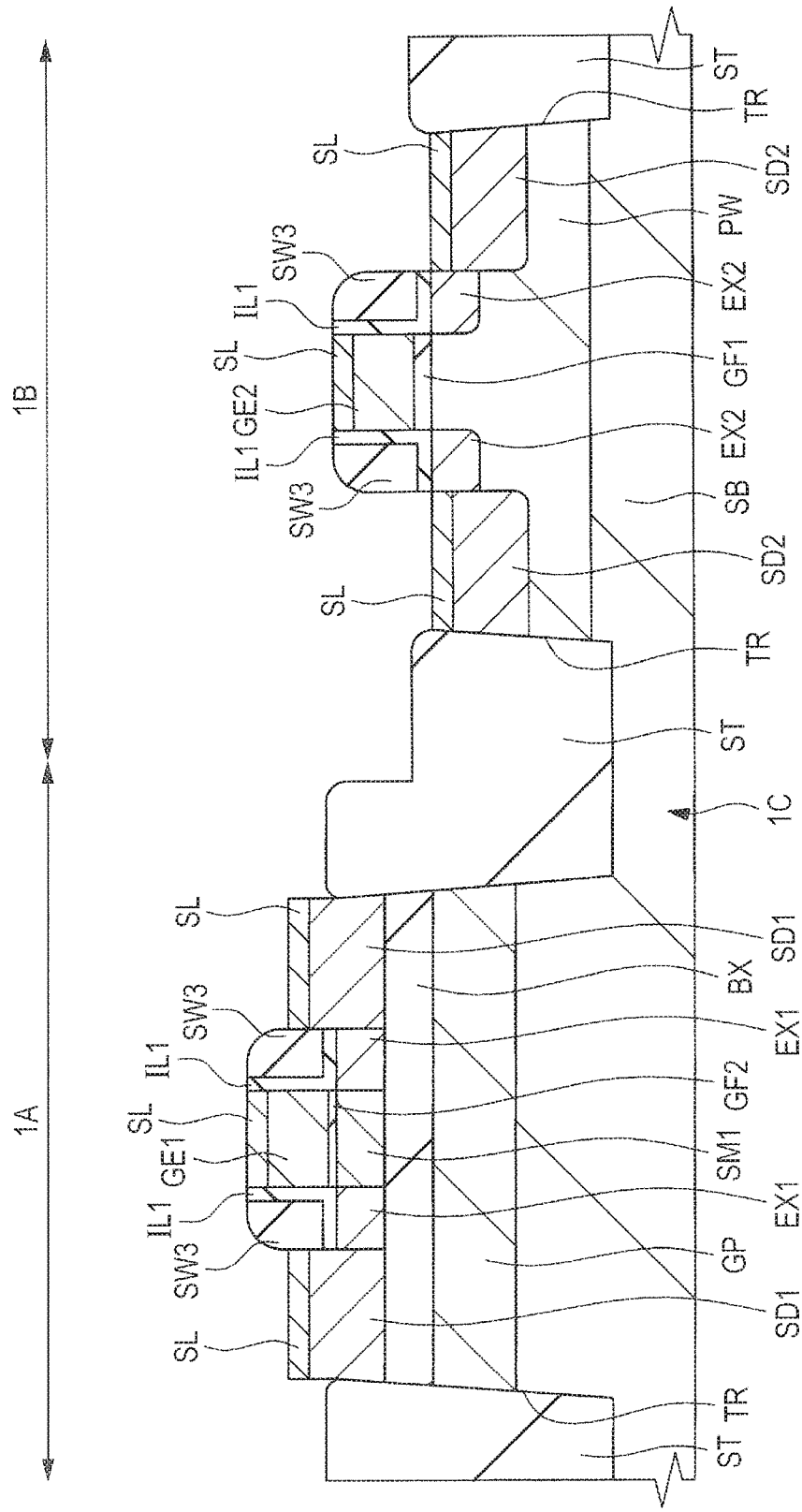
FIG. 33 is a fragmentary cross-sectional view of the semiconductor device during a manufacturing step following that shown in FIG. 32.

Next, as shown in FIG. 33, a low-resistance metal silicide layer SL is formed on the upper portion (the surface layer portion) of the $n^+$ type semiconductor regions SD1 and SD2 and the gate electrodes GE1 and GE2 by the salicide (self aligned silicide) process.

The metal silicide layer SL can be formed as described specifically below. A metal film for forming a metal silicide layer SL is formed on the main surface of the substrate 1C to cover the gate electrodes GE1 and GE2 and the sidewall spacer SW3. Then, the resulting substrate 1C is heat treated to cause a reaction between the metal film and the upper portion of each of the $n^+$ type semiconductor regions SD1 and SD2 and the gate electrodes GE1 and GE2. Thus, the metal silicide layer SL can be formed. Then, an unreacted portion of the metal film is removed. FIG. 33 shows the stage just after the removal.

Step S15 is performed in such a manner and a semiconductor element such as a MISFET (transistor) can be formed in each of the SOI region 1A and the bulk region 1B.

Figure 34:
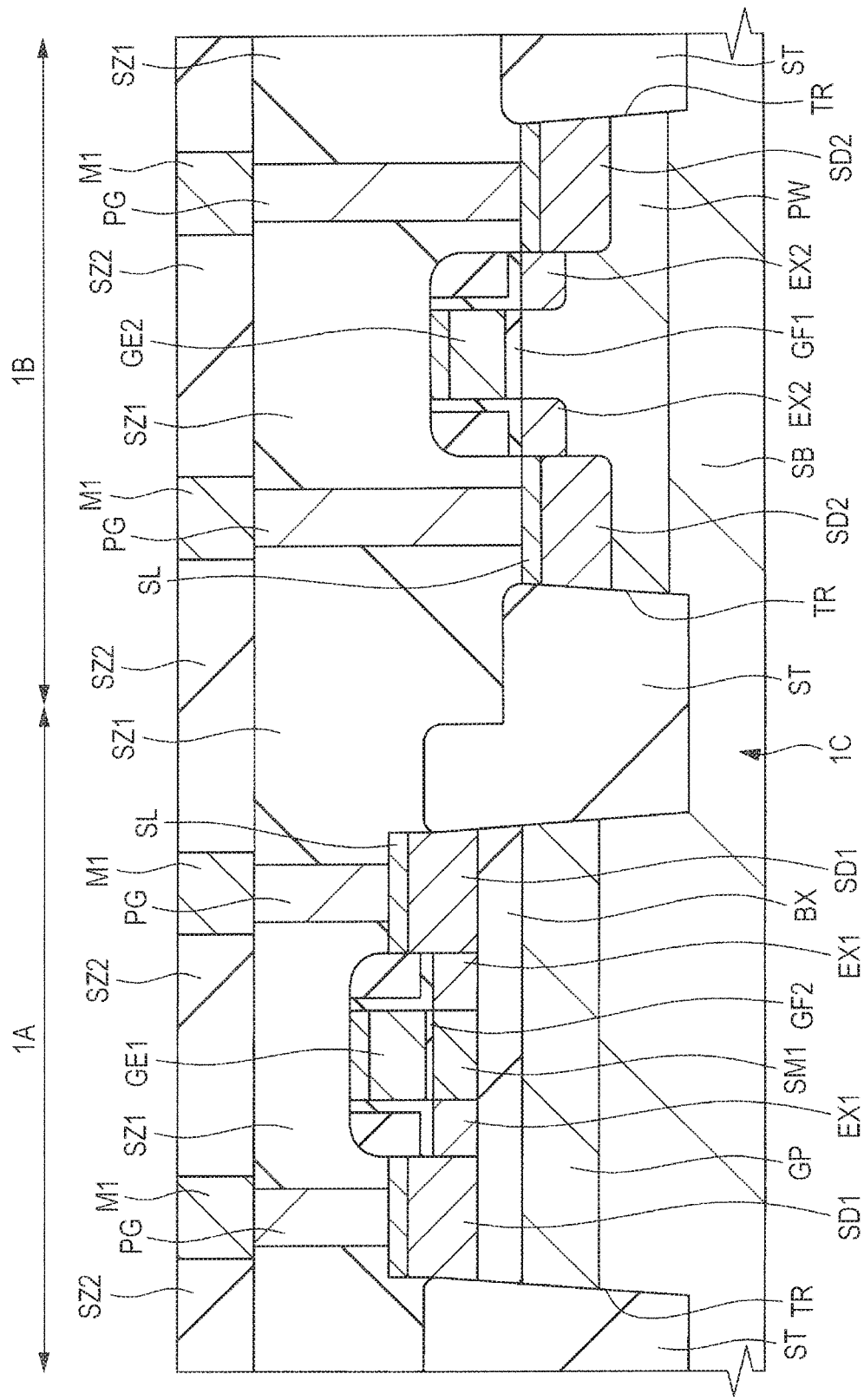
FIG. 34 is a fragmentary cross-sectional view of the semiconductor device during a manufacturing step following that shown in FIG. 33.

Next, as shown in FIG. 34, an insulating film SZ1 is formed on the main surface of the substrate 1C as an interlayer insulating film to cover the gate electrodes GE1 and GE2 and the sidewall spacer SW3. As the insulating film SZ1, a film made only of a silicon oxide film or a stacked film of a silicon nitride film and a thick silicon oxide film thereon can be used. After formation of the insulating film SZ1, the upper surface of the insulating film SZ1 may be polished as needed by CMP.

Next, with a photoresist pattern (not illustrated) formed on the insulating film SZ1 as an etching mask, the insulating film SZ1 is dry etched to form a contact hole (through-hole) in the insulating film SZ1.

Next, a conductive plug PG made of tungsten (W) or the like is formed in the contact hole. The plug PG can be formed, for example, by successively forming a barrier conductor film and a tungsten film on the insulating film SZ1 including the inside of the contact hole and then removing an unnecessary portion of a main conductor film and the barrier conductor film outside the contact hole by CMP or etch back.

Next, after formation of an insulating film SZ2 on the insulating film SZ1 having the plug PG buried therein, a wiring trench is formed in a predetermined region of the insulating film SZ2 and the wiring trench is filled with a wiring M1 by the single damascene technique. The wiring M1 is, for example, a copper wiring (a buried copper wiring) composed mainly of copper. The wiring M1 is electrically connected with the $n^+$ type semiconductor region SD1, the $n^+$ type semiconductor region SD2, the gate electrode GE1, or the gate electrode GE2 via the plug PG.

Then, a second-layer wiring and wirings thereabove are formed by the dual damascene technique but illustration and description on them are omitted here. The wiring M1 and wirings thereabove are not limited to a damascene wiring. Alternatively, they can be formed by patterning a wiring conductor film and they may be, for example, a tungsten wiring or an aluminum wiring.

The semiconductor device of the present embodiment is manufactured as described above.

In the present embodiment, an n channel MISFET is formed as the MISFET but a p channel MISFET can also be formed by reversing the conductivity type. It is also possible to form either one or both of the n channel MISFET and the p channel MISFET in the SOI region 1A. Also, either one or both of the n channel MISFET and the p channel MISFET can be formed in the bulk region 1B.

<Investigation Example>

Figure 35:
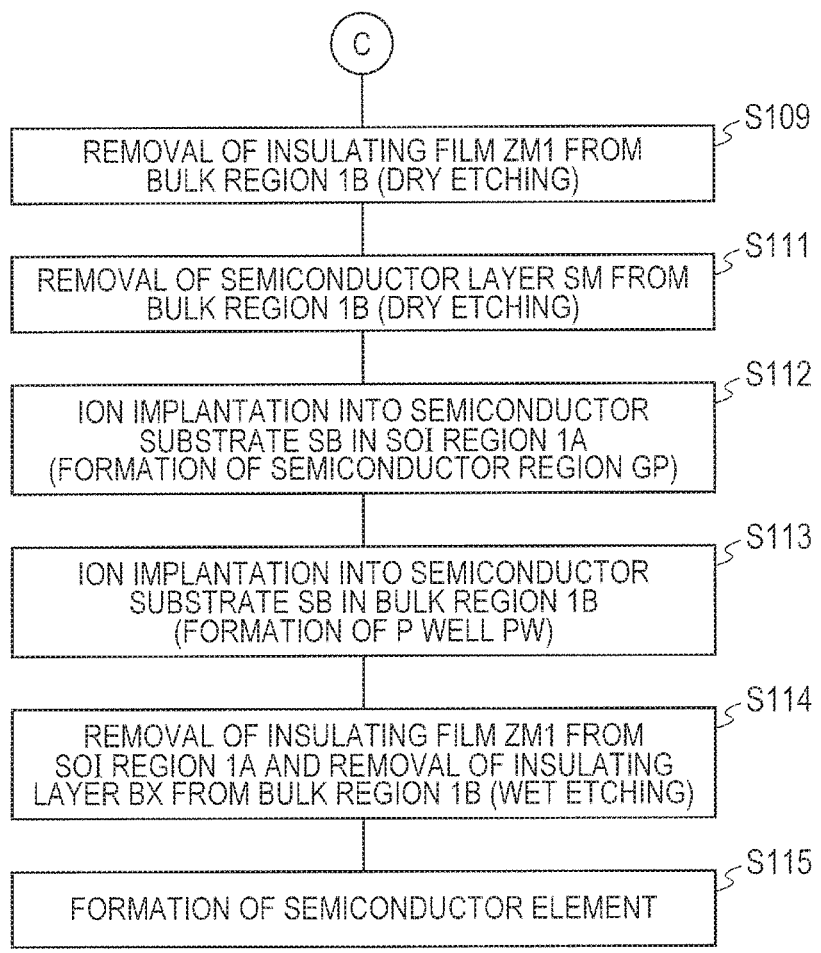
FIG. 35 is a process flow chart showing steps of manufacturing a semiconductor device of Investigation Example.
Figure 45:
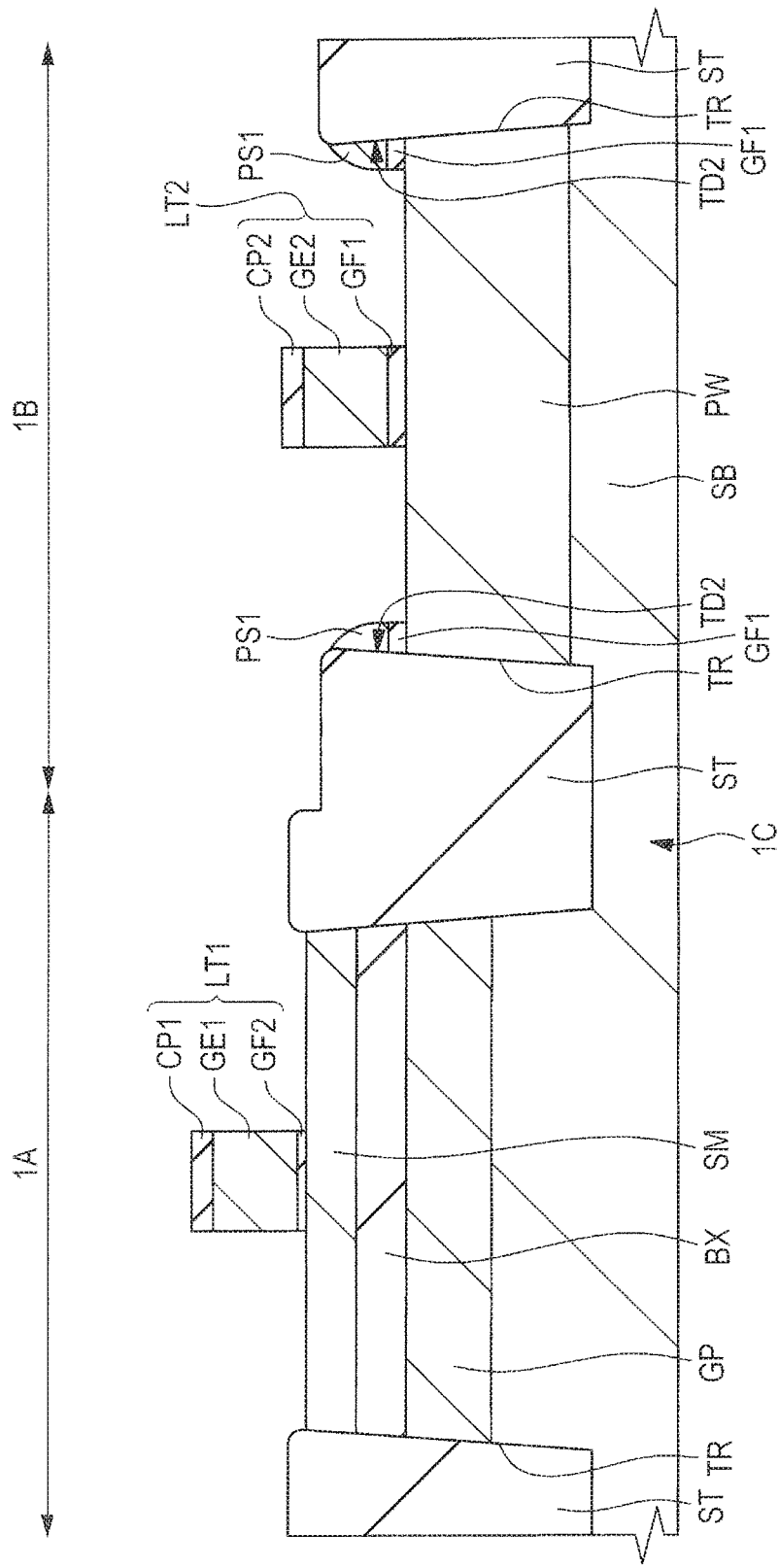
FIG. 45 is a fragmentary cross-sectional view of the semiconductor device of Investigation Example during a manufacturing step following that shown in FIG. 44.
Figure 46:
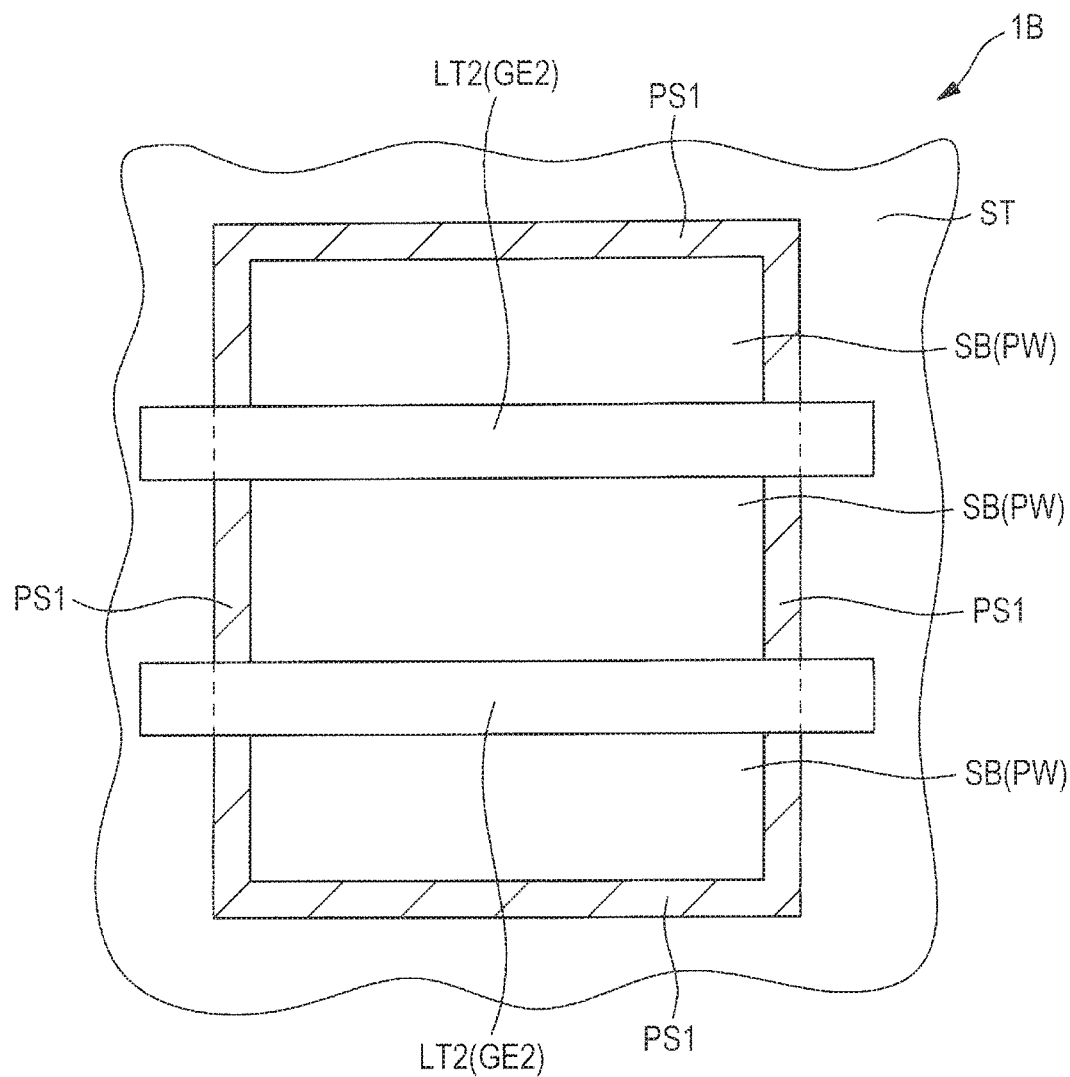
FIG. 46 is a fragmentary plan view of the semiconductor device of Investigation Example during a manufacturing step.

Investigation Example by the present inventors will be described referring to FIGS. 35 to 46. FIG. 35 is a process flow chart showing steps of manufacturing a semiconductor device of Investigation Example and corresponds to FIG. 2. FIGS. 35 to 45 are fragmentary cross-sectional views of the semiconductor device of Investigation Example during manufacturing steps and FIG. 46 is a fragmentary plan view of the semiconductor device of Investigation Example during the manufacturing steps.

Figure 36:
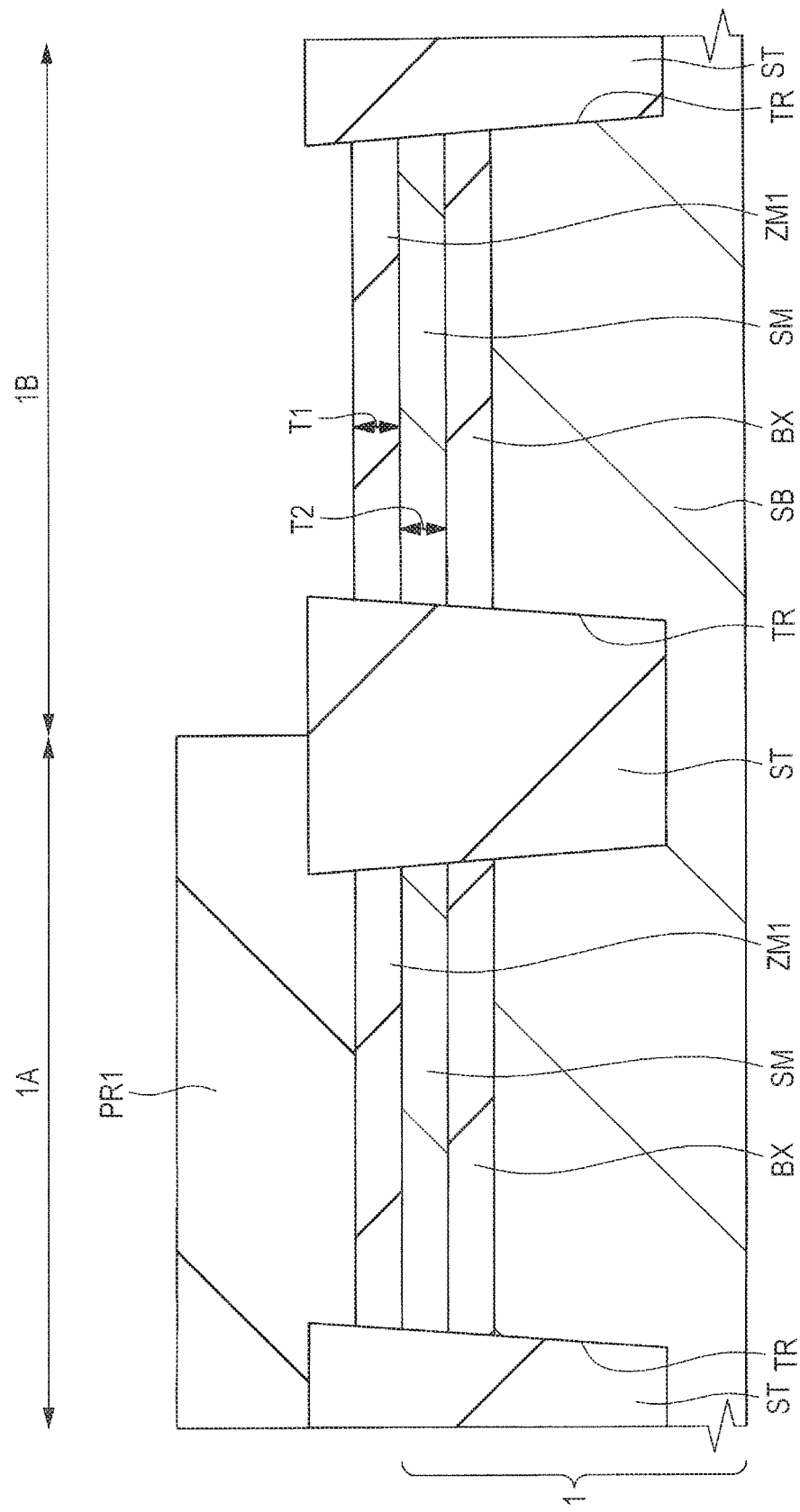
FIG. 36 is a fragmentary cross-sectional view of the semiconductor device of Investigation Example during a manufacturing step.

After the steps of Steps S1 to S8 are performed to obtain the structure of FIG. 9, a photoresist pattern PR1 that covers the SOI region 1A and exposes the bulk region 1B is formed also in Investigation Example as shown in FIG. 36 corresponding to FIG. 10.

Figure 37:
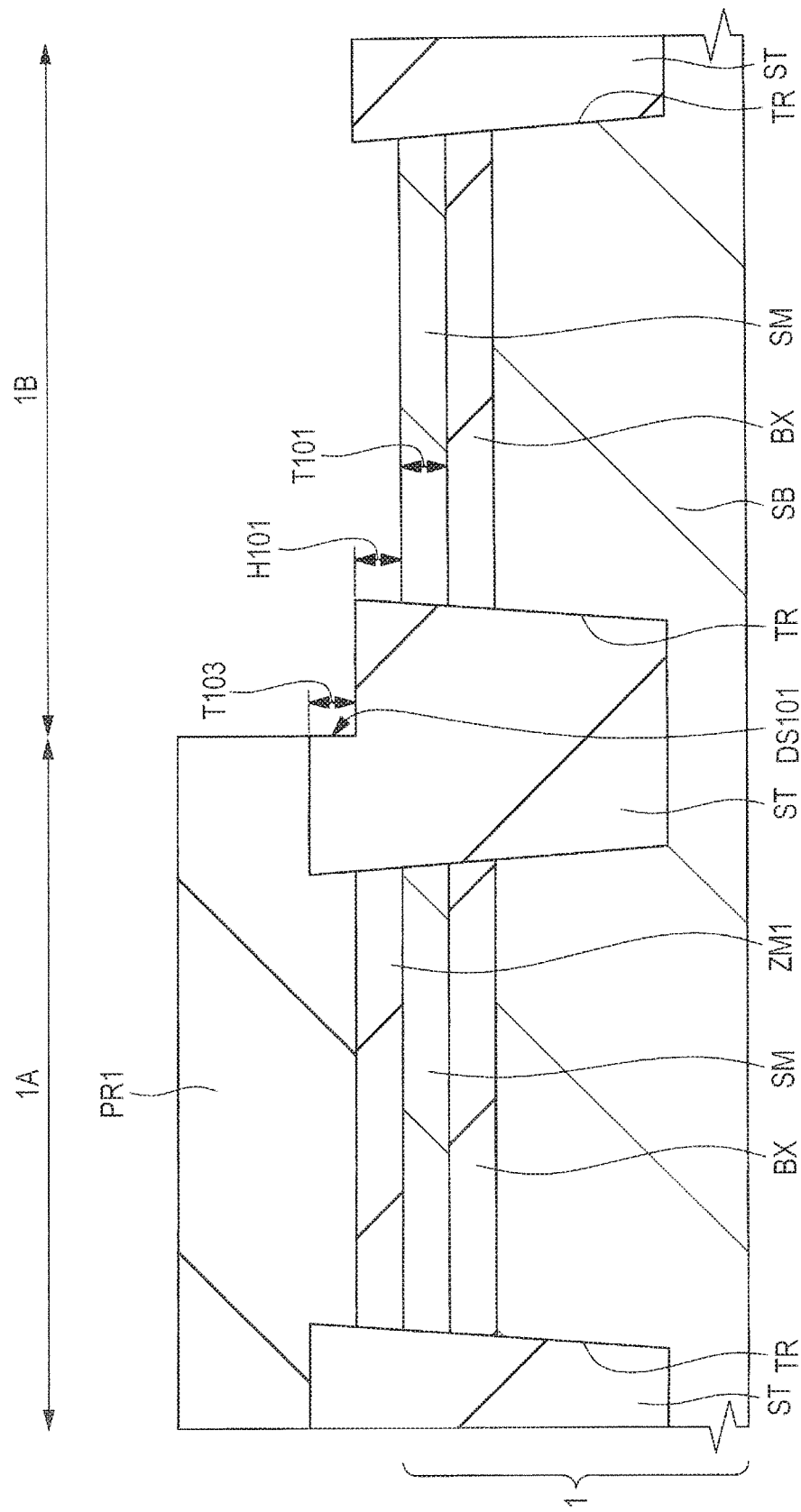
FIG. 37 is a fragmentary cross-sectional view of the semiconductor device of Investigation Example during a manufacturing step following that shown in FIG. 36.

Next, as shown in FIG. 37, the insulating film ZM1 in the bulk region 1B is removed by a dry etching with the photoresist pattern PR1 as an etching mask (Step S109 of FIG. 35). A fluorocarbon gas is used as an etching gas.

In the bulk region 1B, the insulating film ZM1 is removed in Step S109 and the upper surface of the semiconductor layer SM is exposed. In the SOI region 1A, on the other hand, the insulating film ZM1 remains as is without being etched. A region of the element isolation portion ST exposed without being covered with the photoresist pattern PR1 is also etched in Step S109. By the etching of Step S109, therefore, a step difference DS101 is formed, on the upper surface of the element isolation portion ST present at the boundary between the SOI region 1A and the bulk region 1B, at a position aligned with the side surface of the photoresist pattern PR1.

In Investigation Example, in Step S109 different from Step S9 described above, etching is finished at the stage where the insulating film ZM1 is removed from the bulk region 1B and the upper surface of the semiconductor layer SM in the bulk region 1B is exposed. The etching thickness T103 of the element isolation portion ST in Step S109 is almost equal to the thickness T1 of the insulating film ZM1 in the bulk region 1B just before Step S109 is performed (meaning that T103=T1). The magnitude of the step difference DS101 at the stage where the etching in Step S109 is finished is almost equal to the thickness T1 of the insulating film ZM1 in the bulk region 1B just before Step S109 is performed.

Figure 38:
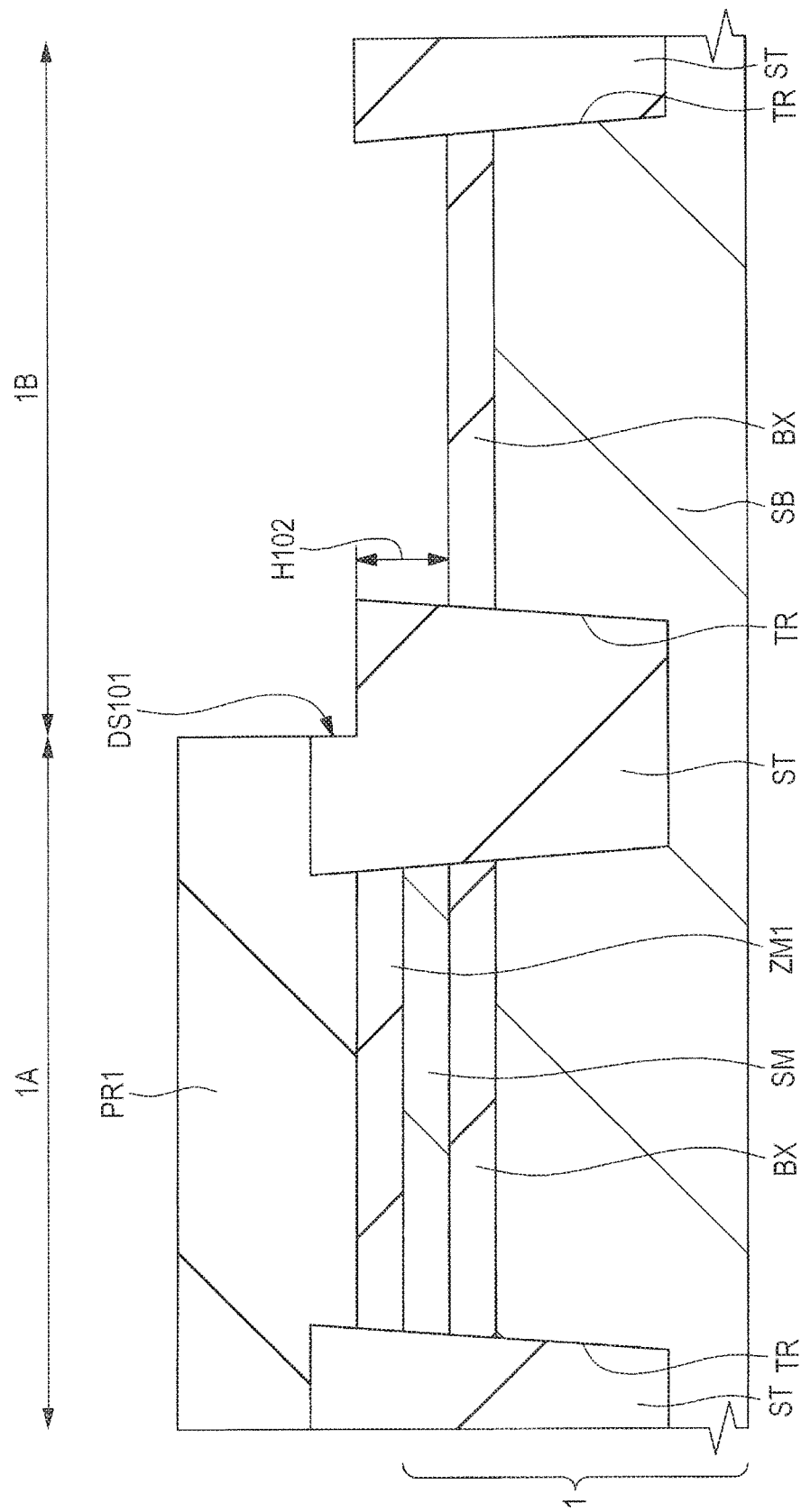
FIG. 38 is a fragmentary cross-sectional view of the semiconductor device of Investigation Example during a manufacturing step following that shown in FIG. 37.

Next, in Investigation Example, the semiconductor layer SM in the bulk region 1B is removed selectively by a dry etching with the photoresist pattern PR1 as an etching mask as shown in FIG. 38 without carrying out the oxygen plasma treatment in Step S10 (Step S111 of FIG. 35). By this removal, the upper surface of the insulating layer BX is exposed in the bulk region 1B. As the etching in Step S111, isotropic dry etching is used and as the etching gas, an $SF_6$ gas or the like is used. After the etching step in Step S111 is performed, the photoresist pattern PR1 is removed by asking or the like as shown in FIG. 39.

At this stage, the insulating film ZM1 remains and the upper surface of the insulating film ZM1 is exposed in the SOI region 1A, while the upper surface of the insulating layer BX is exposed in the bulk region 1B.

Figure 39:
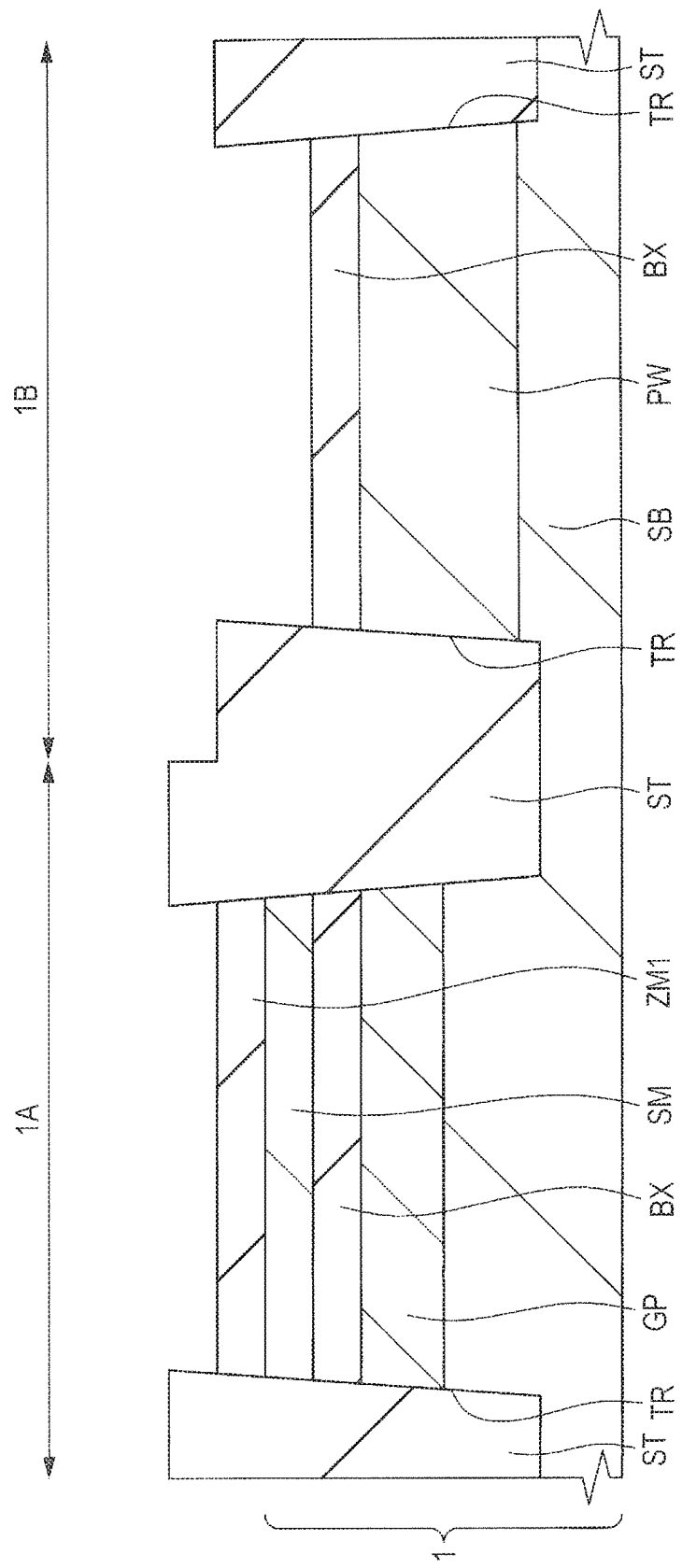
FIG. 39 is a fragmentary cross-sectional view of the semiconductor device of Investigation Example during a manufacturing step following that shown in FIG. 38.

Next, after formation of the photoresist pattern PR2 (not illustrated here), a semiconductor region GP is formed in the semiconductor substrate SB in the SOI region 1A as shown in FIG. 39 by carrying out ion implantation (Step S112 of FIG. 35). Then, after formation of the photoresist pattern PR3 (not illustrated here), ion implantation is carried out to form a p well PW in the semiconductor substrate SB in the bulk region 1B (Step S113 of FIG. 35).

Figure 40:
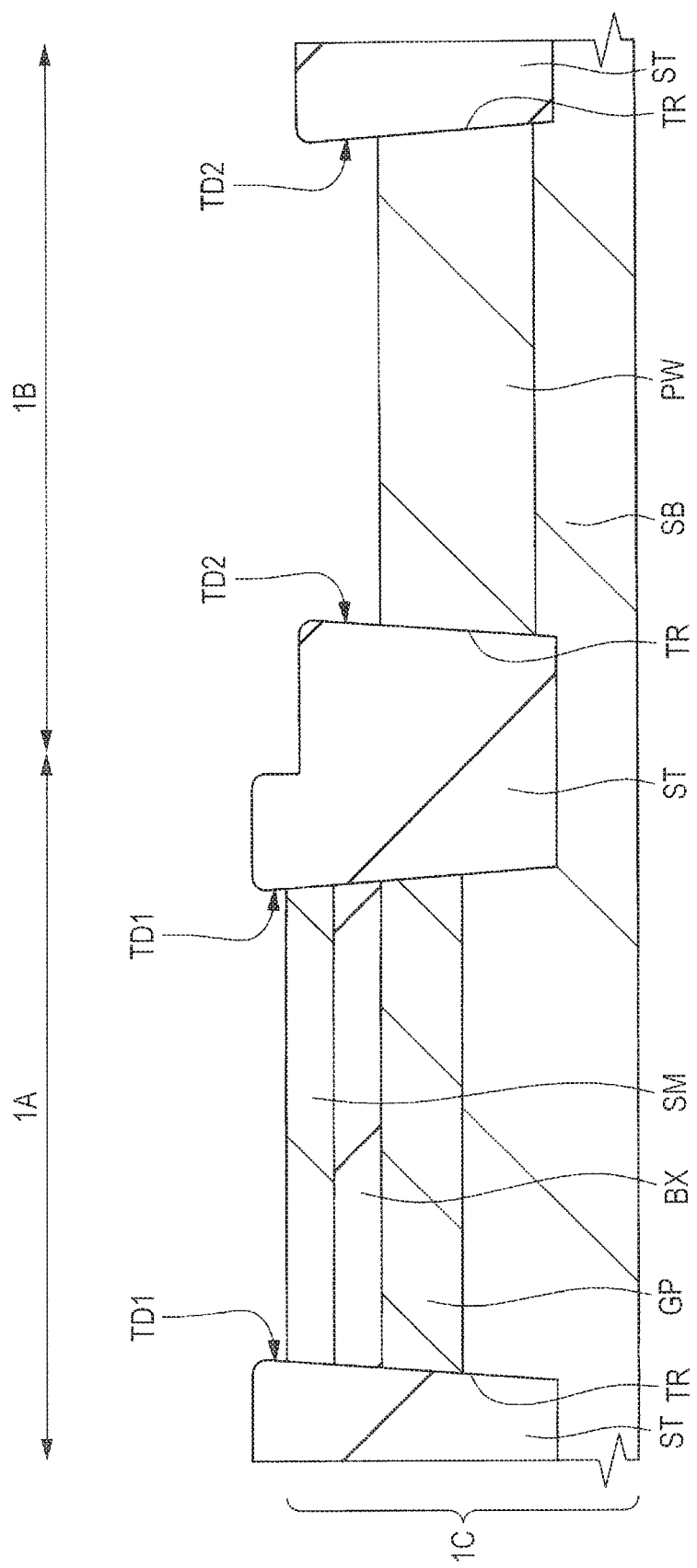
FIG. 40 is a fragmentary cross-sectional view of the semiconductor device of Investigation Example during a manufacturing step following that shown in FIG. 39.

Next, as shown in FIG. 40, the insulating film ZM1 in the SOI region 1A and the insulating layer BX in the bulk region 1B are removed by wet etching (Step S114 of FIG. 35). By this removal, the upper surface of the semiconductor layer SM is exposed in the SOI region 1A, while the upper surface of the semiconductor substrate SB (p well PW) is exposed in the bulk region 1B. Hydrofluoric acid is used as the etchant.

Figure 41:
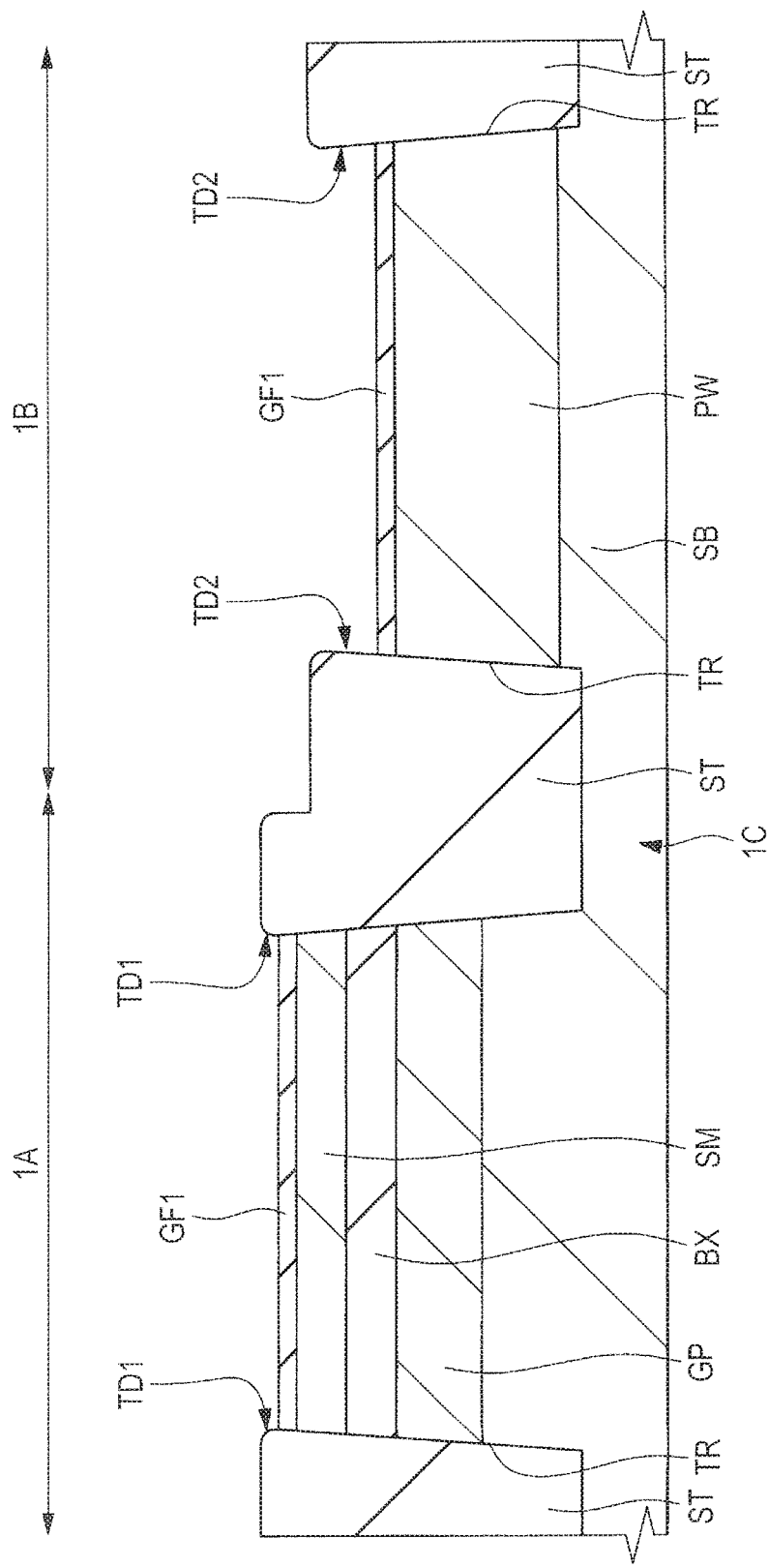
FIG. 41 is a fragmentary cross-sectional view of the semiconductor device of Investigation Example during a manufacturing step following that shown in FIG. 40.
Figure 42:
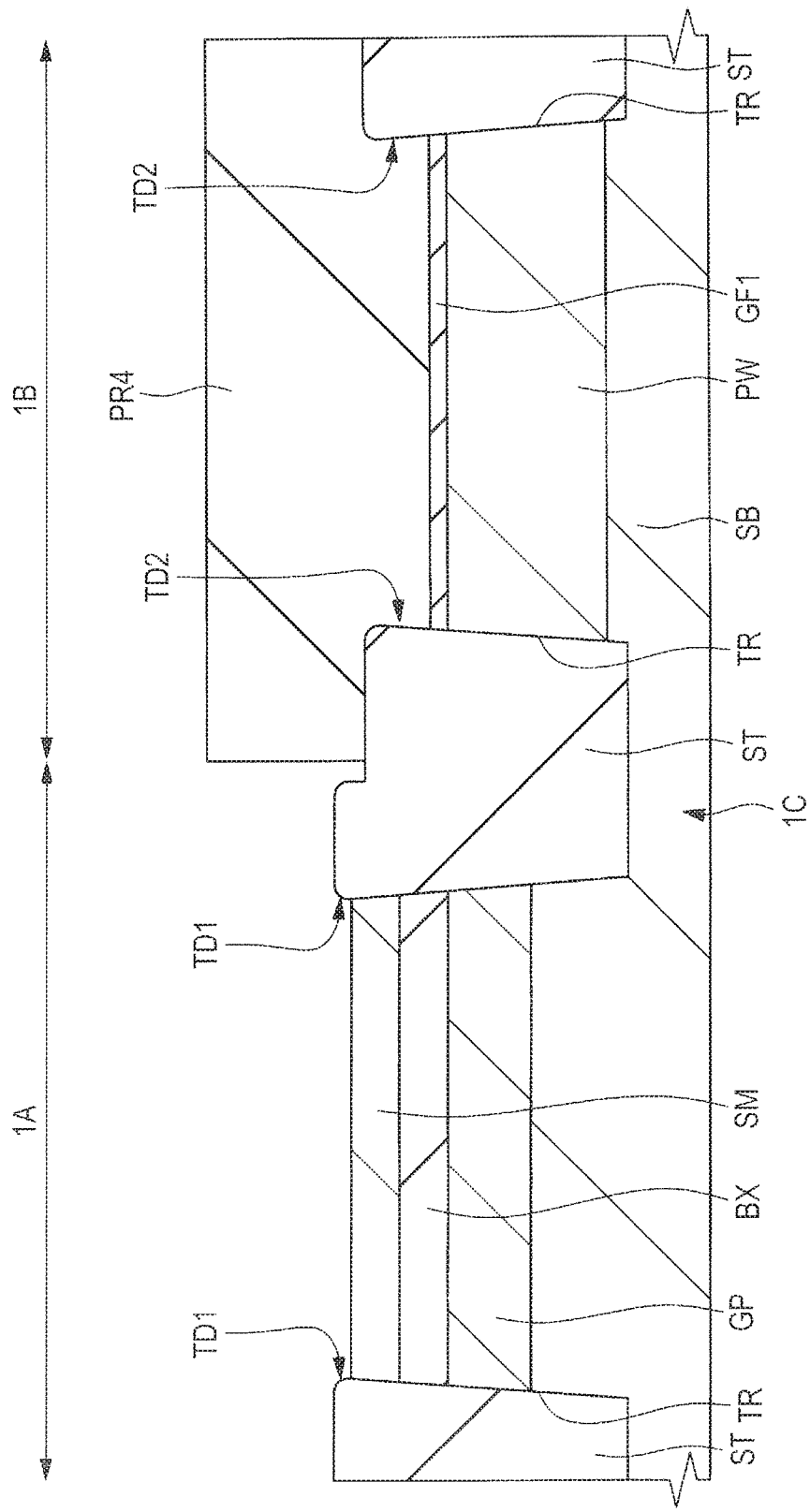
FIG. 42 is a fragmentary cross-sectional view of the semiconductor device of Investigation Example during a manufacturing step following that shown in FIG. 41.
Figure 43:
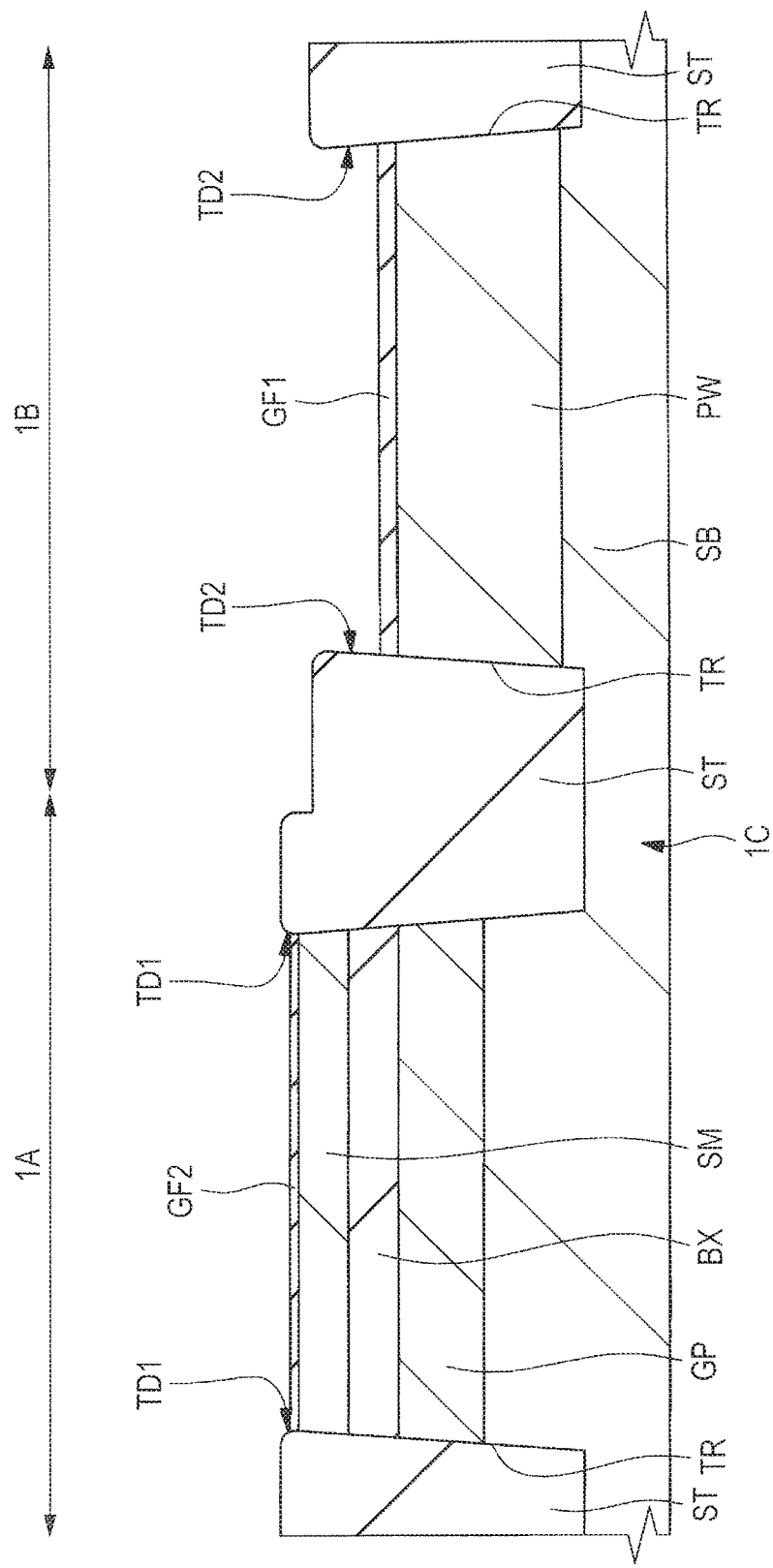
FIG. 43 is a fragmentary cross-sectional view of the semiconductor device of Investigation Example during a manufacturing step following that shown in FIG. 42.

Next, as shown in FIG. 41, a gate insulating film GF1 is formed on the upper surface of the semiconductor layer SM in the SOI region 1A and the upper surface of the semiconductor substrate SB in the bulk region 1B by thermal oxidation or the like. Then, as shown in FIG. 42, after formation of the photoresist pattern PR4, the gate insulating film GF1 in the SOI region 1A is removed by etching with the photoresist pattern PR4 as an etching mask. After removal of the photoresist pattern PR4, a gate insulating film GF2 is formed on the upper surface of the semiconductor layer SM in the SOI region by thermal oxidation or the like as shown in FIG. 43. In such a manner, the semiconductor layer SM in the SOI region 1A has, on the upper surface, the gate insulating film GF2 and the semiconductor substrate SB in the bulk region 1B has, on the upper surface, the gate insulating film GF1.

Figure 44:
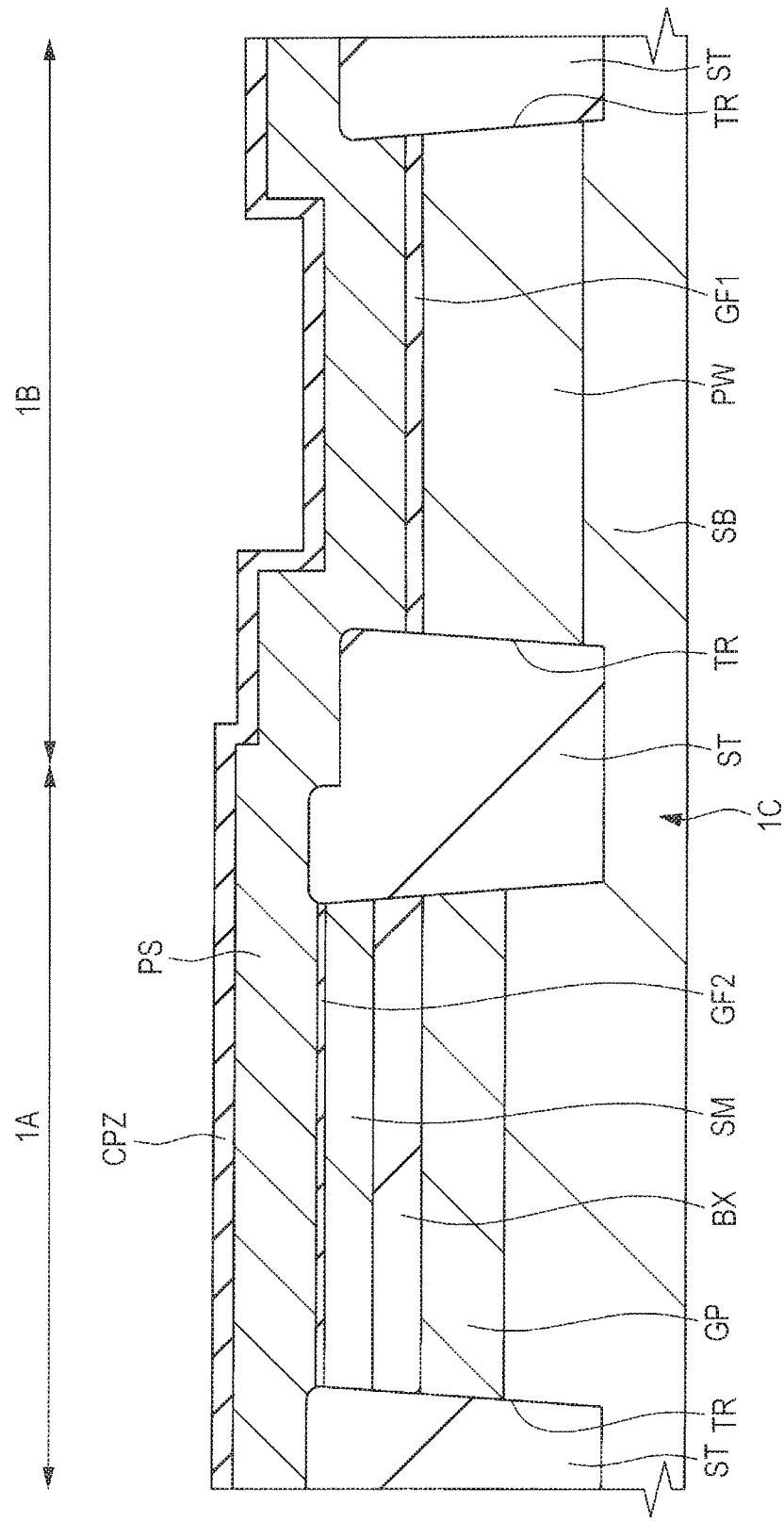
FIG. 44 is a fragmentary cross-sectional view of the semiconductor device of Investigation Example during a manufacturing step following that shown in FIG. 43.

Next, as shown in FIG. 44, a silicon film PS is formed on the gate insulating films GF1 and GF2 and the element isolation portion ST and then, an insulating film CPZ is formed on the silicon film PS. Then, the insulating film CPZ and the silicon film PS are patterned by a dry etching. As a result, as shown in FIG. 45, a stacked body LT1 comprised of the gate insulating film GF2, the gate electrode GE1, and the cap insulating film CP1 is formed in the SOI region 1A and a stacked body LT2 comprised of the gate insulating film GF1, the gate electrode GE2, and the cap insulating film CP2 is formed in the bulk region 1B.

Steps of Investigation Example thereafter are similar to those described referring to FIGS. 25 to 34 so that illustration and description of them is omitted here.

Investigation by the present inventors has revealed that the manufacturing steps of Investigation Example shown in FIGS. 35 to 44 have the following problems.

Described specifically, in Investigation Example, the isolation-portion step difference TD2 the in the bulk region 1B becomes much larger than the isolation-portion step difference TD1 in the SOI region 1A at the stage (stage of FIG. 40) where Step S114 is completed.

Here, the isolation-portion step difference TD1 in the SOI region 1A is comprised of the upper surface of the semiconductor layer SM in the SOI region 1A and the element isolation portion ST adjacent to the semiconductor layer SM in the SOI region 1A. The magnitude of the isolation-portion step difference TD1 in the SOI region 1A corresponds to a height difference between the upper surface of the semiconductor layer SM in the SOI region 1A and the upper surface of the element isolation portion ST adjacent to the semiconductor layer SM in the SOI region 1A. In addition, the isolation-portion step difference TD2 in the bulk region 1B is comprised of the upper surface of the semiconductor substrate SB in the bulk region 1B and the element isolation portion ST adjacent to the semiconductor substrate SB in the bulk region 1B. The magnitude of the isolation-portion step difference TD2 in the bulk region 1B corresponds to a height difference between the upper surface of the semiconductor substrate SB in the bulk region 1B and the upper surface of the element isolation portion ST adjacent to the semiconductor substrate SB in the bulk region 1B.

The following is the reason why the isolation-portion step difference TD2 in the bulk region 1B becomes much larger than the isolation-portion step difference TD1 in the SOI region 1A.

When the insulating film ZM1 in the bulk region 1B is removed in Step S109, the etching thickness of the element isolation portion ST exposed without being covered with the photoresist pattern PR1 is almost equal to the thickness of the insulating film ZM1. When the insulating film ZM1 in the SOI region 1A and the insulating layer BX in the bulk region 1B are removed in Step S114, the etching thickness of the exposed element isolation portion ST is much the same between the position of it adjacent to the semiconductor layer SM in the SOI region 1A and the position of it adjacent to the semiconductor substrate SB in the bulk region 1B. Although the isolation-portion step difference TD2 becomes much larger than the isolation-portion step difference TD1, the etching step in Step S109 and the etching step in Step S114 therefore scarcely contribute to it.

On the other hand, when the semiconductor layer SM is removed from the bulk region 1B in Step S111, the element isolation portion ST exposed without being covered with the photoresist pattern PR1 is hardly etched. Compared with a height difference H101 between the upper surface of the insulating film ZM1 in the bulk region 1B and the upper surface of the element isolation portion ST adjacent thereto just before Step S111 (FIG. 37), a height difference H102 between the upper surface of the semiconductor layer SM in the bulk region 1B and the upper surface of the element isolation portion ST adjacent thereto at the time of completion of Step S111 (FIG. 38) becomes larger by the thickness T101 of the semiconductor layer SM removed in Step S111. This is represented by the following equation: H102=H101+T101. At the stage where Step S114 is completed (FIG. 40), therefore, the isolation-portion step difference TD2 in the bulk region 1B becomes much larger than the isolation-portion step difference TD1 in the SOI region 1A.

After forming the gate insulating film GF1 on the upper surface of the semiconductor layer SM in the SOI region 1A and on the upper surface of the semiconductor substrate SB in the bulk region 1B as shown in FIG. 41, the gate insulating film GF1 in the SOI region 1A is removed by etching as shown in FIG. 42. This etching includes etching of the upper surface of the element isolation portion ST adjacent to the semiconductor layer SM in the SOI region 1A. By this etching, the isolation-portion step difference TD1 in the SOI region 1A becomes smaller. Since the bulk region 1B is covered with the photoresist pattern PR4 during this etching, also the upper surface of the element isolation portion ST adjacent to the semiconductor substrate SB in the bulk region 1B is prevented from etching and therefore, the isolation-portion step difference TD2 in the bulk region 1B does not become small. Compared with the very small isolation-portion step difference TD1 in the SOI region 1A, the isolation-portion step difference TD2 in the bulk region 1B becomes very large.

Due to the small isolation-portion step difference TD1 in the SOI region 1A, no inconvenience resulting from the isolation portion step difference TD1 in the SOI region 1A occurs. The considerably large isolation-portion step difference TD2 in the bulk region 1B, on the other hand, may cause inconvenience resulting from the isolation-portion step-difference TD2 in the bulk region 1B.

Examples of the inconvenience resulting from the isolation-portion step difference TD2 in the bulk region 1B include production of, when for example a silicon film PS is formed as a conductive film for forming gate electrodes GE1 and GE2 and this silicon film PS is patterned by etching, an etch residue (etch remnant) PS1 of the silicon film PS at the position adjacent to the isolation portion step difference TD2 in the bulk region 1B. In other words, as shown in FIG. 45, an etch residue PS1 of the silicon film PS is inevitably produced on the side wall of a portion of the element isolation portion ST protruding from the upper surface of the semiconductor substrate SB in the bulk region 1B. The semiconductor device obtained while having this etch residue PS1 may have deteriorated reliability because this etch residue PS1 has conductivity. For example, in the case where two or more (two in this drawing) gate electrodes GE2 (stacked bodies LT2) are arranged side by side on the same active region as shown in FIG. 46, these (two) gate electrodes GE2 may be connected with each other via the etch residue PS1 of the silicon film PS that has remained along the isolation-portion step difference TD2. It is therefore necessary to prevent production of the etch residue PS1 of the silicon film PS at a position adjacent to the isolation-portion step difference TD2 in the bulk region 1B. FIG. 46 is a plan view but to facilitate viewing of this drawing, the etch residue PS1 of the silicon film PS is hatched.

A decrease in the size of the isolation-portion step difference TD2 is effective for preventing production of the etch residue PS1 of the silicon film PS at a position adjacent to the isolation-portion step difference TD2 in the bulk region 1B. When the isolation-portion step difference TD2 is small, the etch residue PS1 of the silicon film PS is not produced easily at a position adjacent to the isolation-portion step difference TD2.

An increase in an over-etching amount or time in Step S114 is considered as a solution for decreasing the size of the isolation-portion step difference TD2. In this case, however, an increase in the etching thickness of the element isolation portion ST at a position adjacent to the semiconductor substrate SB in the bulk region 1B can reduce the isolation-portion step difference TD2 but the etching thickness of the element isolation portion ST at a position adjacent to the semiconductor layer SM in the SOI region 1A also increases. The height position of the upper surface of the semiconductor layer SM in the SOI region 1A inevitably becomes higher than the upper surface of the element isolation portion ST. This may cause exposure of the side surface of the semiconductor layer SM in the SOI region 1A and as a result, may undesirably cause production of an etch residue of the silicon film PS in the SOI region 1A during patterning of the silicon film PS for gate electrode.

<Main Characteristics of the Present Embodiment>

In the present embodiment, in Step S9, the semiconductor layer SM in the bulk region 1B is exposed by removing the insulating film ZM1 (first insulating film) in the bulk region 1B (second region) by a dry etching (first dry etching) with the photoresist pattern PR1 (first mask layer) as an etching mask. This dry etching (first dry etching) in Step S9 uses a gas (first gas) containing a fluorocarbon gas.

One of the main characteristics of the present embodiment is that in the dry etching in Step S9, the etching thickness T3 of the element isolation portion ST not covered with the photoresist pattern PR1 is at least the sum of the thickness T1 of the insulating film ZM1 in the SOI region 1A and the thickness T2 of the semiconductor layer SM (T3≥T1+T2) just before the dry etching in Step S9 is started. The dry etching in Step S9 is performed to satisfy T3≥T1+T2 in order to reduce the isolation-portion step difference TD2 in the bulk region 1B.

In the above-described Investigation Example, in Step S109, etching is finished when the insulating film ZM1 in the bulk region 1B is removed and the upper surface of the semiconductor layer SM in the bulk region 1B is exposed. The etching thickness T103 of the element isolation portion ST in Step S109 is therefore almost equal to the thickness T1 of the insulating film ZM1 in the bulk region 1B (meaning T103=T1) just before Step S109 is performed. At the stage where Step S114 is finished (FIG. 40), the isolation-portion step difference TD2 in the bulk region 1B becomes considerably large.

In the present embodiment, on the other hand, in Step S9, dry etching is continued for a while even after the insulating film ZM1 in the bulk region 1B is removed and the upper surface of the semiconductor layer SM in the bulk region 1B is exposed and dry etching of the element isolation portion ST not covered with the photoresist pattern PR1 is continued for a certain time. This means that in Step S9, an over-etching time is determined to adjust the etching thickness of the element isolation portion ST equal to or more than the thickness T2 of the semiconductor layer SM by over-etching after exposure of the semiconductor layer SM in the bulk region 1B. In other words, since Step S11 performed later hardly etches the element isolation portion ST, the over-etching amount or time after exposure of the semiconductor SM in Step S9 is increased in anticipation of this and the etching thickness of the element isolation portion ST is adjusted to be equal to or more than the thickness T2 of the semiconductor layer SM. This makes it possible to reduce the isolation-portion step difference TD2 in the bulk region 1B at the stage where Step S14 is finished (FIG. 17).

In Investigation Example, the total etching thickness of the element isolation portion ST in Step S109 and Step S111 is smaller by the thickness of the semiconductor layer SM than the total thickness of the insulating film ZM1 and the semiconductor layer SM removed in Steps S109 and S111 from the bulk region 1B and this causes an increase in the isolation-portion step difference TD2 in the bulk region 1B at the stage where Step S114 is finished. In the present embodiment, on the other hand, the total etching thickness of the element isolation portion ST in Step S9 and Step S11 approximates to the total thickness (meaning T1+T2) of the insulating film ZM1 and the semiconductor layer SM removed in Step S9 and Step S11 from the bulk region 1B. The isolation-portion step difference TD2 in the bulk region 1B can therefore be made small at the stage where Step S14 is finished.

In the present embodiment, at the stage where Step S14 is finished (stage of FIG. 17) or at the stage where the gate insulating films GF1 and GF2 are formed (stage of FIG. 20), not only the isolation-portion step difference TD1 in the SOI region 1A but also the isolation-portion step difference TD2 in the bulk region 1B can be made small. For example, the isolation-portion step difference TD1 in the SOI region 1A can be made substantially equal to the isolation-portion step difference TD2 in the bulk region 1B.

In the present embodiment, inconvenience resulting from the isolation-portion step difference TD2 in the bulk region 1B can be prevented by increasing, in Step S9, the etching thickness T3 of the element isolation portion ST and thereby reducing the isolation-portion step difference TD2 in the bulk region 1B. For example, when a silicon film PS is formed as a conductive film for forming gate electrodes GE1 and GE2 and this silicon film PS is patterned by etching, it is possible to prevent production of an etch residue (etch remnant) of the silicon film PS at a position adjacent to the isolation-portion step difference TD2 in the bulk region 1B. This makes it possible to provide a semiconductor device having improved reliability, manufacture a semiconductor device in an improved yield, and manufacture a semiconductor device easily due to easy management of the manufacturing steps.

The other main characteristic (second characteristic) of the present embodiment is that after the dry etching in Step S9, oxygen plasma treatment of the substrate (SOI substrate 1) is performed in Step S10. After the oxygen plasma treatment in Step S10, the insulating layer BX in the bulk region 1B is exposed by removing the semiconductor layer SM in the bulk region 1B by a dry etching with the photoresist pattern PR1 as an etching mask in Step S11.

The oxygen plasma treatment in Step 10 is inserted between Step S9 and Step S11 because of the following reason.

With an increase in the dry etching amount, a deposit is easily produced during the dry etching, leading to an increase in the amount of the deposit. The deposit formed during the dry etching is a reaction product produced during the dry etching and it contains an atom contained in a gas molecule used in the dry etching. In Step S9, a gas containing a fluorocarbon gas is used so that the deposit formed during the dry etching in Step S9 contains a carbon (C) atom and a fluorine (F) atom, more specifically, it is composed of a polymer containing carbon (C) and fluorine (F).

An over-etching amount or time is made larger in Step S9 of the present embodiment than that in Step S109 of Investigation Example so that an amount of a deposit formed during the dry etching is likely to become large in Step S9. When the etching step of Step S11 is performed while leaving the deposit formed during the dry etching in Step S9, the deposit formed during the dry etching in Step S9 becomes an obstacle and the semiconductor layer SM shielded with the deposit partially remains and may become an etch residue (etch remnant) of the semiconductor layer SM. For Example, in the case where in the bulk region 1B, the upper surface of the element isolation portion ST is higher than the upper surface of the semiconductor layer SM at the stage where the dry etching in Step S9 is finished, the deposit may inevitably attach onto the side wall of a portion of the element isolation portion ST protruding from the upper surface of the semiconductor layer SM and an etch residue of the semiconductor layer SM may be produced in Step S11, disturbed by the deposit. In the case where in the bulk region 1B, the upper surface of the element isolation portion ST is at a position lower than the upper surface of the semiconductor layer SM, the deposit may inevitably attach onto the side wall of a portion of the semiconductor layer SM protruding from the upper surface of the element isolation portion ST and an etch residue of the semiconductor layer SM may be produced in Step S11, disturbed by the deposit. In either case, if the etching step of Step S11 is performed without removing the deposit formed during the dry etching in Step S9, an etch residue of the semiconductor layer SM may be produced. The semiconductor layer SM is not an insulator so that in order to have a semiconductor device having enhanced reliability, such an etch residue of the semiconductor layer SM is desirably prevented as much as possible.

In the present embodiment, the dry etching with a gas containing a fluorocarbon gas in Step S9 is followed by oxygen plasma treatment in Step S10. The oxygen plasma treatment is suited for the removal of a deposit (a polymer containing a carbon atom and a fluorine atom) produced during dry etching with a fluorocarbon gas. The deposit formed during the dry etching in Step S9 can therefore be removed by the oxygen plasma treatment in Step S10. Step S11 is performed without having the deposit formed during the dry etching in Step S9. This makes it possible to properly prevent production of an etch residue (etch remnant) of the semiconductor layer SM when the semiconductor layer SM in the bulk region 1B is removed by etching in Step S11. This makes it possible to provide a semiconductor device having improved reliability, manufacture a semiconductor device in an improved yield, and manufacture a semiconductor device easily due to easy management of the manufacturing steps.

In Investigation Example, due to a small over-etching amount or time in Step S109, the amount of a deposit formed during the dry etching in Step S109 is small so that different from the present embodiment, an etch residue of the semiconductor layer SM is hardly produced in Step S114 even without performing the oxygen plasma treatment in Step S10. The present inventors have found that in the present embodiment, on the other hand, an over-etching amount or time in Step S9 is increased to reduce the isolation-portion step difference TD2 in the bulk region 1B and this increases the amount of a deposit formed during the dry etching in Step S9. In order to prevent occurrence of inconvenience in Step S11 due to the deposit, oxygen plasma treatment is introduced in Step S10. It is therefore very important to use the first characteristic and the second characteristic in combination. This combination makes it possible to achieve both prevention of inconvenience due to the isolation-portion step difference TD2 in the bulk region 1B and prevention of inconvenience due to the deposit formed during the dry etching in Step S9. In the present embodiment, a decrease in the isolation-portion step difference TD2 can be achieved by increasing the etching thickness T3 of the element isolation portion ST in Step S9 and at the same time, the inconvenience due to the increase in the etching thickness T3 of the element isolation portion ST in Step S9 can be overcome by addition of the oxygen plasma treatment in Step S10. Thus, the semiconductor device thus obtained can have improved reliability.

Another characteristic of the present embodiment will next be described.

In Step S9, removal of the whole semiconductor layer SM from the bulk region 1B to expose the insulating layer BX should be prevented. At the stage where the dry etching in Step S9 is finished and at the stage where the oxygen plasma treatment in Step 10 is finished, it is necessary that the semiconductor layer SM in the bulk region 1B remains in layer form on the insulating layer BX and the insulating layer BX in the bulk region 1B is not exposed. In Step S9, however, an over-etching amount or time after exposure of the semiconductor layer SM in the bulk region 1B is made large so that the semiconductor layer SM in the bulk region 1B may be etched excessively in Step S9 and the semiconductor layer SM in the bulk region 1B may disappear unless the etch selectivity of the element isolation portion ST and the insulating film ZM1 on the semiconductor layer SM is set high. Dry etching in Step S9 is, therefore, performed under conditions where the semiconductor layer SM is more etch-resistant than the insulating film ZM1 and the element isolation portion ST. It is desired to set etching conditions such that the etch selectivity of the insulating layer BX and the element isolation portion ST on the semiconductor layer SM becomes as high as possible. The etch selectivity of the insulating film ZM1 and the element isolation portion ST on the semiconductor layer SM corresponds to a ratio of the etching rate of the insulating film ZM1 and the element isolation portion ST to the etching rate of the semiconductor layer SM.

In Step S9, a fluorocarbon gas is used as the etching gas. The fluorocarbon gas used in Step S9 preferably contains, in the gas molecule thereof, two or more carbon (C) atoms or one or more hydrogen (H) atoms in the gas molecule. This makes it possible to make the etch selectivity of the insulating film ZM1 and the element isolation portion ST on the semiconductor layer SM high so that the insulating film ZM1 and the element isolation portion ST can be etched at a high etch selectivity while suppressing etching of the semiconductor layer SM.

Examples of the fluorocarbon gas containing, in the gas molecule thereof, two or more carbon (C) atoms include a $C_2F_6$ gas, a $C_4F_8$ gas, and a $C_4F_6$ gas. Examples of the fluorocarbon gas containing, in the gas molecule thereof, one or more hydrogen (H) atoms include a $CHF_3$ gas and a $CH_2F_2$ gas. One or more of these gases can be used preferably for the dry etching in Step S9.

In Step S9, not a $CF_4$ gas but a fluorocarbon gas containing, in the gas molecule thereof, two or more carbon (C) atoms or containing one or more hydrogen (H) atoms in the gas molecule is preferred. Dry etching with such a gas is however likely to produce a deposit (reaction product) during dry etching. In the present embodiment, however, Step S9 is followed by the oxygen plasma treatment in Step S10. Even if Step S9 is performed using such a gas and the amount of a deposit formed during the dry etching increases, the deposit can be removed properly by the oxygen plasma treatment in Step S10. Therefore, a fluorocarbon gas containing, in the gas molecule thereof, two or more carbon (C) atoms or containing one or more hydrogen (H) atoms in the molecule can be used for the dry etching in Step S9 without causing any inconvenience.

The etching step of Step S9 is preferably anisotropic dry etching. The etching step of Step S11 is preferably isotropic dry etching. The following is the reason for them.

Described specifically, an object to be etched in Step S11 is the semiconductor layer SM and therefore, an etch residue of the semiconductor layer SM may remain on the side wall of the element isolation portion ST in the bulk region 1B when anisotropic dry etching is used. The semiconductor layer SM is however not an insulator so that it is desired to prevent such an etch residue of the semiconductor layer SM as much as possible. The trench TR (its cross-sectional shape) is likely to have a taper shape and therefore, the element isolation portion ST (its cross-sectional shape) is also likely to have a taper shape. When the element isolation portion ST has a taper shape, a portion of the semiconductor layer SM shielded by the tapered element isolation portion ST is likely to remain as an etch residue on the side wall of the element isolation portion ST even if the semiconductor layer SM is removed by anisotropic dry etching. The etching step of Step S11 is therefore achieved by isotropic dry etching by which remaining of an etch residue of the semiconductor layer SM on the side wall of the element isolation portion ST in the bulk region 1B can be more properly prevented.

When the etching step of Step S9 is performed by isotropic dry etching, the element isolation portion ST is inevitably side-etched below the side surface of the photoresist pattern PR1. The etching step of Step S9 is therefore performed preferably by anisotropic dry etching. It can prevent the inevitable side etching of the element isolation portion ST below the side surface of the photoresist pattern PR1. The manufacturing step of the present embodiment can easily be applied even when the planar size of the element isolation portion ST becomes small. This is advantageous for downsizing of a semiconductor device. For anisotropic dry etching of the insulating film ZM1 and the element isolation portion ST, dry etching with a fluorocarbon gas is preferred. By using a gas containing a fluorocarbon gas in Step S9, the insulating film ZM1 and the element isolation portion ST can be anisotropically dry-etched properly.

In Step S11, isotropic dry etching with a gas composed mainly of a fluorine radical (isotropic dry etching, for example, with an $SF_6$ gas) is performed. A deposit formed during the dry etching with a fluorocarbon gas in Step S9 cannot easily be removed by such isotropic dry etching. In the present embodiment, however, a deposit formed during the dry etching of Step S9 is removed by performing the oxygen plasma treatment of Step S10 after Step S9 and then, Step S11 follows. The isotropic dry etching of Step S11 can be carried out properly without being adversely affected by the deposit formed during the dry etching of Step S9.

(Second Embodiment)

Figure 47:
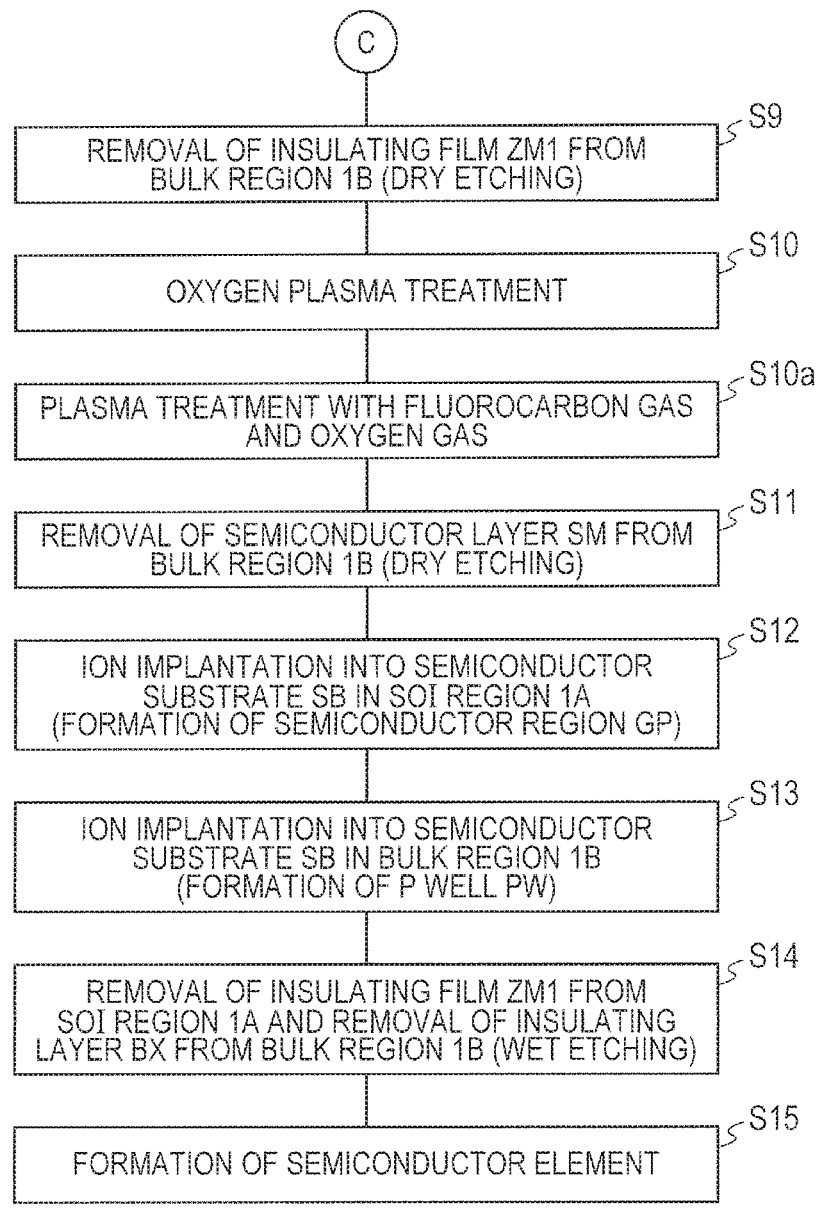
FIG. 47 is a process flow chart showing a step of manufacturing a semiconductor device of Second Embodiment.

FIG. 47 is a process flow chart showing steps of manufacturing a semiconductor device of Second Embodiment and corresponds to FIG. 2.

The manufacturing steps of Second Embodiment are different from those of First Embodiment in having Step S10a between Step S10 (oxygen plasma treatment) and Step S11 (dry etching of the semiconductor layer SM) (refer to FIG. 47).

Also in Second Embodiment, the structure shown in FIG. 11 is obtained by performing steps until Step S9 (dry etching of the insulating film ZM1) as in First Embodiment. After the oxygen plasma treatment of Step S10 is performed in Second Embodiment as in First Embodiment, the SOI substrate 1 is subjected to plasma treatment with a gas (mixed gas) containing a fluorocarbon gas and an oxygen gas (Step S10a of FIG. 47), which is a difference from First Embodiment. After the plasma treatment in Step S10a, the structure shown in FIG. 12 is obtained also in Second Embodiment by performing Step S11 (dry etching of the semiconductor layer SM) as in First Embodiment. Step S9, Step S10, Step S10a, and Step S11 are preferably performed continuously without exposing the SOI substrate 1 to the air. Steps thereafter in Second Embodiment are similar to those of First Embodiment so that an overlapping description is omitted here.

The plasma treatment of Step S10a, which is a difference between Second Embodiment and First Embodiment, will next be described.

The deposit formed during the dry etching of Step S9 can be removed by the oxygen plasma treatment of Step S10, but the surface of the semiconductor layer SM in the bulk region 1B may be slightly oxidized by the oxygen plasma treatment of Step S10. The etching step of Step S11 is performed under conditions where silicon oxide (the insulating layer BX and the element isolation portion ST) is more etch-resistant than the semiconductor layer SM (silicon layer). It is therefore more desired to perform the etching step (Step S11) of the semiconductor layer SM with the surface of the semiconductor layer SM in the bulk region 1B being exposed than to perform the etching step (Step S11) of the semiconductor layer SM with the surface of the semiconductor layer SM in the bulk region 1B being oxidized.

In Second Embodiment, therefore, Step S10a capable of removing an oxide film (silicon oxide film) on the surface of the semiconductor layer SM in the bulk region 1B is performed after Step S10 (oxygen plasma treatment) but before Step S11 (dry etching step of the semiconductor layer SM). When an oxide film is formed on the surface of the semiconductor layer SM in the bulk region 1B in Step S10, Step S10a is effective for removing this oxide film by etching. Step S10a can therefore be regarded as a dry etching step. In Step S10a, the surface layer portion of the element isolation portion ST exposed without being covered with the photoresist pattern PR1 is also etched.

A gas used in Step S10a contains a fluorocarbon gas so as to be able to remove an oxide film from the surface of the semiconductor layer SM in the bulk region 1B. In Step S9, it is important to enhance the etch selectivity of silicon oxide (the insulating film ZM1 and the element isolation portion ST), while in Step S10a, it is not necessary to enhance the etch selectivity of silicon oxide so much. This is because in Step S9, the etching amount is large as described above so that the semiconductor layer SM in the bulk region 1B may disappear without increasing the etch selectivity of silicon oxide, while in Step S10a, an etching amount required for removing only the oxide film from the surface of the semiconductor layer SM is small so that no problem occurs even if the etch selectivity of silicon oxide is not enhanced so much. In other words, since the etching thickness of silicon oxide is smaller in Step S10a than in Step S9, the etch selectivity of the element isolation portion ST on the semiconductor layer SM can be made smaller in Step S10a than in Step S9. Further, the etching rate of the element isolation portion ST can be made smaller in Step S10a than in Step S9.

Although Step S9 and Step S10a are both effective for etching of the element isolation portion ST, but the etching thickness of the element isolation portion ST (the element isolation portion ST not covered with the photoresist pattern PR1) in Step S10a becomes smaller than the etching thickness of the element isolation portion ST (the element isolation portion ST not covered with the photoresist pattern PR1) in Step S9. For example, the etching thickness of the element isolation portion ST in Step S10a is equal to or less than 30% of the etching thickness of the element isolation portion ST in Step S9 and is, for example, from about 2 to 6 nm. Step S10a is performed to remove the oxide film formed in Step S10 so that the dry etching in Step S10a may be either isotropic or anisotropic.

On the other hand, even after the deposit formed in Step S9 is removed in Step S10, if a deposit is formed in Step S10a and Step S11 is performed while having the deposit formed in Step S10a, an etch residue of the semiconductor layer SM due to the deposit formed in Step S10a may remain in Step S11. In Step S10a, it is therefore necessary to remove the oxide film from the surface of the semiconductor layer SM in the bulk region 1B while preventing the deposit (reaction product) from being formed during Step S10a.

Using a fluorocarbon gas is effective for the removal of the oxide film. For preventing formation of a deposit during dry etching with a fluorocarbon gas, use of an etching gas containing also an oxygen gas and containing the oxygen gas at an increased ratio is effective. In Step S10a, therefore, plasma treatment (dry etching) with a mixed gas containing a fluorocarbon gas and an oxygen gas is performed, by which the oxide film on the surface of the semiconductor layer SM in the bulk region 1B is removed while preventing formation of a deposit (reaction product).

The gas used in Step S9 contains a fluorocarbon gas and it may contain an oxygen gas further. An increase of ratio of the oxygen gas to the fluorocarbon gas in the gas may cause both a decrease in an etching rate and a decrease in etch selectivity. In Step S9, an increase in the etching thickness of the element isolation portion ST and the etch selectivity of the element isolation portion ST is required so that the gas used in Step S9 preferably contains no oxygen gas or even if any, contains it at a ratio reduced to some extent. Even though the gas used in Step S9 contains no oxygen gas or, if any, contains an oxygen gas at a small ratio and therefore the formation amount of the deposit increases in Step S9, no problem occurs because the deposit is removed in Step S10.

On the other hand, in Step 10a, the etching thickness of silicon oxide is small and therefore so much increase in the etching rate of silicon oxide is not required and so much increase in the etch selectivity of silicon oxide is not required. It is however necessary to suppress formation of a deposit during etching in Step S10a to prevent it from adversely affecting on Step S11. A ratio of an oxygen gas to a fluorocarbon gas in the gas to be used in Step S10a is preferably increased to some extent.

In Second Embodiment, a fluorocarbon-containing gas is used in Step S9 and a gas containing a fluorocarbon gas and an oxygen gas is used in Step S10a. In Step S9, a gas not containing an oxygen gas is used or if a gas containing an oxygen gas is used in Step S9, a ratio of the oxygen gas to the fluorocarbon gas to be used in Step S9 is adjusted to be smaller than a ratio of the oxygen gas to the fluorocarbon gas to be used in Step S10a. In other words, the gas to be used in Step S9 contains an oxygen gas such that a ratio of the oxygen gas to the fluorocarbon gas to be used in Step S9 becomes smaller than a ratio of the oxygen gas to the fluorocarbon gas to be used in Step S10a or contains no oxygen gas. The gas to be used in Step S9 may contain an oxygen gas or contain no oxygen gas and when the gas to be used in Step S9 contains an oxygen gas, a ratio of the oxygen gas to the fluorocarbon gas is larger in Step S10a than Step S9.

The gas to be used in Step S9 contains no oxygen gas or, if any, it contains an oxygen gas at a small oxygen gas ratio so that the insulating film ZM1 and the element isolation portion ST can be etched at high selectivity while suppressing etching of the semiconductor layer SM in the bulk region 1B. In Step S9, a deposit is formed easily during dry etching but the deposit can be removed in Step S10. In Step S10a, since the gas to be used in this step contains both a fluorocarbon gas and an oxygen gas and it contains the oxygen gas at a high ratio, an oxide film formed on the surface of the semiconductor layer SM in the bulk region 1B in Step S10 can be removed in Step S10a, while suppressing or preventing a deposit from being formed in Step S10a. Step S11 can therefore be performed while properly exposing the surface of the semiconductor layer SM in the bulk region 1B and therefore, the etching step in Step S11 can be performed more properly. This makes it possible to provide a semiconductor device having improved reliability, manufacture a semiconductor device in an improved yield, and manufacture a semiconductor device easily due to easy management of the manufacturing steps.

In Step S9, the fluorocarbon gas to be used preferably contains, in the gas molecule thereof, two or more carbon atoms or at least one hydrogen atom in the gas molecule to enhance the etching action on the insulating film ZM1 and the element isolation portion ST, thereby increasing the etch selectivity. In Step S10a, on the other hand, the fluorocarbon gas used in Step S10a is preferably a $CF_4$ gas because so much enhancement of the etching action on the oxide film on the surface of the semiconductor layer SM or to the element isolation portion ST is not required but formation of a deposit during etching is prevented. By using a $CF_4$ gas as the fluorocarbon gas in Step S10a, formation of a deposit during etching can be suppressed or prevented more properly and an adverse effect of the deposit formed during Step S10a on Step S11 can be prevented more properly.

The ratio of the oxygen gas to the fluorocarbon gas in the gas (mixed gas) containing a fluorocarbon gas and an oxygen gas is defined as a ratio of an oxygen gas flow rate to a fluorocarbon gas flow rate at the time when they are introduced into a plasma apparatus. For example, in the case where the flow rate of a fluorocarbon gas is $X_1$ sccm and the flow rate of an oxygen gas is $X_2$ sccm at the time when they are introduced into the plasma apparatus, the ratio of the oxygen gas to the fluorocarbon gas is represented by $X_2/X_1$. In the case where the flow rate of a fluorocarbon gas is $X_1$ sccm and the flow rate of an oxygen gas is $X_4$ sccm at the time when they are introduced into a plasma apparatus (dry etching apparatus) in Step S9 and the flow rate of a fluorocarbon gas is $X_5$ sccm and the flow rate of an oxygen gas is $X_6$ sccm at the time when they are introduced into a plasma apparatus (dry etching apparatus) in Step S10a, the following equation is established: $(X_4/X_3)<(X_6/X_5)$. However, the following equations: $X_3>0$, $X_4 \geq 0$, $X_5>0$, and $X_6>0$ are also established. This will also be applied similarly to Steps S9 and S10b in Third Embodiment which will be described later.

(Third Embodiment)

Figure 48:
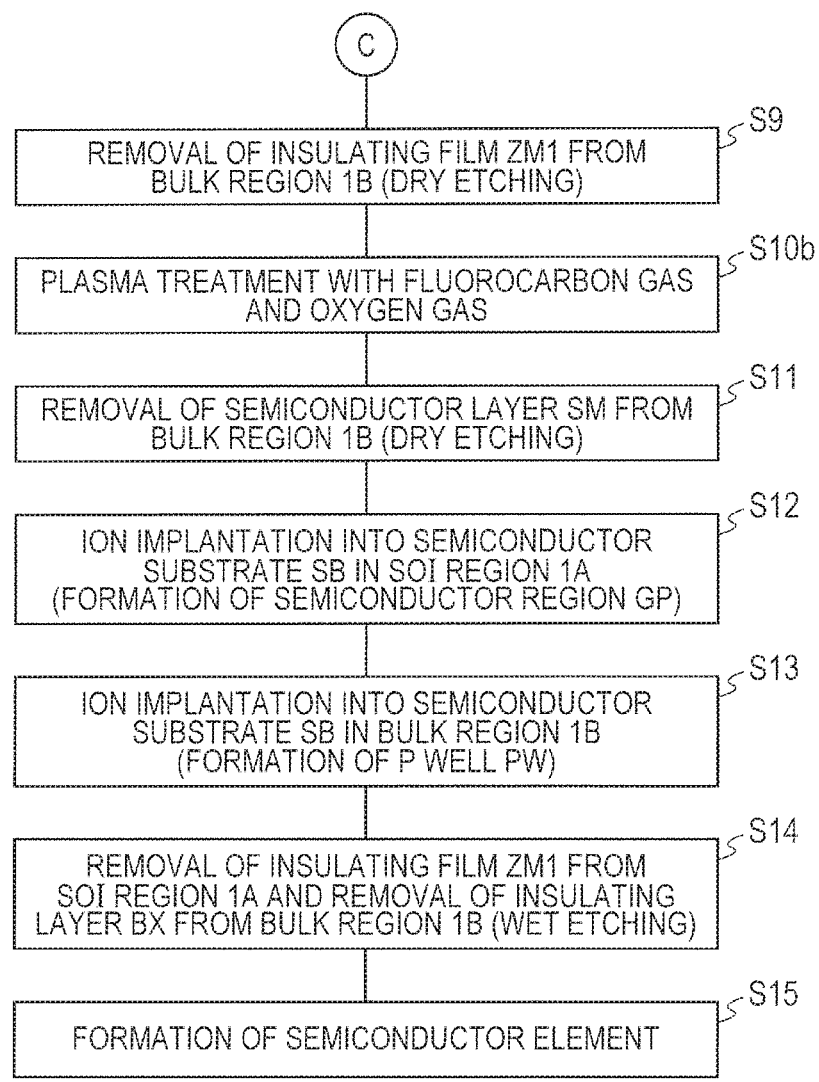
FIG. 48 is a process flow chart showing a step of manufacturing the semiconductor device of Third Embodiment.

FIG. 48 is a process flow chart showing steps of manufacturing a semiconductor device of Third Embodiment and corresponds to FIG. 2.

Difference of a manufacturing step of Third Embodiment from that of First Embodiment is that Step S10b is performed instead of Step S10 (oxygen plasma treatment (refer to FIG. 48).

Also in Third Embodiment, steps until Step S9 (dry etching of the insulating film ZM1) are performed as in First Embodiment to obtain the structure shown in FIG. 11. Different from First Embodiment, Step S10 is not performed in Third Embodiment and instead of it, the SOI substrate 1 is subjected to plasma treatment (dry etching) with a gas (mixed gas) containing a fluorocarbon gas and an oxygen gas (Step S10b shown in FIG. 48). In Step S10 in First or Second Embodiment, an oxygen gas is turned into plasma and a fluorocarbon gas is not used.

The structure shown in FIG. 12 is obtained by carrying out the plasma treatment in Step S10b and then, also in Third Embodiment, carrying out Step S11 (dry etching of the semiconductor layer SM) as in First Embodiment. Step S9, Step S10b, and Step S11 are preferably performed continuously without exposing the SOI substrate 1 to the air. Steps thereafter in Third Embodiment are similar to those in First Embodiment so that an overlapping description is omitted here.

The plasma treatment of Step S10b which is a difference between Third Embodiment and First Embodiment will hereinafter be described.

Step S10b is performed to remove a deposit (reaction product) formed during the dry etching of Step S9. The gas to be used in Step S10b therefore contains an oxygen gas. Since the plasma atmosphere in Step S10b has oxygen plasma, a deposit formed during the dry etching of Step S9 can be removed by the action of oxygen plasma in Step S10b.

In Third Embodiment, to prevent formation of an oxide film (silicon oxide film) on the surface of the semiconductor layer SM in the bulk region 1B in Step S10b, the gas to be used in Step S10b may also contain a fluorocarbon gas. The gas used in Step S10b also contains a fluorocarbon gas and is therefore effective for etching of an oxide film in the plasma treatment in Step S10b so that formation of an oxide film on the surface of the semiconductor layer SM in the bulk region 1B can be prevented.

The gas to be used in Step S10b therefore contains a fluorocarbon gas and an oxygen gas. The ratio of the oxygen gas to the fluorocarbon gas to be used in Step S10b is however made high so as to make it difficult to form a deposit (reaction product) in Step S10b and at the same time, facilitate removal of the deposit (reaction product) formed during the dry etching of Step S9 in Step S10b.

On the other hand, the gas used in Step S9 contains a fluorocarbon gas and may further contain an oxygen gas, but even if it contains an oxygen gas, a ratio of the oxygen gas to the fluorocarbon gas is preferably not made high. The reason of it is similar to that described in Second Embodiment. Briefly speaking, the etching thickness of the element isolation portion ST is larger in Step S9 than in Step S10b so that the etch selectivity of the element isolation portion ST on the semiconductor layer SM should be made high.

In Third Embodiment, Step S9 uses a fluorocarbon-containing gas and Step S10b uses a gas containing a fluorocarbon gas and an oxygen gas. As the gas to be used in Step S9, a gas not containing an oxygen gas is used. If a gas containing an oxygen gas is used in Step S9, a ratio of the oxygen gas to the fluorocarbon gas to be used in Step S9 is made smaller than a ratio of the oxygen gas to the fluorocarbon gas to be used in Step S10b. In other words, the gas to be used in Step S9 contains an oxygen gas such that a ratio of the oxygen gas to the fluorocarbon gas to be used in Step S9 becomes smaller than a ratio of the oxygen gas to the fluorocarbon gas to be used in Step S10b or does not contain an oxygen gas. The gas to be used in Step S9 may contain no oxygen gas or may contain an oxygen gas and when the gas to be used in Step S9 contains an oxygen gas, a ratio of the oxygen gas to the fluorocarbon gas is larger in Steps 10b than in Step S9.

Since the gas to be used in Step S9 contains no oxygen gas or even if it contains an oxygen gas, a ratio of the oxygen gas is small, the insulating film ZM1 and the element isolation portion ST can be etched at a high selectivity ratio while suppressing etching of the semiconductor layer SM in the bulk region 1B. Although a deposit is likely to be formed during the dry etching of Step S9, the deposit can be removed in Step S10b. The gas to be used in Step S10b contains a fluorocarbon gas and an oxygen gas and a ratio of the oxygen gas is large so that the deposit formed in Step S9 can be removed while suppressing or preventing formation of a deposit in Step S10b. The gas to be used in Step S10b also contains a fluorocarbon gas so that formation of an oxide film on the surface of the semiconductor layer SM in the bulk region 1B can be prevented. Step S11 can be carried out without having the deposit formed in Step S9 as a result of removal and while exposing the surface of the semiconductor layer SM in the bulk region 1B more properly. The etching step in Step S11 can therefore be performed more properly. This makes it possible to provide a semiconductor device having improved reliability, manufacture a semiconductor device in an improved yield, and manufacture a semiconductor device easily due to easy management of the manufacturing steps.

Step S9 and Step S10b both have etching action on the element isolation portion ST, but the etching thickness of the element isolation portion ST (the element isolation portion ST not covered with the photoresist pattern PR1) in Step S10b becomes smaller than the etching thickness of the element isolation portion ST (the element isolation portion ST not covered with the photoresist pattern PR1) in Step S9. For example, the etching thickness of the element isolation portion ST in Step S10b is equal to or less than 30% of the etching thickness of the element isolation portion ST in Step S9 and is, for example, from about 2 to 6 nm. Step S10b can also be regarded as a dry etching step. Step 10b is performed to remove the deposit formed in Step S9 so that the dry etching (plasma treatment) of Step S10b is preferably isotropic.

The etching thickness of the element isolation portion ST is smaller in Step S10b than in Step S9 so that the etch selectivity of the element isolation portion ST on the semiconductor layer SM can be made smaller in Step S10b than in Step S9. In addition, the etching rate of the element isolation portion ST can be made smaller in Step S10b than in Step S9.

The fluorocarbon gas to be used in the step S9 preferably contains, in the gas molecule thereof, two or more carbon atoms or contains one or more hydrogen atoms in the gas molecule in order to enhance the etching action on the insulating film ZM1 and the element isolation portion ST, thereby increasing the etch electivity of them. On the other hand, in Step S10b, the fluorocarbon gas to be used in Step S10b is preferably a $CF_4$ gas because so much enhancement of the etching action on the element isolation portion ST is not required but formation of a deposit during etching must be prevented. Using a $CF_4$ gas as the fluorocarbon gas in Step S10b makes it possible to more properly suppress or prevent formation of a deposit during etching and to more properly prevent the deposit formed in Step S10b from adversely affecting Step S11.

Step S10 and Step S10a are performed in Second Embodiment, but they are performed as one step (plasma treatment) in Step S10b in Third Embodiment. Third Embodiment has therefore such an advantage that the number of steps of manufacturing a semiconductor device can be reduced. In Second Embodiment, on the other hand, Step S10 for removing a deposit formed in Step S9 and Step S10a for removing an unnecessary oxide film formed in Step S10 on the surface of the semiconductor layer SM in the bulk region 1B can be carried out under respective optimum conditions suited therefor. Second Embodiment has advantages that Step S10 and Step S10a can be controlled easily and removal of the deposit formed during etching and removal of the unnecessary oxide film can be performed more properly.

The invention made by the present inventors has been described specifically based on some embodiments. It is needless to say that the invention is not limited to these embodiments but can be modified in various ways without departing from the gist of the invention.

Some of the details described in the above embodiments will next be described.

APPENDIX 1

A method of manufacturing a semiconductor device, includes the steps of:

(a) providing a substrate including a semiconductor substrate, an insulating layer on the semiconductor substrate, a semiconductor layer on the insulating layer, a first insulating film on the semiconductor layer, a trench penetrating the first insulating film, the semiconductor layer, and the insulating layer and reaching the semiconductor substrate, and an element isolation portion buried in the trench, in which the insulating layer, the first insulating film, and the element isolation portion are made of the same material as one another;

(b) after the step (a), forming a first mask layer so as to cover the first insulating film in a first region of the substrate and so as to expose the first insulating film in a second region of the substrate, which is different from the first region, in which the element isolation portion is located at a boundary between the first region and the second region, and in which a side surface of the first mask layer is located on the element isolation portion;

(c) after the step (b), removing the first insulating film in the second region by a first dry etching with the first mask layer as an etching mask, thereby exposing the semiconductor layer in the second region;

(d) after the step (c), subjecting the substrate to plasma treatment;

(e) after the step (d), removing the semiconductor layer in the second region by a second dry etching with the first mask layer as an etching mask, thereby exposing the insulating layer in the second region;

(f) after the step (e), removing the first mask layer;

(g) after the step (f), removing the first insulating film in the first region and the insulating layer in the second region by etching, thereby exposing the semiconductor layer in the first region and the semiconductor substrate in the second region; and (h) after the step (g), forming a first transistor on the semiconductor layer in the first region and forming a second transistor on the semiconductor substrate in the second region;

in which the first dry etching in the step (c) uses a first gas containing a fluorocarbon gas, in which the plasma treatment in the step (d) uses a second gas containing a fluorocarbon gas and oxygen gas, in which in the step (c), an etching thickness, by the first dry etching, of the element isolation portion not covered with the first mask layer is equal to or more than a sum of a first thickness of the first insulating film just before starting the first dry etching and a second thickness of the semiconductor layer just before starting the first dry etching, and in which the first gas contains an oxygen gas so as to make a ratio of the oxygen gas to the fluorocarbon gas in the first gas smaller than a ratio of the oxygen gas to the fluorocarbon gas in the second gas or the first gas contains no oxygen gas.

APPENDIX 2

In the method of manufacturing a semiconductor device according to Appendix 1, a fluorocarbon gas contained in the first gas contains two or more carbon atoms in the gas molecule or contains one or more hydrogen atoms in the gas molecule, and a fluorocarbon gas contained in the second gas is a $CF_4$ gas.

APPENDIX 3

In the method of manufacturing a semiconductor device according to Appendix 1, in the step (c), the first insulating film in the second region is removed by the first dry etching to expose the semiconductor layer in the second region under conditions where the semiconductor layer is more etch-resistant than the first insulating film and the element isolation portion, in the step (e), the semiconductor layer in the second region is removed by the second dry etching to expose the insulating layer in the second region under conditions where the insulating layer and the element isolation portion are more etch-resistant than the semiconductor layer, the first dry etching is anisotropic dry etching, and the second dry etching is isotropic dry etching.

APPENDIX 4

In the method of manufacturing a semiconductor device according to Appendix 1, the first insulating film, the insulating layer, and the element isolation portion are each made of silicon oxide, and the semiconductor layer is made of silicon.

APPENDIX 5

In the method of manufacturing a semiconductor device according to Appendix 1, the first dry etching is performed such that in cross-sectional view, the upper surface of the element isolation portion not covered with the first mask layer does not become lower than the upper surface of the insulating layer in the second region.

What is claimed is:

1. A method of manufacturing a semiconductor device, comprising the steps of:
    (a) providing a substrate including a semiconductor substrate, an insulating layer on the semiconductor substrate, a semiconductor layer on the insulating layer, a first insulating film on the semiconductor layer, a trench that is penetrating the first insulating film, the semiconductor layer, and the insulating layer and that is reaching the semiconductor substrate, and an element isolation portion buried in the trench,
    wherein the insulating layer, the first insulating film, and the element isolation portion are made of the same material as one another;
    (b) after the step (a), forming a first mask layer so as to cover the first insulating film in a first region of the substrate, and so as to expose the first insulating film in a second region of the substrate, which is different from the first region,
    wherein the element isolation portion is located at a boundary between the first region and the second region, and
    wherein a side surface of the first mask layer is located on the element isolation portion;
    (c) after the step (b), removing the first insulating film in the second region by a first dry etching with the first mask layer as an etching mask, thereby exposing the semiconductor layer in the second region, wherein an etching thickness, by the first dry etching, of the element isolation portion not covered with the first mask layer is equal to or more than a sum of a first thickness of the first insulating film just before starting the first dry etching and a second thickness of the semiconductor layer just before starting the first dry etching;

(d) after the step (c), removing the semiconductor layer in the second region by a second dry etching with the first mask layer as an etching mask, thereby exposing the insulating layer in the second region;

(e) after the step (d), removing the first mask layer;

(f) after the step (e), removing the first insulating film in the first region and the insulating layer in the second region by etching, thereby exposing the semiconductor layer in the first region and the semiconductor substrate in the second region; and (g) after the step (f), forming a first transistor on the semiconductor layer in the first region, and forming a second transistor on the semiconductor substrate in the second region.

2. The method of manufacturing a semiconductor device according to claim 1, wherein in the step (c), the first insulating film in the second region is removed by the first dry etching to expose the semiconductor layer in the second region under conditions where the semiconductor layer is more etch-resistant than the first insulating film and the element isolation portion, and wherein in the step (d), the semiconductor layer in the second region is removed by the second dry etching to expose the insulating layer in the second region under conditions where the insulating layer and the element isolation portion are more etch-resistant than the semiconductor layer.

3. The method of manufacturing a semiconductor device according to claim 2, wherein the first dry etching is anisotropic dry etching, and wherein the second dry etching is isotropic dry etching.

4. The method of manufacturing a semiconductor device according to claim 1, wherein the fluorocarbon gas contained in the first gas contains two or more carbon atoms in a gas molecule or one or more hydrogen atoms in a gas molecule.

5. The method of manufacturing a semiconductor device according to claim 1, wherein the first insulating film, the insulating layer, and the element isolation portion each have silicon oxide.

6. The method of manufacturing a semiconductor device according to claim 5, wherein the semiconductor layer has silicon.

7. The method of manufacturing a semiconductor device according to claim 1, further comprising the step of:

(e1) after the step (e) but before the step (f), forming a first semiconductor region by ion implantation of an impurity into the semiconductor substrate in the first region and forming a second semiconductor region by ion implantation of an impurity into the semiconductor substrate in the second region.

8. The method of manufacturing a semiconductor device according to claim 1, wherein in the step (f), the first insulating film in the first region and the insulating layer in the second region are removed by wet etching to expose the semiconductor layer in the first region and the semiconductor substrate in the second region.

9. The method of manufacturing a semiconductor device according to claim 1, wherein the step (a) comprises the steps of:

(a1) providing the substrate including the semiconductor substrate, the insulating layer on the semiconductor substrate, the semiconductor layer on the insulating layer, the first insulating film on the semiconductor layer, and a second insulating film on the first insulating film;

(a2) after the step (a1), forming the trench penetrating the second insulating film, the first insulating film, the semiconductor layer, and the insulating layer and reaching the semiconductor substrate;

(a3) after the step (a2), forming a third insulating film on the second insulating film to fill the trench;

(a4) after the step (a3), removing the third insulating film from the outside of the trench and forming, in the trench, the element isolation portion having the third insulating film; and (a5) after the step (a4), removing the second insulating film by etching, wherein the second insulating film has a material different from that of the first insulating film.

10. The method of manufacturing a semiconductor device according to claim 9, wherein the insulating layer, the first insulating film, and the third insulating film each have silicon oxide, wherein the second insulating film has silicon nitride; and wherein in the step (a4), the third insulating film is polished to remove the third insulating film from the outside of the trench to form, in the trench, the element isolation portion having the third insulating film.

11. The method of manufacturing a semiconductor device according to claim 1, wherein the step (g) comprises the steps of:

(g1) forming a fourth insulating film on each of the semiconductor layer in the first region and the semiconductor substrate in the second region;

(g2) after the step (g1), removing the fourth insulating film on the semiconductor layer in the first region and leaving the fourth insulating film on the semiconductor substrate in the second region; and (g3) after the step (g2), forming a fifth insulating film on the semiconductor layer in the first region, wherein the fifth insulating film on the semiconductor layer in the first region is an insulating film for a gate insulating film of the first transistor, and wherein the fourth insulating film on the semiconductor substrate in the second region is an insulating film for a gate insulating film of the second transistor.

12. The method of manufacturing a semiconductor device according to claim 1, wherein the first dry etching in the step (c) contains a fluorocarbon gas, and wherein, after the step (c) and before the step (d), the substrate is subjected to oxygen plasma treatment.

13. The method of manufacturing a semiconductor device according to claim 12, further comprising the step of:

after performing the oxygen plasma treatment and before the step (d), subjecting the substrate to plasma treatment with a second gas containing a fluorocarbon gas and an oxygen gas, wherein the first gas to be used in the step (c) contains an oxygen gas such that a ratio of the oxygen gas to the fluorocarbon gas in the first gas becomes smaller than a ratio of the oxygen gas to the fluorocarbon gas in the second gas or contains no oxygen gas.

14. The method of manufacturing a semiconductor device according to claim 13,
wherein the fluorocarbon gas contained in the first gas contains two or more carbon atoms in a gas molecule or one or more hydrogen atoms in a gas molecule, and
wherein the fluorocarbon gas contained in the second gas is a CF4 gas.

15. The method of manufacturing a semiconductor device according to claim 13,
wherein an etching thickness of the element isolation portion not covered with the first mask layer in the oxygen plasma treatment is smaller than an etching thickness of the element isolation portion not covered with the first mask layer in the step (c).

16. The method of manufacturing a semiconductor device according to claim 1,
wherein a third gas containing an SF6 gas, an NF3 gas, or a ClF3 gas is used for the second dry etching in the step (d).

17. The method of manufacturing a semiconductor device according to claim 1,
wherein the step (c) and the step (e) are performed continuously without exposing the substrate to the air.

18. The method of manufacturing a semiconductor device according to claim 1,
wherein the first dry etching is performed such that in a cross-sectional view, an upper surface of the element isolation portion not covered with the first mask layer does not become lower than an upper surface of the insulating layer in the second region.

19. The method of manufacturing a semiconductor device according to claim 1,
wherein the step (g) comprises the steps of:
(g1) forming a conductive film over the semiconductor substrate such that the semiconductor layer in the first region, the element isolation portion and the semiconductor substrate in the second region are covered with the conductive film; and
(g2) after the step (g1), patterning the conductive film, thereby forming a first gate electrode, which is comprised of the conductive film, of the first transistor on the semiconductor layer in the first region and forming a second gate electrode, comprised of the conductive film, of the second transistor on the semiconductor substrate in the second region.

* * * * *